(12) United States Patent
Taylor et al.

(10) Patent No.: US 10,254,103 B2
(45) Date of Patent: Apr. 9, 2019

(54) ARRANGEMENTS FOR MAGNETIC FIELD SENSORS THAT ACT AS TOOTH DETECTORS

(71) Applicant: Allegro MicroSystems, LLC, Manchester, NH (US)

(72) Inventors: William P. Taylor, Amherst, NH (US); P. Karl Scheller, Manchester, NH (US); Paul A. David, Bow, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 15/655,135

(22) Filed: Jul. 20, 2017

(65) Prior Publication Data

US 2017/0314907 A1 Nov. 2, 2017

Related U.S. Application Data

(63) Continuation of application No. 13/946,380, filed on Jul. 19, 2013, now Pat. No. 9,810,519.

(51) Int. Cl.
*G01B 7/14* (2006.01)
*G01R 33/07* (2006.01)
(Continued)

(52) U.S. Cl.
CPC ............. *G01B 7/146* (2013.01); *G01D 5/147* (2013.01); *G01R 33/06* (2013.01); *G01R 33/07* (2013.01); *G01R 33/09* (2013.01)

(58) Field of Classification Search
CPC ........ G01B 7/146; G01R 33/06; G01R 33/07; G01R 33/09; G01R 33/075; G01D 5/147
(Continued)

(56) References Cited

U.S. PATENT DOCUMENTS 3,195,043 A   7/1965   Burig et al.
3,281,628 A   10/1966   Bauer et al.
(Continued)

FOREIGN PATENT DOCUMENTS

CH   683 469 A5   3/1994
DE   25 18 054    11/1976
(Continued)

OTHER PUBLICATIONS

Office Action dated Dec. 18, 2017 for U.S. Appl. No. 15/176,655; 29 pages.
(Continued)

*Primary Examiner* — Lee E Rodak
(74) *Attorney, Agent, or Firm* — Daly, Crowley, Mofford & Durkee, LLP

(57) ABSTRACT

A magnetic field sensor for sensing motion of a ferromagnetic object comprises a substrate. The substrate includes first and second major surfaces, each having a width dimension and a length dimension. The magnetic field sensor further comprises a magnet. The magnet includes a first major surface proximate to the substrate, the first major surface of the magnet heaving a width and a length, and a second major surface. The magnetic field sensor further includes first and second magnetic field sensing dements. The first magnetic field sensing element and the second magnetic field sensing element are positioned beyond respective ends of the width of the magnet. The second magnetic field sensing element is substantially farther from the ferromagnetic object than the first magnetic field sensing element. A line passing through the first and second magnetic field sensing elements is perpendicular to the magnet axis.

34 Claims, 14 Drawing Sheets

(51) Int. Cl.
*G01R 33/06* (2006.01)
*G01R 33/09* (2006.01)
*G01R 5/14* (2006.01)
*G01D 5/14* (2006.01)

(58) Field of Classification Search
USPC .................. 324/207.11–207.26, 244–262
See application file for complete search history.

(56) References Cited

U.S. PATENT DOCUMENTS

| | | |
|---|---|---|
| 3,607,528 A | 9/1971 | Gassaway |
| 3,661,061 A | 5/1972 | Tokarz |
| 3,728,786 A | 4/1973 | Lucas et al. |
| 4,048,670 A | 9/1977 | Eysermans |
| 4,079,360 A * | 3/1978 | Ookubo .................. G01D 5/145 |
| | | 235/449 |
| 4,188,605 A | 2/1980 | Stout |
| 4,204,317 A | 5/1980 | Winn |
| 4,236,832 A | 12/1980 | Komatsu et al. |
| 4,283,643 A | 8/1981 | Levin |
| 4,315,523 A | 2/1982 | Mahawili et al. |
| 4,438,347 A | 3/1984 | Gehring |
| 4,490,674 A | 12/1984 | Ito |
| 4,573,258 A | 3/1986 | Io et al. |
| 4,614,111 A | 9/1986 | Wolff |
| 4,649,796 A | 3/1987 | Schmidt |
| 4,670,715 A | 6/1987 | Fuzzell |
| 4,719,419 A | 1/1988 | Dawley |
| 4,733,455 A | 3/1988 | Nakamura et al. |
| 4,745,363 A | 5/1988 | Carr et al. |
| 4,746,859 A | 5/1988 | Malik |
| 4,752,733 A | 6/1988 | Petr et al. |
| 4,758,943 A | 7/1988 | Aström et al. |
| 4,760,285 A | 7/1988 | Nelson |
| 4,769,344 A | 9/1988 | Sakai et al. |
| 4,772,929 A | 9/1988 | Manchester |
| 4,789,826 A | 12/1988 | Willett |
| 4,796,354 A | 1/1989 | Yokoyama et al. |
| 4,823,075 A | 4/1989 | Alley |
| 4,833,406 A | 5/1989 | Foster |
| 4,893,027 A | 1/1990 | Kammerer et al. |
| 4,908,685 A | 3/1990 | Shibasaki et al. |
| 4,910,861 A | 3/1990 | Dohogne |
| 4,935,698 A | 6/1990 | Kawaji et al. |
| 4,970,411 A | 11/1990 | Halg et al. |
| 4,983,916 A | 1/1991 | Iijima et al. |
| 5,012,322 A | 4/1991 | Guillotte |
| 5,021,493 A | 6/1991 | Sandstrom |
| 5,028,868 A | 7/1991 | Murata et al. |
| 5,045,920 A | 9/1991 | Vig et al. |
| 5,078,944 A | 1/1992 | Yoshino |
| 5,084,289 A | 1/1992 | Shin et al. |
| 5,121,289 A | 6/1992 | Gagliardi |
| 5,137,677 A | 8/1992 | Murata |
| 5,139,973 A | 8/1992 | Nagy et al. |
| 5,167,896 A | 12/1992 | Hirota et al. |
| 5,168,244 A | 12/1992 | Muranaka |
| 5,185,919 A | 2/1993 | Hickey |
| 5,196,794 A | 3/1993 | Murata |
| 5,210,493 A | 5/1993 | Schroeder et al. |
| 5,216,405 A | 6/1993 | Schroeder et al. |
| 5,220,207 A | 6/1993 | Kovalcik et al. |
| 5,244,834 A | 9/1993 | Suzuki et al. |
| 5,247,202 A | 9/1993 | Popovic et al. |
| 5,247,278 A | 9/1993 | Pant et al. |
| 5,250,925 A | 10/1993 | Shinkle |
| 5,289,344 A | 2/1994 | Gagnon et al. |
| 5,286,426 A | 3/1994 | Rano, Jr. et al. |
| 5,315,245 A | 5/1994 | Schroeder et al. |
| 5,329,416 A | 7/1994 | Ushiyama et al. |
| 5,331,478 A | 7/1994 | Aranovsky |
| 5,332,956 A | 7/1994 | Oh |
| 5,332,965 A | 7/1994 | Wolf et al. |
| 5,359,287 A | 10/1994 | Watanabe et al. |
| 5,412,255 A | 5/1995 | Wallrafen |
| 5,414,355 A | 5/1995 | Davidson et al. |
| 5,424,558 A | 6/1995 | Borden et al. |
| 5,434,105 A | 7/1995 | Liou |
| 5,453,727 A | 9/1995 | Shibasaki et al. |
| 5,469,058 A | 11/1995 | Dunnam |
| 5,477,143 A * | 12/1995 | Wu .......................... G01V 3/08 |
| | | 324/207.21 |
| 5,479,695 A | 1/1996 | Grader et al. |
| 5,486,759 A | 1/1996 | Seiler et al. |
| 5,488,294 A | 1/1996 | Liddell et al. |
| 5,491,633 A | 2/1996 | Henry et al. |
| 5,497,081 A | 3/1996 | Wolf et al. |
| 5,500,589 A | 3/1996 | Sumcad |
| 5,500,994 A | 3/1996 | Itaya |
| 5,508,611 A | 4/1996 | Schroeder et al. |
| 5,521,501 A | 5/1996 | Dettmann et al. |
| 5,545,983 A * | 8/1996 | Okeya ...................... G01B 3/04 |
| | | 324/207.12 |
| 5,551,146 A | 9/1996 | Kawabata et al. |
| 5,552,706 A | 9/1996 | Carr |
| 5,572,058 A | 11/1996 | Biard |
| 5,581,170 A | 12/1996 | Mammano et al. |
| 5,581,179 A | 12/1996 | Engel et al. |
| 5,621,319 A | 4/1997 | Bilotti et al. |
| 5,627,315 A | 5/1997 | Figi et al. |
| 5,631,557 A | 5/1997 | Davidson |
| 5,640,090 A | 6/1997 | Furuya et al. |
| 5,691,637 A | 11/1997 | Oswald et al. |
| 5,696,790 A | 12/1997 | Graham et al. |
| 5,712,562 A | 1/1998 | Berg |
| 5,714,102 A | 2/1998 | Highum et al. |
| 5,719,496 A | 2/1998 | Wolf |
| 5,729,128 A | 3/1998 | Bunyer et al. |
| 5,757,181 A | 5/1998 | Wolf et al. |
| 5,781,005 A | 7/1998 | Vig et al. |
| 5,789,658 A | 8/1998 | Henn et al. |
| 5,789,915 A | 8/1998 | Ingraham |
| 5,796,249 A | 8/1998 | Andräet et al. |
| 5,818,222 A | 10/1998 | Ramsden |
| 5,818,223 A | 10/1998 | Wolf |
| 5,839,185 A | 11/1998 | Smith et al. |
| 5,841,276 A | 11/1998 | Makino et al. |
| 5,859,387 A | 1/1999 | Gagnon |
| 5,886,070 A | 2/1999 | Honkura et al. |
| 5,883,567 A | 3/1999 | Mullins, Jr. |
| 5,912,556 A | 6/1999 | Frazee et al. |
| 5,963,028 A | 10/1999 | Engel et al. |
| 6,011,770 A | 1/2000 | Tan |
| 6,016,055 A | 1/2000 | Jager et al. |
| 6,043,646 A | 3/2000 | Jansseune |
| 6,100,754 A | 8/2000 | Kim et al. |
| 6,136,250 A | 10/2000 | Brown |
| 6,175,233 B1 | 1/2001 | McCurley et al. |
| 6,180,041 B1 | 1/2001 | Takizawa |
| 6,181,036 B1 | 1/2001 | Kazama et al. |
| 6,184,679 B1 | 2/2001 | Popovic et al. |
| 6,198,373 B1 | 3/2001 | Ogawa et al. |
| 6,242,604 B1 | 6/2001 | Hudlicky et al. |
| 6,242,904 B1 | 6/2001 | Shirai et al. |
| 6,242,905 B1 | 6/2001 | Draxelmayr |
| 6,265,865 B1 | 7/2001 | Engel et al. |
| 6,278,269 B1 | 8/2001 | Vig et al. |
| 6,291,989 B1 | 9/2001 | Schroeder |
| 6,297,627 B1 | 10/2001 | Towne et al. |
| 6,297,628 B1 | 10/2001 | Bicking et al. |
| 6,323,642 B1 * | 11/2001 | Nishimura ............. G01D 5/147 |
| | | 257/E21.514 |
| 6,339,322 B1 | 1/2002 | Loreck et al. |
| 6,351,506 B1 | 2/2002 | Lewicki |
| 6,356,068 B1 | 3/2002 | Steiner et al. |
| 6,392,478 B1 | 5/2002 | Mulder et al. |
| 6,436,748 B1 | 8/2002 | Forbes et al. |
| 6,437,558 B2 | 8/2002 | Li et al. |
| 6,452,381 B1 | 9/2002 | Nakatani et al. |
| 6,492,804 B2 | 12/2002 | Tsuge et al. |
| 6,501,270 B1 | 12/2002 | Opie |
| 6,525,531 B2 | 2/2003 | Forrest et al. |
| 6,528,992 B2 | 3/2003 | Shinjo et al. |

(56) References Cited

U.S. PATENT DOCUMENTS

| | | |
|---|---|---|
| 6,542,847 B1 | 4/2003 | Lohberg et al. |
| 6,545,332 B2 | 4/2003 | Huang |
| 6,545,457 B2 | 4/2003 | Goto et al. |
| 6,545,462 B2 | 4/2003 | Schott et al. |
| 6,590,804 B1 | 7/2003 | Perner |
| 6,653,968 B1 | 11/2003 | Schneider |
| 6,674,679 B1 | 1/2004 | Perner et al. |
| 6,687,644 B1 | 2/2004 | Zinke et al. |
| 6,692,676 B1 | 2/2004 | Vig et al. |
| 6,768,301 B1 | 7/2004 | Hohe et al. |
| 6,770,163 B1 | 8/2004 | Kuah et al. |
| 6,781,233 B2 | 8/2004 | Zverev et al. |
| 6,781,359 B2 | 8/2004 | Stauth et al. |
| 6,798,193 B2 | 9/2004 | Zimmerman et al. |
| 6,815,944 B2 | 11/2004 | Vig et al. |
| 6,822,443 B1 | 11/2004 | Dogaru |
| 6,853,178 B2 | 2/2005 | Hayat-Dawoodi |
| 6,896,407 B2 | 5/2005 | Nomiyama et al. |
| 6,902,951 B2 | 6/2005 | Goller et al. |
| 6,917,321 B1 | 7/2005 | Haurie et al. |
| 7,023,205 B1 | 4/2006 | Krupp |
| 7,026,808 B2 | 4/2006 | Vig et al. |
| 7,031,170 B2 | 4/2006 | Daeche et al. |
| 7,038,448 B2 | 5/2006 | Schott et al. |
| 7,112,955 B2 | 9/2006 | Buchhold |
| 7,112,957 B2 | 9/2006 | Bicking |
| 7,184,876 B2 | 2/2007 | Tuelings et al. |
| 7,190,784 B2 | 3/2007 | Li |
| 7,193,412 B2 | 3/2007 | Freeman |
| 7,199,579 B2 | 4/2007 | Scheller et al. |
| 7,259,545 B2 | 8/2007 | Stauth et al. |
| 7,265,531 B2 | 9/2007 | Stauth et al. |
| 7,269,992 B2 | 9/2007 | Lamb et al. |
| 7,285,952 B1 | 10/2007 | Hatanaka et al. |
| 7,202,005 B2 | 11/2007 | Burt et al. |
| 7,295,000 B2 | 11/2007 | Werth |
| 7,319,319 B2 | 1/2008 | Jones et al. |
| 7,323,780 B2 | 1/2008 | Daubenspeck et al. |
| 7,323,870 B2 | 1/2008 | Tatschl et al. |
| 7,325,175 B2 | 1/2008 | Momtaz |
| 7,345,468 B2 | 3/2008 | Okada et al. |
| 7,355,388 B2 | 4/2008 | Ishio |
| 7,361,531 B2 | 4/2008 | Sharma et al. |
| 7,362,094 B2 | 4/2008 | Voisine et al. |
| 7,365,530 B2 | 4/2008 | Bailey et al. |
| 7,385,394 B2 | 6/2008 | Auburger et al. |
| 7,425,821 B2 | 9/2008 | Monreal et al. |
| 7,474,093 B2 | 1/2009 | Ausserlechner |
| 7,476,953 B2 | 1/2009 | Taylor et al. |
| 7,518,354 B2 | 4/2009 | Stauth et al. |
| 7,592,801 B2 | 9/2009 | Bailey et al. |
| 7,598,601 B2 | 10/2009 | Taylor et al. |
| 7,605,647 B1 | 10/2009 | Romero et al. |
| 7,635,993 B2 | 12/2009 | Boeve |
| 7,694,200 B2 | 4/2010 | Forrest et al. |
| 7,701,208 B2 | 4/2010 | Nishikawa |
| 7,729,675 B2 | 6/2010 | Krone |
| 7,746,056 B2 | 6/2010 | Stauth et al. |
| 7,746,065 B2 | 6/2010 | Pastre et al. |
| 7,764,118 B2 | 7/2010 | Kusuda et al. |
| 7,768,083 B2 | 8/2010 | Doogue et al. |
| 7,769,110 B2 | 8/2010 | Momtaz |
| 7,772,838 B2 | 8/2010 | Bailey et al. |
| 7,800,389 B2 | 9/2010 | Friedrich et al. |
| 7,808,074 B2 | 10/2010 | Knittl |
| 7,816,772 B2 | 10/2010 | Engel et al. |
| 7,816,905 B2 | 10/2010 | Doogue et al. |
| 7,839,141 B2 | 11/2010 | Werth et al. |
| 7,915,886 B2 | 3/2011 | Stolfus et al. |
| 7,923,996 B2 | 4/2011 | Doogue et al. |
| 7,936,144 B2 | 5/2011 | Vig et al. |
| 7,956,604 B2 | 6/2011 | Ausserlechner |
| 7,961,823 B2 | 6/2011 | Kolze et al. |
| 7,990,209 B2 | 8/2011 | Romero |
| 8,030,918 B2 | 10/2011 | Doogue et al. |
| 8,058,870 B2 | 11/2011 | Sterling |
| 8,063,634 B2 | 11/2011 | Sauber et al. |
| 8,080,993 B2 | 12/2011 | Theuss et al. |
| 8,089,276 B2 | 1/2012 | Kentsch |
| 8,106,654 B2 | 1/2012 | Theuss et al. |
| 8,128,549 B2 | 3/2012 | Testani et al. |
| 8,134,358 B2 | 3/2012 | Charlier et al. |
| 8,143,169 B2 | 3/2012 | Engel et al. |
| 8,253,210 B2 | 8/2012 | Theuss et al. |
| 8,362,579 B2 | 1/2013 | Theuss et al. |
| 8,610,430 B2 | 12/2013 | Werth et al. |
| 8,624,588 B2 | 1/2014 | Vig et al. |
| 8,773,124 B2 | 7/2014 | Ausserlechner |
| 8,860,404 B2 | 10/2014 | Dwyer et al. |
| 9,116,018 B2 | 8/2015 | Frachon |
| 9,164,156 B2 | 10/2015 | Elian et al. |
| 9,201,123 B2 | 12/2015 | Elian et al. |
| 2001/0002791 A1 | 6/2001 | Tsuge et al. |
| 2001/0009367 A1 | 7/2001 | Seitzer et al. |
| 2002/0027488 A1 | 3/2002 | Hayat-Dawoodi et al. |
| 2002/0084923 A1 | 7/2002 | Li |
| 2003/0001563 A1 | 1/2003 | Turner |
| 2003/0038675 A1 | 2/2003 | Gailus et al. |
| 2003/0062891 A1 | 4/2003 | Slates |
| 2003/0102909 A1 | 6/2003 | Motz |
| 2003/0173955 A1 | 9/2003 | Uenoyama |
| 2004/0032251 A1 | 2/2004 | Zimmerman et al. |
| 2004/0046248 A1 | 3/2004 | Waelti et al. |
| 2004/0062362 A1 | 4/2004 | Matsuya |
| 2004/0080314 A1 | 4/2004 | Tsujii et al. |
| 2004/0135220 A1 | 7/2004 | Goto |
| 2004/0155647 A1 | 8/2004 | Stauth et al. |
| 2004/0174164 A1* | 9/2004 | Ao ............... G01D 5/145 324/252 |
| 2004/0184196 A1 | 9/2004 | Jayasekara |
| 2004/0189285 A1 | 9/2004 | Uenoyama |
| 2004/0252563 A1 | 12/2004 | Hokuto et al. |
| 2005/0120782 A1 | 6/2005 | Kishibata et al. |
| 2005/0167790 A1 | 8/2005 | Khor et al. |
| 2005/0179429 A1 | 8/2005 | Lohberg |
| 2005/0225318 A1 | 10/2005 | Bailey et al. |
| 2005/0280411 A1 | 12/2005 | Bicking |
| 2006/0028204 A1 | 2/2006 | Oohira |
| 2006/0033487 A1 | 2/2006 | Nagano et al. |
| 2006/0038559 A1 | 2/2006 | Lamb et al. |
| 2006/0068237 A1 | 3/2006 | Murphy |
| 2006/0097715 A1 | 5/2006 | Oohira et al. |
| 2006/0125473 A1 | 6/2006 | Frachon et al. |
| 2006/0175674 A1 | 8/2006 | Taylor |
| 2006/0181263 A1 | 8/2006 | Doogue et al. |
| 2006/0202692 A1 | 9/2006 | Tatschl et al. |
| 2006/0238190 A1 | 10/2006 | Ishio |
| 2006/0261801 A1 | 11/2006 | Busch |
| 2007/0110199 A1 | 5/2007 | Momtaz et al. |
| 2007/0247141 A1 | 10/2007 | Pastre et al. |
| 2007/0285089 A1 | 12/2007 | Ibuki et al. |
| 2007/0290682 A1 | 12/2007 | Oohira et al. |
| 2008/0012558 A1* | 1/2008 | Rossler ............ B82Y 25/00 324/252 |
| 2008/0013298 A1 | 1/2008 | Sharma et al. |
| 2008/0094055 A1 | 4/2008 | Monreal et al. |
| 2008/0116884 A1 | 5/2008 | Rettig et al. |
| 2008/0137784 A1 | 6/2008 | Krone |
| 2008/0237818 A1 | 10/2008 | Engel et al. |
| 2008/0238410 A1 | 10/2008 | Charlier et al. |
| 2009/0001964 A1 | 1/2009 | Strzalkowski |
| 2009/0001965 A1 | 1/2009 | Ausserlechner et al. |
| 2009/0001972 A1 | 1/2009 | Fernandez et al. |
| 2009/0058404 A1 | 3/2009 | Kurumado |
| 2009/0085706 A1 | 4/2009 | Baarman et al. |
| 2009/0102467 A1 | 4/2009 | Snell et al. |
| 2009/0140725 A1 | 6/2009 | Ausserlechner |
| 2009/0146647 A1 | 6/2009 | Ausserlechner |
| 2009/0152696 A1 | 6/2009 | Dimasacat et al. |
| 2009/0206827 A1 | 8/2009 | Aimuta et al. |
| 2009/0212765 A1 | 8/2009 | Doogue et al. |
| 2009/0315543 A1 | 12/2009 | Guo et al. |
| 2010/0026279 A1 | 2/2010 | Vig et al. |
| 2010/0045268 A1 | 2/2010 | Kilian |

(56) References Cited

U.S. PATENT DOCUMENTS

| | | |
|---|---|---|
| 2010/0072988 A1 | 3/2010 | Hammerschmidt et al. |
| 2010/0141249 A1 | 6/2010 | Ararao et al. |
| 2010/0188078 A1 | 7/2010 | Foletto et al. |
| 2010/0201356 A1 | 8/2010 | Koller et al. |
| 2010/0211347 A1 | 8/2010 | Friedrich et al. |
| 2010/0237450 A1 | 9/2010 | Doogue et al. |
| 2010/0205140 A1 | 11/2010 | Theuss et al. |
| 2010/0276769 A1 | 11/2010 | Theuss et al. |
| 2010/0330708 A1 | 12/2010 | Engel et al. |
| 2011/0018533 A1 | 1/2011 | Cesaretti et al. |
| 2011/0031960 A1 | 2/2011 | Hohe et al. |
| 2011/0048102 A1 | 3/2011 | Fernandez et al. |
| 2011/0074405 A1 | 3/2011 | Doogue et al. |
| 2011/0127998 A1 | 6/2011 | Elian et al. |
| 2011/0175605 A1 | 7/2011 | Kim et al. |
| 2011/0267040 A1 | 11/2011 | Frachon |
| 2011/0291650 A1 | 12/2011 | Franke et al. |
| 2011/0298448 A1 | 12/2011 | Foletto et al. |
| 2012/0007589 A1 | 1/2012 | Okada |
| 2012/0013333 A1 | 1/2012 | Ararao et al. |
| 2012/0019236 A1 | 1/2012 | Tiernan et al. |
| 2012/0086090 A1 | 4/2012 | Sharma et al. |
| 2012/0200290 A1 | 8/2012 | Ausserlechner |
| 2012/0249133 A1 | 10/2012 | Friedrich |
| 2012/0274314 A1 | 11/2012 | Cesaretti et al. |
| 2013/0015845 A1 | 1/2013 | Fox |
| 2013/0057257 A1 | 3/2013 | Friedrich et al. |
| 2013/0113474 A1 | 5/2013 | Elian |
| 2013/0214774 A1 | 8/2013 | Cesaretti et al. |
| 2013/0265037 A1 | 10/2013 | Friedrich et al. |
| 2013/0278246 A1 | 10/2013 | Stegerer et al. |
| 2013/0320970 A1 | 12/2013 | Foletto et al. |
| 2013/0335069 A1 | 12/2013 | Vig et al. |
| 2014/0084906 A1* | 3/2014 | Ruigrok ............... G01D 5/147 |
| | | 324/207.21 |
| 2014/0175584 A1 | 6/2014 | Foletto et al. |
| 2014/0176126 A1 | 6/2014 | Friedrich et al. |
| 2014/0232379 A1* | 8/2014 | Nazarian ............... G01D 5/147 |
| | | 324/207.21 |
| 2014/0266176 A1 | 9/2014 | Fernandez et al. |
| 2014/0347044 A1 | 11/2014 | Monreal et al. |
| 2015/0022186 A1 | 1/2015 | Ausserlechner |
| 2015/0022187 A1 | 1/2015 | Taylor et al. |
| 2015/0346289 A1 | 12/2015 | Ausserlechner |
| 2015/0377648 A1 | 12/2015 | Sirohiwala et al. |
| 2016/0025820 A1 | 1/2016 | Scheller et al. |
| 2016/0123774 A1 | 5/2016 | Foletto et al. |
| 2017/0271399 A1 | 9/2017 | Lee et al. |
| 2017/0356762 A1 | 12/2017 | David et al. |

FOREIGN PATENT DOCUMENTS

| | | |
|---|---|---|
| DE | 40 31 560 | 4/1992 |
| DE | 195 39 458 A1 | 4/1997 |
| DE | 196 34 715 A1 | 3/1998 |
| DE | 196 50 935 A1 | 6/1998 |
| DE | 198 38 433 | 3/1999 |
| DE | 19851839 A1 | 11/1999 |
| DE | 199 61 504 A1 | 6/2001 |
| DE | 102 10 184 | 9/2003 |
| DE | 103 14 602 A1 | 10/2004 |
| DE | 10 2006 037 226 A1 | 2/2008 |
| DE | 10 2007 018 238 A1 | 10/2008 |
| DE | 10 2007 041 230 B3 | 4/2009 |
| DE | 10 2010 016 584 | 11/2010 |
| DE | 10 2010 016 584 A1 | 11/2010 |
| DE | 10 2011 102483 | 11/2012 |
| EP | 0 289 414 A2 | 11/1988 |
| EP | 0 289 414 A3 | 11/1988 |
| EP | 0 357 013 A2 | 3/1990 |
| EP | 0 357 013 A3 | 3/1990 |
| EP | 0 361 456 A2 | 4/1990 |
| EP | 0 361 456 A3 | 4/1990 |
| EP | 0 504 583 | 9/1992 |
| EP | 0629834 A1 | 12/1994 |
| EP | 0 680 103 A1 | 11/1995 |
| EP | 0 898 180 A2 | 2/1999 |
| EP | 0 944 888 B1 | 10/2001 |
| EP | 1 443 332 A1 | 8/2004 |
| EP | 1 580 560 A1 | 9/2005 |
| EP | 1 637 898 A1 | 3/2006 |
| EP | 1 662 353 A1 | 5/2006 |
| EP | 1 679 524 A1 | 7/2006 |
| EP | 1 850 143 A1 | 10/2007 |
| EP | 2 063 229 | 5/2009 |
| EP | 2402719 A1 | 1/2012 |
| EP | 2466265 A2 | 6/2012 |
| EP | 2466265 A3 | 6/2012 |
| EP | 2 730 893 A1 | 5/2014 |
| FR | 2 748 105 | 10/1997 |
| FR | 2 909 756 | 6/2008 |
| GB | 2276727 A | 10/1994 |
| GB | 2481482 | 12/2011 |
| JP | 61-48777 | 3/1986 |
| JP | 363 084176 A | 4/1988 |
| JP | 63-263782 | 10/1988 |
| JP | 63-300911 | 12/1988 |
| JP | H02-116753 | 5/1990 |
| JP | 02-149013 | 6/1990 |
| JP | H03-29817 | 2/1991 |
| JP | 04-152688 | 5/1992 |
| JP | H06-273437 | 9/1994 |
| JP | 08-97486 | 4/1996 |
| JP | 09-166612 | 6/1997 |
| JP | H 1038988 | 2/1998 |
| JP | 10-332725 | 12/1998 |
| JP | H10318784 | 12/1998 |
| JP | 11-064363 | 3/1999 |
| JP | 11-74142 | 3/1999 |
| JP | 2000-183241 A | 6/2000 |
| JP | 2001-043475 | 2/2001 |
| JP | 2001-141738 A | 5/2001 |
| JP | 2001-165702 | 6/2001 |
| JP | 2001-1659951 | 6/2001 |
| JP | 2002-117500 | 4/2002 |
| JP | 2002-149013 | 5/2002 |
| JP | 2002-357920 | 12/2002 |
| JP | 2003-177171 | 6/2003 |
| JP | 2004-055932 | 2/2004 |
| JP | 2004-093381 | 3/2004 |
| JP | 2004-152688 | 5/2004 |
| JP | 2004-356338 | 12/2004 |
| JP | 2004-357858 | 12/2004 |
| JP | 2005-517928 | 6/2005 |
| JP | 2005-337866 | 12/2005 |
| JP | 2005-345302 | 12/2005 |
| JP | 2006-003096 | 1/2006 |
| JP | 2007-012582 A | 1/2007 |
| JP | 2007-218799 | 8/2007 |
| JP | 2008-264569 | 11/2008 |
| WO | WO 88/09026 | 11/1988 |
| WO | WO 93/12403 | 6/1993 |
| WO | WO 1993/12403 | 6/1993 |
| WO | WO 94/08203 | 4/1994 |
| WO | WO 1994/08203 | 4/1994 |
| WO | WO 95/18982 | 7/1995 |
| WO | WO 1995/18982 | 7/1995 |
| WO | WO 96/02849 A1 | 2/1996 |
| WO | WO 1999/49322 | 9/1999 |
| WO | WO 2001/74139 A2 | 10/2001 |
| WO | WO 2001/74139 A3 | 10/2001 |
| WO | WO 2003/069358 A2 | 8/2003 |
| WO | WO 2003/069358 A3 | 8/2003 |
| WO | WO 2003/107018 A1 | 12/2003 |
| WO | WO 2004/027436 | 4/2004 |
| WO | WO 2004/072672 A1 | 8/2004 |
| WO | WO 2005/013363 A2 | 2/2005 |
| WO | WO 2005/013363 A3 | 2/2005 |
| WO | WO 2006/056829 | 6/2006 |
| WO | WO 2006/083479 | 8/2006 |
| WO | WO 2007/138508 A1 | 12/2007 |
| WO | WO 2008/008140 A2 | 1/2008 |
| WO | WO 2008/008140 A3 | 1/2008 |

(56) References Cited

FOREIGN PATENT DOCUMENTS

| WO | WO 2008/048379 A1 | 4/2008 |
|---|---|---|
| WO | WO 2008/121443 A1 | 10/2008 |
| WO | WO 2008/145662 A1 | 12/2008 |
| WO | WO 2009/108422 A2 | 9/2009 |
| WO | WO 2009/108422 A3 | 9/2009 |
| WO | WO 2010/014309 A1 | 2/2010 |
| WO | WO 2010/065315 | 6/2010 |
| WO | WO 2010/096367 A1 | 8/2010 |
| WO | WO 2011/011479 | 1/2011 |
| WO | WO 2012/148646 | 11/2012 |
| WO | WO 2013/169455 | 11/2013 |

OTHER PUBLICATIONS

PCT Search Report and Written Opinion dated Jul. 31, 2017 for PCT Application PCT/US2017/033057; 11 pages.
EP Reply to Official Communication filed on Nov. 29, 2017 for EP Pat. Appl. No. 15787111.2; 2 pages.
EP Amended Specification filed on Nov. 29, 2017 for EP Pat. Appl. No. 15787111.2; 2 pages.
EP Amended Claims filed on Nov. 29, 2017 for EP Pat. Appl. No. 15787111.2; 13 pages.
Response to Office Action filed Jan. 11, 2018 for U.S. Appl. No. 15/176,665; 18 pages.
U.S. Appl. No. 15/655,665, filed Jun. 8, 2016, Vig et al.
U.S. Appl. No. 15/176,655, filed Jun. 8, 2016, David et al.
U.S. Appl. No. 14/529,669, filed Oct. 31, 2014, David et al.
U.S. Appl. No. 14/529,606, filed Oct. 31, 2014, Foletto et al.
U.S. Appl. No. 14/529,594, filed Oct. 31, 2014, Drouin et al.
U.S. Appl. No. 14/529,577, filed Oct. 31, 2014, Foletto et al.
U.S. Appl. No. 13/946,830, filed Jul. 19, 2013, Taylor et al.
U.S. Appl. No. 13/946,417, filed Jul. 19, 2013, Burdette et al.
U.S. Appl. No. 13/946,400, filed Jul. 19, 2013, David et al.
U.S. Appl. No. 13/946,010, filed Jul. 19, 2013, David et al.
U.S. Appl. No. 13/871,131, filed Apr. 26, 2013, David et al.
U.S. Appl. No. 13/748,999, filed Jan. 24, 2013, Vig et al.
U.S. Appl. No. 13/526,106, filed Jun. 18, 2012, Vig et al.
U.S. Appl. No. 13/439,094, filed Apr. 4, 2012, Friedrich et al.
U.S. Appl. No. 13/424,618, filed Mar. 20, 2012, Doogue et al.
U.S. Appl. No. 13/398,127, filed Feb. 16, 2012, Cesaeretti et al.
U.S. Appl. No. 13/350,970, filed Jan. 16, 2012, Milano et al.
U.S. Appl. No. 13/095,371, filed Apr. 27, 2011, Cesaretti et al.
U.S. Appl. No. 12/968,353, filed Dec. 15, 2010, Donovan et al.
U.S. Appl. No. 12/959,672, filed Dec. 3, 2010, Doogue et al.
U.S. Appl. No. 12/840,324, filed Jul. 21, 2010, Cesaretti et al.
Ahn et al., "A New Toroidal-Meander Type Integrated Inductor With a Multilevel Meander Magnetic Core", IEEE Transactions on Magnetics, vol. 30, No. 1, Jan. 1994, pp. 73-79.
Allegro "Two-Wire True Zero Speed Miniature Differential Peak-Detecting Gear Tooth Sensor;" ATS645LSH; 2004; Allegro MicroSystems, Inc., Worcester, MA 01615; pp. 1-14.
Allegro Microsystems, Inc. Data Sheet A1341; "High Precision, Highly Programmable Linear Hall Effect Sensor IC with EEPROM, Output Protocols SENT and PWM, and Advanced Output Linearization Capabilities;" May 17, 2010; 46 pages.
Allegro Microsystems, Inc. Data Sheet ATS601LSG; "Non-TPOS, Tooth Detecting Speed Sensor;" Nov. 1, 2011; 9 pages.
Allegro Microsystems, Inc., "Gear-Tooth Sensor for Automotive Applications," Aug. 3, 2001.
Allegro MicroSystems, Inc., Hall-Effect IC Applications Guide, http://www.allegromicro.com/en/Products/Design/an/an27701.pdf, Copyright 1987, 1997, pp. 1-36.
Allegro "True Zero-Speed Low-Jitter High Accuracy Gear Tooth Sensor;" ATS625LSG; 2005; Allegro MicroSystems, Inc. Worcester, MA 01615; pp. 1-21.
Ausserlechner et al.; "Compensation of the Piezo-Hall Effect in Integrated Hall Sensors on (100)-Si;" IEEE Sensors Journal, vol. 7, No. 11; Nov. 2007; ISBN: 1530-437X; pp. 1475-1482.

Ausserlechner et al.; "Drift of Magnetic Sensitivity of Small Hall Sensors Due to Moisture Absorbed by the IC-Package;" Proceedings of IEEE Sensors, 2004; vol. 1; Oct. 24, 2004; ISBN:0-7803-8692-2; pp. 455-458.
Ausserlechner; "Limits of Offset Cancellation by the Principle of Spinning Current Hall Probe;" Proceedings of IEEE Sensors; Oct. 2004; pp. 1117-1120.
Ausserlechner; "The piezo-Hall effect in n-silicon for arbitrary crystal orientation;" Proceedings of IEEE Sensors; vol. 3; Oct. 24, 2004, ISBN: 0-7803-8692-2; pp. 1149-1152.
Bahreyni, et al.; "A Resonant Micromachined Magnetic Field Sensor;" IEEE Sensors Journal; vol. 7, No. 9, Sep. 2007; pp. 1326-1334.
Barrettino, et al.; "CMOS-Based Monolithic Controllers for Smart Sensors Comprising Micromembranes and Microcantilevers;" IEEE Transactions on Circuits and Systems—I Regular Papers vol. 54, No. 1; Jan. 2007; pp. 141-152.
Baschirotto et al.; "Development and Analysis of PCB Vector 2-D Magnetic Field Sensor System for Electonic Compass;" IEEE Sensors Journal vol. 6, No. 2; Apr. 2006; pp. 365-371.
Bilotti et al.; "Monolithic Magnetic Hall Sensor Using Dynamic Quadrature Offset Cancellation;" IEEE Journal of Solid-State Circuits; vol. 32, Issue 6; Jun. 1997; pp. 829-836.
Bowers et al., "Microfabrication and Process Integration of Powder-Based Permanent Magnets", Interdisciplinary Microsystems Group, Dept. Electrical and Computer Engineering, University of Florida, USA; Technologies for Future Micro-Nano Manufacturing Workshop, Napa, California, Aug. 8-10, 2011, pp. 162-165.
Demierre, et al.; "Reference Magnetic Actuator for Self-Calibration of a Very Small Hall Sensor Array;" Sensors and Actuators A97-98; Apr. 2002; pp. 39-46.
Dwyer, "Back-Biased Packaging Advances (SE, SG & SH versus SA & SB)," http://www.allegromicro.com/en/Products/Design/packaging_advances/index.asp, Copyright 2008, pp. 1-5.
Frick, et al.; "CMOS Microsystem for AC Current Measurement With Galvanic Isolation;" IEEE Sensors Journal; vol. 3, No. 6; Dec. 2003; pp. 752-760.
Halg; "Piezo-Hall Coefficients of n-Type Silicon;" Journal of Applied Physics; vol. 64, No. 1; Jul. 1, 1988; pp. 276-282.
Honeywell International, Inc., "Hall Effect Sensing and Application," Micro Switch Sensing and Control, Chapter 3, http://content.honeywell.com/sensing/prodinfo/solidstate/technical/hallbook.pdf, date unavailable but believed to be before Jan. 2008, pp. 9-18.
Hosticka; "CMOS Sensor Systems;" Sensors and Actuators A66; Apr. 1998; pp. 335-341.
Infineon Product Brief, TLE 4941plusC, Differential Hall IC for Wheel Speed Sensing, Oct. 2010, www.infineon.com/sensors, 2 pages.
Infineon Technologies; "Differential Two-Wire Hall Effect Sensor IC;" TLE4942 Preliminary Data Sheet; Jun. 2000; pp. 1-13.
Johnson et al., "Hybrid Hall Effect Device," Appl. Phys. Lett., vol. 71, No. 7, Aug. 1997, pp. 974-976.
Kanda et al.; "The Piezo-Hall Effect in n-Silicon;" $22^{nd}$ International Conference on the Physics of Semiconductors; vol. 1, Jan. 1995: pp. 89-92.
Kapser et al.; "Integrated GMR Based Wheel Speed Sensor for Automotive Applications;" IEEE 2007 Conference on Sensors; Oct. 2007; pp. 848-851.
Krammerer et al.; "A Hall effect sensors network insensitive to mechanical stress;" Proceedings of IEEE Sensors; vol. 3, Oct. 2004; pp. 1071-1074.
Lagorce et al.; "Magnetic and Mechanical Properties of Micromachined Strontium Ferrite/Polyimide Composites;" Journal of Microelectromechanical Systems; vol. 6, No. 4; Dec. 1997; pp. 307-312.
Lequesne et al.; "High-Accuracy Magnetic Position Encoder Concept;" IEEE Transactions on Industry Applications; vol. 35, No. 3; May/Jun. 1999; pp. 568-576.
Magnani et al.; "Mechnical Stress Measurement Electronics Based on Piezo-Resistive and Piezo-Hall Effects;" $9^{th}$ International Conference on Electronics, Circuits and Systems 2002; vol. 1; SBN: 0-7803-7596-3; Dec. 2002; pp. 363-366.

(56) References Cited

OTHER PUBLICATIONS

Maniac et al.; "Short and Long-Term Stability Problems of Hall Plates in Plastic Packages;" IEEE 38th Annual International Reliability Physics Symposium; Apr. 2000; pp. 225-230.

Manic; "Drift in Silicon Integrated Sensors and Circuits Due to the Thermo-Mechanical Stresses;" Lausanne, École Polytechnique Fédérale De Lausanne 2000; Part 1 of 2; 74 pages.

Manic; "Drift in Silicon Integrated Sensors and Circuits Due to the Thermo-Mechanical Stresses;" Lausanne, École Polytechnique Fédérale De Lausanne 2000; Part 2 of 2; 102 pages.

Melexis Microelectronic Systems, Hall Applications Guide, Section 3—Applications, 1997 (48 pages).

Motz et al.; "An Integrated Magnetic Sensor with Two Continuous-Time $\Delta\Sigma$-Converters and Stress Compensation Capability;" IEEE International Solid-State Circuits Conference; Digest of Technical Papers; Feb. 6, 2006; ISBN: 1-4244-0079-1; pp. 1151-1160.

Motz, et al.; "A Chopped Hall Sensor with Small Jitter and Programmable "True Power-On" Function;" IEEE Journal of Solid-State Circuits; vol. 40, No. 7; Jul. 2005; pp. 1533-1540.

Motz, et al.; "An Integrated Hall Sensor Platform Design for Position, Angle and Current Sensing;" IEEE Sensors 2006; Exco, Daegu, Korea / Oct. 22-25, 2006; pp. 1008-1011.

Munter; "A Low-offset Spinning-current Hall Plate;" Sensors and Actuators A21-A23; 1990; pp. 742-746.

Munter, "Electronic Circuitry for a Smart Spinning-current Hall Plate with Low Offset;" Sensors and Actuators A; Jun. 1991; pp. 747-751.

Oniku et al., "High-Energy-Density Permanent Micromagnets Formed From Heterogeneous Magnetic Powder Mixtures", Interdisciplinary Microsystems Group, Dept. of Electrical and Computer Engineering, University of Florida, Gainesville, FL 32611, USA; Preprint of MEMS 2012 Conf. Paper, 4 pages.

Park et al.;"Batch-Fabricated Microinductors with Electroplated Magnetically Anisotropic and Laminated Alloy Cores", IEEE Transactions on Magnetics, vol. 35, No. 5, Sep. 1999, 10 pages.

Park et al.; "Ferrite-Based Integrated Planar Inductors and Transformers Fabricated at Low Temperature;" IEEE Transactions on Magnetics; vol. 33, No. 5; Sep. 1997; pp. 3322-3324.

Partin et al.; "Temperature Stable Hall Effect Sensors;" IEEE Sensors Journal, vol. 6, No. 1; Feb. 2006; pp. 106-110.

Pastre, et al.; "A Hall Sensor Analog Front End for Current Measurement with Continuous Gain Calibration;" IEEE Sensors Journal; vol. 7, No. 5; May 2007; pp. 860-867.

Pastre, et al.; "A Hall Sensor-Based Current Measurement Microsystem With Continuous Gain Calibration;" Research in Microelectronics and Electronics, IEEE vol. 2; Jul. 25, 2005; ISBN: 0-7803-9345-7; pp. 95-98.

Popovic; "Sensor Microsystems;" Proc. 20th International Conference on Microelectronics (MWIL 95); vol. 2, NIS, Serbia, Sep. 12-14, 1995; pp. 531-537.

Randhawa; "Monolithic Integrated Hall Devices in Silicon Circuits;" Microelectronics Journal; vol. 12, No. 6; Sep. 14-17, 1981; pp. 24-29.

Robert Bosch GMBH Stuttgart; "Active Sensor for ABS/ASR/VDC-Systems with 2-Wire-Current Interface;" Specification TLE4941/TLE4942; Version 5; Jun. 25, 2000; 44 pages.

Ruther et al.; "Integrated CMOS-Based Sensor Array for Mechanical Stress Mapping;" 5th IEEE Conference on Sensors, Oct. 2007; pp. 1131-1134.

Ruther et al.; "Thermomagnetic Residual Offset in Integrated Hall Plates;" IEEE Sensors Journal; vol. 3, No. 6; Dec. 2003; pp. 693-699.

Sargent; "Switched-capacitor IC controls feedback loop;" EDN; Design Ideas; Feb. 17, 2000; pp. 154 and 156.

Schneider; "Temperature Calibration of CMOS Magnetic Vector Probe for Contactless Angle Measurement System," IEDM 1996 pp. 533-536.

Schott et al.; "Linearizing Integrated Hall Devices;" 1997 International Conference on Solid-State Sensors and Actuators, Jun. 16-19, 1997; pp. 393-396.

Schott, et al.; "CMOS Single-Chip Electronic Compass with Microcontroller;" IEEE Journal of Solid-State Circuits; vol. 42, No. 12; Dec. 2007; pp. 2923-2933.

Simon et al.; "Autocalibration of Silicon Hall Devices;" 8th International Conference on Solid-State Sensors and Actuators; vol. 2; Jun. 25, 1995; pp. 237-240.

Smith et al.; "Low Magnetic Field Sensing with GMR Sensors;" Sensor Magazine; Part 1; Sep. 1999; http://archives.sensormag.com/articles/0999/76mail.shtml; pp. 1-8.

Smith et al.; "Low Magnetic Field Sensing with GMR Sensors;" Sensor Magazine; Part 2; Oct. 1999; http://archives.sensorsmag.com/articles/1099/84/mail.shtml; pp. 1-11.

Steiner et al.; "Double-Hall Sensor with Self-Compensated Offset;" International Electron Devices Meeting; Dec. 7, 1997; ISBN: 0-7803-4100-7; pp. 911-914.

Steiner et al; Offset Reduction in Hall Devices by Continuous Spinning Current Method; Sensors and Actuators A66; 1998; pp. 167-172.

Stellrecht et al.; Characterization of Hygroscopic Swelling Behavior of Mold Compounds and Plastic Packages; IEEE Transactions on Components and Packaging Technologies; vol. 27, No. 3; Sep. 2004; pp. 499-506.

Tian et al.; "Multiple Sensors on Pulsed Eddy-Current Detection for 3-D Subsurface Crack Assessment;" IEEE Sensors Journal, vol. 5, No. 1; Feb. 2005; pp. 90-96.

Trontelj et al; "CMOS Integrated Magnetic Field Source Used as a Reference in Magnetic Field Sensors on Common Substrate;" WEP 1-6; IMTC; May 1994; pp. 461-463.

Wu, et al., "A Chopper Current-Feedback Instrumentation Amplifier with a 1mHz 1/f Noise Corner and an AC-Coupled Ripple-Reduction Loop;" IEEE International Solid-State Circuits Conference; Feb. 10, 2009; pp. 322-324.

Zou et al.; "Three-Dimensional Die Surface Stress Measurements in Delaminated and Non-Delaminated Plastic Packages;" 48th Electronic Components and Technology Conference; May 25, 1998; pp. 1223-1234

Amendment filed Mar. 30, 2017 for U.S. Appl. No. 14/529,669; 12 pages.

Amendment in response to Office Action dated Dec. 15, 2015 and filed Apr. 12, 2016 for U.S. Appl. No. 13/946,380; 17 pages.

Amendment in response to Office Action dated Jan. 12, 2017 and filed Apr. 11, 2017 for U.S. Appl. No. 13/946,380; 18 pages.

Amendment in response to Office Action dated Jul. 9, 2015 filed Nov. 9, 2015 for U.S. Appl. No. 13/946,380; 26 pages.

Amendment in response to Office Action dated May 19, 2017 filed Jun. 22, 2017 for U.S. Appl. No. 13/946,380; 8 pages.

Amendment under 37 C.F.R. §1.312 in response to Notice to File Corrected Application Papers filed Aug. 29, 2017 for U.S. Appl. No. 13/946,380; 3 pages.

Amendment under PCT Article 19 filed on Oct. 5, 2010 in PCT/US2010/024256; 18 pages, 18 pages.

Chinese First Office Action (with English translation) dated Aug. 29, 2012; for Chinese Pat App. No. 200980106535.4; 8 pages.

Chinese Notice of Allowance (with English translation) dated Jul. 4, 2011; for Chinese Pat. App. No. 200880008895.3; 4 pages.

Chinese Notice of Completing Formalities for Patent Registration (with English translation); dated Mar. 6, 2013; for Chinese Pat. App. No. 200920783766.7; 4 pages.

Chinese Office Action (with English translation) dated Sep. 9, 2010; for Chinese Pat. App. No. 200880008895.3; 12 pages.

Chinese Response to Office Action dated Mar. 28, 2011; for Chinese Pat. App. No. 200880008895.3; 7 pages.

Chinese Second of Action (with English translation) dated Apr. 15, 2013; for Chinese Pat. App. No. 200980106535.4; 9 pages.

Corrected Notice of Allowability dated Aug. 9, 2013; for U.S. Appl. No. 12/840,324; 6 pages.

Corrected Notice of Allowability dated Jul. 17, 2013; for U.S. Appl. No. 12/840,324; 7 pages.

Email from NTD Patent and Trademark Office dated Jun. 11, 2012; for Chinese Pat. App. No. 200920783766.7; 2 pages.

EP Official Communication; dated Feb. 23, 2012; for EP. Pat. App. No. 10739429.8; 2 pages.

(56) References Cited

OTHER PUBLICATIONS

EP Response filed on Dec. 9, 2016 to Official Communication dated Oct. 14, 2016 regarding European Pat. Appl. No. 14742067.3; 23 pages.
European Board of Appeals Datasheet for the Decision dated Nov. 22, 2007; for European Pat. App. No. 03 710 766.1; 22 pages.
European Board of Appeals Decision dated Feb. 28, 2005; for European Pat. App. No. 03 710 766.1; 14 pages.
European Communication for the Board of Appeals dated Apr. 30, 2009; for European Pat. App. No. 03 710 766.1; 2 pages.
European Decision to Grant Patent dated Sep. 5, 2013; for European Pat. App. No. 10739429.8; 2 pages.
European Preliminary Amendment from the Board of Appeal dated May 26, 2009; for European Pat. App. No. 03 710 766.1; pages.
European Response to Written Opinion dated Apr. 18, 2011; for European Pat. App. No. 09789890.2; 11 pages.
European Search Report dated Jul. 4, 2011; for European Pat. App. No. 13169881.9; 11 pages.
Extended European Search Report dated Apr. 5, 2017 for EP Appl. No. 16192498.0; 10 pages.
Final Office Action dated Dec. 15, 2015 for U.S. Appl. No. 13/946,380; 36 pages.
Final Office Action dated Feb. 12, 2013; for U.S. Appl. No. 12/840,324; 19 pages.
Final Office Action dated Jan. 12, 2017 for U.S. Appl. No. 13/946,380; 33 pages.
Final Office Action dated Jan. 4, 2017 for U.S. Appl. No. 14/529,594; 38 pages.
Final Office Acton dated Jan. 9, 2017 for U.S. Appl. No. 14/529 669; 11 pages.
Final Office Action dated Jul. 1, 2013; for U.S. Appl. No. 12/183,367; 6 pages.
Final Office Action dated Jul. 23, 2013; for U.S. Appl. No. 12/183,367; 8 pages.
Final Office Action dated May 10, 2012; for U.S. Appl. No. 12/328,798; 17 pages.
Final Office Action dated May 2, 2013: for U.S. Appl. No. 12/183,367; 15 pages.
International Search Report and Written Opinion dated Nov. 4, 2014 for Int'l PCT Application PCT/US2014/044993; 13 pages.
International Search Report and Written Opinion dated Oct. 28, 2014 for Int'l PCT Application PCT/US2014/044991; 12 pages.
International Search Report and Written Opinion of the ISA dated Aug. 3, 2016; for PCT Application No. PCT/US2015/055230; 12 pages.
Japanese First Office Action (English translation) received Jul. 26, 2012; for Japanese Pat. App. No. 2010-201028; 5 pages.
Japanese First Office Action (with English translation) dated May 3, 2012; for Chinese Pat. App. No. 200920783766.7; 13 pages.
Japanese Notice of Allowance dated Nov. 8, 2011; for Japanese Pat. App. No. 2009-568426; 3 pages.
Japanese Notice of Reasons for Rejection (English translation) for Japanese Pat. App. No. 2010-547666; 4 pages.
Japanese Notice of Reasons for Rejection; dated Jul. 16, 2013; for Japanese Pat. App. No. 2011-539582; 3 pages.
Japanese Response to First Office Action (with English translation) received Oct. 16, 2012; for Japanese Pat. App. No. 2010-201028; 10 pages.
Japanese Second Office Action (English translation) received Aug. 7, 2013; for Japanese Pat. App. No. 2010-201028; 3 pages.
Japanese Second Office Action dated Jan. 18, 2013; for Chinese Pat. App. No. 200920783766.7; 8 pages.
Letter from NTD Patent & Trademark Agency Limited dated Mar. 28, 2011; for Chinese Pat. App. No. 200880008895.3; 1 page.
Letter from NTD Patent & Trademark Agency Limited dated Oct. 13, 2010; for Chinese Pat. App. No. 200880008895.3; 2 pages.
Letter from NTD Patent and Trademark Agency dated Feb. 6, 2013; for Chinese Pat. App. No. 200920783766.7; 2 pages.
Letter from NTD Patent and Trademark Agency dated Jul. 11, 2013; for Chinese Pat. App. No. 200980106535.4; 1 pages.
Letter from NTD Patent and Trademark Agency dated Mar. 21, 2013; for Chinese Pat. App. No. 200920783766.7; 1 page.
Letter from NTD Patent and Trademark Office dated Jan. 19, 2013; for Chinese Pat. App. No. 200980106535.4; 1 page.
Letter from NTD Patent and Trademark Office dated May 21, 2013; for Chinese Pat. App. No. 200980106535.4; 2 pages.
Letter from NTD Patent and Trademark Office dated Oct. 10, 2012; for Chinese Pat. App. No. 200980106535.4; 2 pages.
Letter from NTD Patent and Trademark Office dated Oct. 18, 2012; for Chinese Pat. App. No. 200920783766.7; 1 pages.
Letter from Yuasa and Hara dated Apr. 23, 2000; Japanese Response to Second Office Action filed Mar. 25, 2009; for JP Pat. App. No. 2009-568426; 8 pages.
Letter from Yuasa and Hara dated Aug. 16, 2013; for Japanese Pat. App. No. 2011-539582; 3 pages.
Letter from Yuasa and Hara dated Aug. 7, 2013; for Japanese Pat. App. No. 2010-201028; 4 pages.
Letter from Yuasa and Hara dated Dec. 12, 2008; Japanese Second Office Action; for JP Pat. App. No. 2009-568426; 4 pages.
Letter from Yuasa and Hara dated Jan. 17, 2011; Japanese Third Office Action dated Feb. 16, 2011; for JP Pat. App. No. 2009-568426; 5 pages.
Letter from Yuasa and Hara dated Jul. 26, 2012; for Japanese Pat. App. No. 2010-201028; 5 pages.
Letter from Yuasa and Hara dated Jun. 4, 2008; Japanese First Office Action dated Apr. 7, 2008; for JP Pat. App. No. 2009-568426; 5 pages.
Letter from Yuasa and Hara dated Jun. 9, 2011; Japanese Response to Third Office Action filed May 13, 2011; for JP Pat. App. No. 2009-568426; 27 pages.
Letter from Yuasa and Hara dated May 27, 2013; for Japanese Pat. App. No. 2010-547666; 2 pages.
Letter from Yuasa and Hara dated Oct. 16, 2012; for Japanese Pat. App. No. 2010-201028; 2 pages.
Letter from Yuasa and Hara dated Oct. 21, 2008; Japanese Response to First Office Action filed Sep. 22, 2008; for JP Pat. App. No. 2009-553426; 14 pages.
Letter to NTD Patent and Trademark Agency dated Feb. 6, 2013; for Chinese Pat. App. No. 200920783766.7; 2 pages.
Letter to NTD Patent and Trademark Agency dated Jun. 19, 2013; for Chinese Pat. App. No. 200980106535.4; 11 pages.
Letter to NTD Patent and Trademark Office dated Aug. 29, 2012; for Chinese Pat. App. No. 200920783766.7; 20 pages.
Letter to NTD Patent and Trademark Office dated Dec. 11, 2012; for Chinese Pat. App. No. 200980106535.4; 8 pages.
Letter Under 37 C.F.R. §1.56 filed Jul. 25, 2013 for U.S. Appl. No. 13/946,380; 2 pages.
Non-Final Office Action dated Aug. 26, 2016 for U.S. Appl. No. 13/946,380; 40 pages.
Non Final Office Action dated Jul. 9, 2015 for U.S. Appl. No. 13/946,380; 31 pages.
Non-final Office Action dated May 19, 2017 for U.S. Appl. No. 14/529,606; 11 pages.
Non-Final Office Action dated May 19, 2017 for U.S. Appl. No. 13/946,380; 20 pages.
Non-Final Office Action dated Jul. 14, 2016 for U.S. Appl. No. 14/529,594; 50 pages.
Notice of Allowance dated Aug. 4, 2017 for U.S. Appl. No. 14/529,606; 9 pages.
Notice of Allowance dated Dec. 10, 2012; for U.S. Appl. No. 12/706,318; 9 pages.
Notice of Allowance dated Feb. 21, 2013; for U.S. Appl. No. 13/241,380; 9 pages.
Notice of Allowance dated Febuary 11, 2011; for U.S. Appl. No. 12/037,393; 8 pages.
Notice of Allowance dated Jul. 19, 2011; for U.S. Appl. No. 12/959,672; 8 pages.
Notice of Allowance dated Jun. 27, 2011; for U.S. Appl. No. 12/959,672; 8 pages.
Notice of Allowance dated Mar. 1, 2013; for U.S. Appl. No. 12/328,798; 10 pages.
Notice of Allowance dated Mar. 10, 2017 for U.S. Appl. No. 14/529,577; 8 pages.

(56) References Cited

OTHER PUBLICATIONS

Notice of Allowance dated May 18, 2017 for U.S. Appl. No. 14/529,669; 8 pages.
Notice of Allowance dated May 24, 2013; for U.S. Appl. No. 12/840,324; 12 pages.
Notice of Allowance dated Nov. 3, 2010; for U.S. Appl. No, 12/037,393; 7 pages.
Notice of Allowance dated Oct. 26, 2012; for U.S. Appl. No. 12/328,798; 13 pages.
Notice of Allowance dated Oct. 28, 2013; for U.S. Appl. No. 13/095,371; 19 pages.
Notice of Allowance Oct. 29, 2012; for U.S. Appl. No. 13/241,380; 23 pages.
Notice of Allowance dated Sep. 6, 2013; for U.S Appl. No. 12/183,367; 7 pages.
Notice to File Corrected Application Papers dated Aug. 28, 2017 for U.S. Appl. No. 13/946,380; 3 pages.
Office Action dated Dec. 14, 2009; for U.S. Appl. No. 12/328,798; 20 pages.
Office Action dated Feb. 2, 2011; for U.S. Appl. No. 12/059,672; 13 pages.
Office Action dated Feb. 22, 2012; for U.S. Appl. No. 13/241,380; 23 pages.
Office Action dated Jan. 18, 2013; for U.S. Appl. No. 12/360,889; 7 pages.
Office Action dated Jul. 14, 2016 for U.S. Appl. No. 14/529,594; 94 pages.
Action dated Jul. 19, 2012; for U.S. Appl. No. 13/241,380; 18 pages.
Office Action dated Jul. 28, 2016 for U.S. Appl. No. 14/529,669; 78 pages.
Action dated Jul. 6, 2012; for U.S. Appl. No. 12/706 318; 29 pages.
Office Action dated Jun. 11, 2013; for U.S. Appl. No. 13/095,371; 31 pages.
Office Action dated Jun. 28, 2013; for U.S. Appl. No. 12/360,889; 7 pages.
Office Action dated Jun. 30, 2010; for for U.S. Appl. No. 12/037,393; 21 pages.
Office Action dated Jun. 7, 2012; U S. Appl. No. 12/360,889; 9 pages.
Office Action dated May 12, 2011; for U.S. Appl. No. 12/183,367; 17 pages.
Office Action dated May 24, 2010; for U.S. Appl. No. 12/328,798; 22 pages.
Office Action dated Nov. 3, 2016 regarding U.S. Appl. No. 14/529,606; 12 pages.
Office Action dated Nov. 9, 2016 regarding U.S. Appl. No. 14/529,577; 14 pages.
Office Action dated Oct. 20, 2011; for U.S. Appl. No. 12/183,367; 11 pages.
Office Action dated Oct. 31, 2011; for U.S. Appl. No. 12/328,798; 23 pages.
Office Action dated Sep. 11, 2012; for U.S. Appl. No. 12/840,324; 30 pages.
Office Action in U.S. Appl. No. 13/468,478; dated Jan. 15, 2014; for 36 pages.
Office Action/Restriction Requirement dated Apr. 12, 2012; for U.S. Appl. No. 12/183,367; 6 pages.
Office Action/Restriction Requirement dated May 14, 2010; for U.S. Appl. No. 12/037,393; 6 pages.
Office Action/Restriction Requirement dated Oct. 23, 2009; for U.S. Appl. No. 12/328,798; 7 pages.
PCT International Preliminary Report and Written Opinion on Patentability of the ISA dated Aug. 7, 2007; for PCT/US2006/000363; 9 pages.
PCT International Preliminary Report on Patentability and Written Opinion of the ISA dated Jan. 28, 2016; For PCT Pat. App. No. PCT/US2006/000363; 17 pages.
PCT International Preliminary Report on Patentability and Written Opinion dated Sep. 10, 2010 for PCT/US2009/031776.
PCT International Preliminary Report on Patentability, and Written Opinion for PCT/US2009/048237 dated Feb. 10, 2011, 8 pages.
PCT International Preliminary Report on Patentability and Written Opinion of the ISA; dated Jun. 7, 2011; for PCT Pat. App. No. PCT/US2009/065044; 7 pages.
PCT International Preliminary Report on Patentability and Written Opinion of the ISA dated Sep. 1, 2011; for PCT Pat. App. No. PCT/US2010/024256; 9 pages.
PCT International Preliminary Report on Patentability and Written Opinion of the ISA; dated Feb. 2, 2012; for PCT Pat. App. No. PCT/US2010/042694; 11 pages.
PCT International Preliminary Report on Patentability for PCT/US2008/053551; dated Oct. 8, 2009; 7 pages.
PCT International Search Report and Written Opinion of the ISA dated Dec. 23, 2015; for PCT Pat. App. No. PCT/US2015/055233; 12 pages.
PCT International Search Report and Written Opinion of the ISA dated Feb. 4, 2016; For PCT Pat. App. No. PCT/US2015/055474; 15 pages.
PCT International Search Report and Written Opinion of the ISA dated Jan. 15, 2016; For PCT Pat. App. No. PCT/US2015/055236; 12 pages.
PCT Invitation to Pay Additional Fees and Partial Search Report dated Nov. 4, 2014; for PCT Pat. App. No. PCT/US2014/044236; 7 pages.
PCT Search Report and the Written Opinion of the ISA dated Jul. 17, 2013; for PCT/US2013/037065; 13 pages.
PCT Search Report and Written Opinion for PCT/US2009/065044 dated Jan. 7, 2010; 11 pages.
PCT Search Report and Written Opinion for PCT/US2017/033052 dated Jul. 28, 2017; 11 pages.
PCT Search Report and Written Opinion of the ISA dated Dec. 19, 2014; for PCT Pat. App. No. PCT/US2014/044236; 23 pages.
PCT Search Report and Written Opinion of the ISA for PCT Pat. App. No. PCT/US2012/032315; dated Jun. 22, 2012; 16 pages.
PCT Search Report and Written Opinion of the ISA for PCT/US2008/053551; dated Jul. 15, 2008; 11 pages.
PCT Search Report and Written Opinion of the ISA for PCT/US2010/024256 dated Aug. 11, 2010; 11 pages.
PCT Search Report and Written Opinion of the ISA for PCT/US2010/042694 dated Sep. 27, 2010; 13 pages.
PCT Search Report dated Nov. 19, 2003 for PCT Pat. App. No. PCT/US03/02489; 5 pages.
PCT Search Report for PCT/US2006/000363 dated May 11, 2006.
PCT Search Report of the ISA for PCT/US2009/031776 dated Oct. 23, 2009.
PCT Search Report of the ISA for PCT/US2009/048237 dated Aug. 25, 2009; 2 pages.
Preliminary Amendment filed Apr. 21, 2017 for U.S. Appl. No. 14/529,606; 12 pages.
Preliminary Amendment filed Sep. 17, 2013 for U.S. Appl. No. 13/946,380; 5 pages.
Request for Continued Examination dated Aug. 9, 2012; for U.S. Appl. No. 12/328,798; 1 page.
Request for Continued Examination dated Jan. 24, 2013; for U.S. Appl. No. 12/328,798; 3 pages.
Request for Continued Examination dated Jan. 25, 2011; for U.S. Appl. No. 12/037,393; 1 page.
Request for Continued Examination dated Jul. 12, 2011; for U.S. Appl. No. 12/959,672; 2 pages.
Request for Continued Examination filed Apr. 24, 2017 for U.S. Appl. No. 14/529,669; 3 pages.
Request for Continued Examination filed Apr. 21, 2017 for U.S. Appl. No. 14/529,606; 3 pages.
Response to Chinese First Office Action dated Aug. 29, 2012; for Chinese Pat. App. No. 200980106535.4; 12 pages.
Response to Chinese Second Office Action dated Aug. 29, 2012; for Chinese Pat. App. No. 200980106535.4; 12 pages.
Response to EP Official Communication dated Feb. 23, 2012 for EP. Pat. App. No. 10739429.8; filed Sep. 4, 2012.
Response to Final Office Action dated Feb. 12, 2013; for U.S. Appl. No. 12/840,324; 12 pages.

(56) References Cited

OTHER PUBLICATIONS

Response to Final Office Action dated May 10, 2012; for U.S. Appl. No. 12/328,798; 6 pages.
Response to Final Office Action dated May 2, 2013; for U.S. Appl. No. 12/183,367; 8 pages.
Response to Final Office Action filed Mar. 31, 2017; for U.S. Appl. No. 14/529,594; 16 pages.
Response to Japanese First Office Action dated May 3, 2013; for Chinese Pat. App. No. 200920783766.7; 9 pages.
Response to Japanese Second Office Action (with English translation) dated Jan. 18, 2013; for Chinese Pat. App. No. 200920783766.7; 7 pages.
Response to Office Action dated Dec. 14, 2009; for U.S. Appl. No. 12/328,798; 22 pages.
Response to Office Action dated Feb. 2, 2011; for U.S. Appl. No. 12/959,672; 8 pages.
Response to Office Action dated Feb. 22, 2012; for U.S. Appl. No. 13/241,380; 16 pages.
Response to Office Action dated Jan. 18, 2013; for U.S. Appl. No. 12/360,889; 6 pages.
Response to Office Action dated Jul. 19, 2012; for U.S. Appl. No. 13/241,380; 6 pages.
Response to Office Action dated Jul. 23, 2013; for U.S. Appl. No. 12/183,367; 13 pages.
Response to Office Action dated Jul. 28, 2016; for U.S. Appl. No. 14/529,669; Response filed Oct. 28, 2016; 18 Pages.
Response to Office Action dated Jul. 6, 2012; for U.S. Appl. No. 12/706,318; 12 pages.
Response to Office Action dated Jun. 11, 2013; for U.S. Appl. No. 13/095,371; 25 pages.
Response to Office Action dated Jun. 28, 2013; for U.S. Appl. No. 12/360,889; 15 pages.
Response to Office Action dated Jun. 30, 2010; for U.S. Appl. No. 12/037,393; 34 pages.
Response to Office Action dated Jun. 7, 2012; for U.S. Appl. No. 12/360,889; 11 pages.
Response to Office Action dated May 12, 2011; for U.S. Appl. No. 12/183,367; 13 pages.
Response to Office Action dated May 24, 2010; for U.S. Appl. No. 12/328,798; 23 pages.
Response to Office Action dated Oct. 20, 2011; for U.S. Appl. No. 12/183,367; 15 pages.
Response to Office Action dated Oct. 31, 2011; for U.S. Appl. No. 12/328,798; 14 pages.
Response to Office Acton dated Sep. 11, 2012; for U.S. Appl. No. 12/840,324; 15 pages.
Response to Office Action filed Oct. 14, 2016 for U.S. Appl. No. 14/529,594; 29 pages.
Response to Office Action filed Jan. 26, 2017 for U.S. Appl. No. 14/529,606; 19 pages.
Response to Office Action filed Jan. 27, 2017 for U.S. Appl. No. 14/529,577; 18 pages.
Response to Office Action filed Jul. 5, 2017 for U.S. Appl. No. 14/529,606; 13 pages.
Response to Office Action filed Jun. 29, 2017 for U.S. Appl. No. 14/529,669; 11 pages.
Response to Office Action/Restriction Requirement dated Apr. 12, 2013; for U.S. Appl. No. 12/183,367;2 pages.
Response to Office Action/Restriction Requirement dated May 14, 2010; for U.S. Appl. No. 12/037,393; 6 pages.
Response to Office Action/Restriction Requirement dated Oct. 23, 2009; for U.S. Appl. No. 12/328,798; 1 page.
Response to Rule 312 Communication dated Sep. 1, 2017 for U.S. Appl. No. 13/946,330; 2 pages.
Response under 37 C.F.R. §1.111 to non-final Office Action dated Aug. 26, 2016 and filed Nov. 9, 2016 for U.S. Appl. No. 13/946,380; 19 pages.
Supplemental Notice of Allowability dated Aug. 31, 2017 for U.S. Appl. No. 13/946,380; 5 pages.
Supplemental Response to Office Action dated Jul. 6, 2012; for U.S. Appl. No. 12/706,318; 12 pages.
Supplemental Response to Restriction Requirement dated Feb. 6, 2013; for U.S. Appl. No. 12/183,367; 2 pages.
Office Action dated Oct. 20, 2017 for U.S. Appl. No. 15/176,665; 22 pages.
A.A. Thornton response to official communication dated May 22, 2017 and filed on Nov. 17, 2017 regarding Div. EP Patent Application No. 16192498.0; 7 pages.
Amended Claims in response to official communication filed on Nov. 17, 2017 regarding Div. EP Patent Application No. 16192498.0; 7 pages.
Notice of Allowance dated Mar. 20, 2018 for U.S. Appl. No. 15/176,665; 8 pages.
A.A. Thornton letter filed Dec. 15, 2017 in response to EPO communication under Rule 161 and 162EPC for EP Pat. Appl. No. 15791066.2; 2 pages.
Amended claims filed on Dec. 15, 2017 in response to EPO communication under Rule 161 and 162EPC for EP Pat. Appl. No. 15791066.2; 5 pages.
Response to Official Communication filed Dec. 21, 2017 for EP Pat. Appl. No. 15787099.9; 3 pages.
Amended Claims filed in Response to Official Communication filed Dec. 21, 2017 for EP Pat. Appl. No. 15787099.9; 7 pages.
Response to U.S. Office Action dated Dec. 18, 2017 for U.S. Appl. No. 15/176,655; Response filed Feb. 9, 2018; 14 Pages.
Examination Report dated Mar. 8, 2018 fpr EP Appl. No. 15791066.2; 4 pages.
Amendment filed Jun. 29, 2018 for U.S. Appl. No. 15/178,655; 16 pages.
Final Office Action dated Apr. 5, 2018 for U.S. Appl. No. 15/176,655; 35 pages.
Communication under Rule 71(3) EPC for EP Pat. Appl. No. 15787111.2 dated Feb. 28, 2018; 7 pages.
Allowed specification for EP Pat. Appl. No. 15787111.2 dated Nov. 29, 2017; 87 pages.
Response to EPO Communication under Rules 161 and 162 EPC filed on Dec. 21, 2017 for EP Pat. Appl. No. 15853626.8; 2 pages.
Amended Claims in response to EPO Communication under Rules 161 and 162 EPC filed on Dec. 21, 2017 for EP Pat. Appl. No. 15853626.8; 7 pages.
Examination Report dated May 28, 2018 for EP Pat. Appl. No. 15787099.9-1022; 7 pages.
English translations of Claims on File dated Sep. 20, 2018 for Japanese Application No. 2017-522906; 7 Pages.
Instruction Letter to Foreign Associate dated Jul. 30, 2018 for Japanese Application No. 2017-522906; 2 Pages.
Letter from Foreign Associate dated Sep. 20, 2018 reporting voluntary amendment filed for Japanese Application No. 2017-522906; 2 Pages.
Amended p. 5 Description with tracked changes and New p. 5a Description as filed on Jul. 13, 2018 for EP Application No. 15791066.2; 2 Pages.
Amended Description with tracked changes as filed on Jul. 13, 2018 for EP Application No. 15791066.2; 11 Pages.
Amended Claims with tracked changes as filed on Jul. 13, 2018 for EP Application No. 15791066.2; 4 Pages.
Communication Pursuant to Article 94(3) EPC dated Jul. 7, 2018 for EP Application No. 15353626,8; 4 Pages.
Response to the Official Communication dated Mar. 8, 2018 for EP Application No. 15791066.2 as filed on Jul. 13, 2018; 2 Pages.
Response to Examination report dated May 28, 2018 for European Application No. 15787099.9 as filed on Sep. 17, 2018; 3 Pages.
Amended claims for Application No. 15787099.9 as filed on Sep. 17, 2018; 4 Pages.
Replacement p. 5 of specification for European Application No. 15787099.9 as filed on Sep. 17, 2018; 1 Page.
New p. 5A of specification for European Application No. 15787099.9 as filed on Sep. 17, 2018; 1 Page.
Non-Final Office Action dated Aug. 9, 2018 for U.S. Appl. No. 15/176,655; 19 Pages.
Response to Office Action dated Aug. 9, 2018 for U.S. Appl. No. 15/176,655, filed Oct. 11, 2018; 8 Pages.

(56) References Cited

OTHER PUBLICATIONS

Communication under Rule 71(3) EPC dated Oct. 10, 2018 for International Application No. 15791066.2; 7 Pages.
Allowed Specification dated Oct. 10, 2018 for International Application No. 15791066,2; 102 Pages.
Office Action dated Nov. 28, 2018 for U.S. Appl. No. 15/624,898; 35 Pages.
Response to Office Action dated Nov. 28, 2018 and filed on Jan. 11, 2019 for U.S. Appl. No. 15/624,898; 17 pages.
A.A. Thornton letter dated Nov. 26, 2018 in to response Official Communication dated Jul. 9, 2018 for EP Pat. Appl. No. 15853626.8; 4 pages.
Amended Claims filed on Nov. 26, 2018 for EP Pat. Appl. No. 15853626.8; 4 pages.

* cited by examiner

ARRANGEMENTS FOR MAGNETIC FIELD SENSORS THAT ACT AS TOOTH DETECTORS

CROSS REFERENCE TO RELATED APPLICATIONS

This application is a Continuation Application of and claims the benefit of U.S. patent application Ser. No. 13/946,380, filed Jul. 19, 2013, now U.S. Pat. No. 9,810,519, issued Nov. 7, 2017, which is incorporated herein by reference in its entirety.

STATEMENT REGARDING FEDERALLY SPONSORED RESEARCH

Not Applicable.

FIELD

This invention relates generally to magnetic field sensors, and, more particularly, to magnetic field sensors having a magnet and a substrate with magnetic field sensing elements thereupon, all arranged in a variety of relative positions.

BACKGROUND

Various types of magnetic field sensing elements are known, including Hall Effect elements and magnetoresistance elements. Magnetic field sensors generally include a magnetic field sensing element and other electronic components. Some magnetic field sensors also include a permanent magnet in a so-called "back biased" arrangement described more fully below.

Magnetic field sensors provide an electrical signal representative of a sensed magnetic field. In some embodiments that have the magnet, the sensed magnetic field is a magnetic field generated by the magnet, in which case, in the presence of a moving ferromagnetic object, the magnetic field generated by the magnet and sensed by the magnetic field sensor varies in accordance with a shape or profile of the moving ferromagnetic object.

Magnetic field sensors are often used to detect movement of features of a ferromagnetic gear, such as gear teeth and/or gear slots or valleys. A magnetic field sensor in this application is commonly referred to as a "gear tooth" sensor.

In some arrangements, the gear is placed upon a target object, for example, a camshaft in an engine. Thus, it is the rotation of the target object (e.g., camshaft) that is sensed by detection of the moving features of the gear. Gear tooth sensors are used, for example, in automotive applications to provide information to an engine control processor for ignition timing control, fuel management, anti-lock braking systems, wheel speed sensors, and other operations.

Information provided by the gear tooth sensor to the engine control processor can include, but is not limited to, an absolute angle of rotation of a target object (e.g., a camshaft) as it rotates, a speed of the rotation, and a direction of the rotation. With this information, the engine control processor can adjust the timing of firing of the ignition system and the timing of fuel injection by the fuel injection system.

Many types of magnetic field sensors do not provide an accurate output signal (e.g., indication of absolute angle, speed, or direction of rotation) immediately upon power up, upon movement of the target object from zero rotating speed, and/or upon movement slowing to zero rotating speed, but instead provide an accurate output signal only once the target object has moved through a substantial rotation or is moving with substantial speed. For example, in one type of magnetic field sensor described in U.S. Pat. No. 6,525,531, entitled "Detection of Passing Magnetic Articles while Adapting the Detection Threshold," issued Feb. 25, 2003, a positive digital-to-analog converter (PDAC) and a negative digital-to-analog converter (NDAC) track positive and negative peaks of a magnetic field signal, respectively, for use in generating a threshold signal. A varying magnetic field signal is compared to the threshold signal. However, the outputs of the PDAC and the NDAC may not be accurate indications of the positive and negative peaks of the magnetic field signal until several cycles of the signal (i.e., signal peaks) occur (i.e., until several gear teeth have passed). This type of magnetic field sensor, which generally requires time to become fully accurate, is referred to herein as a so-called "precision rotation detector."

In contrast, a "true power on state" (TPOS) detector can provide an accurate output signal shortly after movement of a target object (e.g., camshaft) from zero rotating speed, or a low rotation speed in some applications of for example less than 100 rpm, or also shortly before movement slowing to zero rotating speed. Furthermore, even when the target object is not moving, the TPOS detector can provide an indication of whether the TPOS detector is in front of a tooth or a valley of a gear. However, when the target object is stationary, the conventional TPOS detector is not able to identify an absolute or relative angle of rotation of the target object. The TPOS detector can be used in conjunction with a precision rotation detector within a common integrated circuit, each providing information to the engine control processor at different times. For simplicity, TPOS detectors and precision rotation detectors are shown herein within a common integrated circuit. However, the TPOS detector or the precision rotation detector can also be used alone in separate circuits.

As described above, the conventional TPOS detector provides an accurate output signal with only a small initial rotation of the target object, and before the precision rotation detector can provide an accurate output signal. The TPOS detector can provide information to the engine control processor that can be more accurate than information provided by the precision rotation detector for time periods at the beginning and at the end of rotation of the target object (e.g., start and stop of the engine and camshaft), but which may be less accurate when the object is rotating at speed. For magnetic field sensor arrangements that have both a TPOS detector and a precision rotation detector within a common integrated circuit, when the object is rotating at speed, the engine control processor can primarily use rotation information provided by the precision rotation detector. In most conventional applications, once the magnetic field sensor switches to use the precision rotation detector, it does not return to use the TPOS detector until the target object stops rotating or nearly stops rotating.

A conventional TPOS detector is described in U.S. Pat. No. 7,362,094, entitled "Method and Apparatus for Magnetic Article Detection," issued Apr. 22, 2008. The conventional TPOS detector includes a comparator for comparing the magnetic field signal to a fixed, often trimmed, threshold signal. The conventional TPOS detector can be used in conjunction with and can detect rotational information about a TPOS cam (like a gear), which is disposed upon a target object, e.g., an engine camshaft, configured to rotate.

An exemplary output signal from a conventional TPOS detector has at least two states, and typically a high and a low state. The state of the conventional TPOS output signal is high at some times and low at other times as the target object rotates, in accordance with features on the TPOS cam (or gear) attached to the target object.

Similarly, an output signal from a conventional precision rotation detector also has at least two states, and typically a high and a low state. The state of the conventional precision rotation detector output signal is high at some times and low at other times as the target object rotates, also in accordance with features on the TPOS cam (or gear) attached to the target object As described above, conventional TPOS detectors have the ability to differentiate a gear tooth from a gear valley, and to make such detection when the gear is rotating and when the gear is not rotating. In contrast, some conventional precision rotation detectors have the ability to differentiate a gear tooth from a gear valley when the gear is rotating, but not when the gear is stationary. Detectors that can identify a gear tooth from a valley are sometimes referred to as "tooth detectors." Thus, TPOS detectors are usually tooth detectors. Some precision rotation detectors can also be tooth detectors.

Some other conventional precision rotation detectors are unable to differentiate a gear tooth from a valley, but instead, can differentiate an edge of a tooth of the gear from the tooth or the valley. Such detectors are sometimes referred to as "edge detectors." Usually, TPOS detectors are not edge detectors. However, some precision rotation detectors can be edge detectors.

The conventional magnetic field sensor must achieve an accurate output signal that accurately differentiates between gear teeth and gear valleys even in the presence of an air gap between the magnetic field sensor and the gear that may change from installation to installation or from time to time. Still further, the conventional magnetic field sensor must achieve these differentiations even in the presence of unit-to-unit variations in relative positions of the magnet and the magnetic field sensing element within the magnetic field sensor. Still further, the conventional magnetic field sensor must achieve these differentiations even in the presence of unit-to-unit variations in the magnetic field generated by the magnet. Still further, the conventional magnetic field sensor must achieve these differentiations even in the presence of variations of an axial rotation of the magnetic field sensor relative to the gear. Still further, the conventional magnetic field sensor must achieve these differentiations even in the presence of variations of temperature around the magnetic field sensor.

The above effects result in expensive design choices. In particular, some of the above effects result it use of an expensive magnet described below in conjunction with FIGS. 1 and 2.

It would be desirable to provide a magnetic field sensor in a magnetically biased arrangement that can achieve an accurate output signal that accurately differentiates between gear teeth and gear valleys while using a simpler and less expensive magnet.

SUMMARY

A magnetic field sensor in a magnetically biased arrangement achieves an accurate output signal that accurately differentiates between gear teeth and gear valleys while using a simpler and less expensive magnet. The differentiation is achieved even in the presence of variations of mechanical and thermal parameters associated with the magnetic field sensor.

In accordance with one aspect, a magnetic field sensor for sensing motion of a ferromagnetic object comprises a substrate. The substrate includes a first major surface, wherein a first dimension across the first major surface of the substrate defines a width of the substrate and a second dimension across the first major surface of the substrate perpendicular to the first dimension defines a length of the substrate. The substrate also includes first and second substrate edges at ends of the width of the substrate. The substrate also includes a second major surface parallel to the first major surface. The magnetic field sensor further comprises a magnet. The magnet includes a first major surface proximate to the substrate, wherein a first dimension across the first major surface of the magnet defines a width of the magnet and a second dimension across the first major surface of the magnet perpendicular to the first dimension defines a length of the magnet. The magnet also includes a second major surface distal from the substrate and parallel to the first major surface of the magnet. The magnet also includes a center axis perpendicular to the first and second major surfaces of the magnet and centered within the width and length of the magnet. The magnetic field sensor further comprises a first magnetic field sensing element disposed upon the first major surface or the second major surface of the substrate and configured to generate a magnetic field signal, wherein the first magnetic field sensing element comprises a center; wherein the center of the first magnetic field sensing element is substantially closer to a first end of the width dimension of the magnet than to the center axis of the magnet.

In accordance with another aspect, a magnetic field sensor for sensing motion of a ferromagnetic object comprises a substrate. The substrate includes a first major surface, wherein a first dimension across the first major surface of the substrate defines a width of the substrate and a second dimension across the first major surface of the substrate perpendicular to the first dimension defines a length of the substrate. The substrate also includes first and second substrate edges at ends of the width of the substrate. The substrate also includes a second major surface parallel to the first major surface. The magnetic field sensor further comprises a magnet. The magnet includes a first major surface proximate to the substrate, wherein a first dimension across the first major surface of the magnet defines a width of the magnet and a second dimension across the first major surface of the magnet perpendicular to the first dimension defines a length of the magnet. The magnet also includes a second major surface distal from the substrate and parallel to the first major surface of the magnet. The magnet also includes a center axis perpendicular to the first and second major surfaces of the magnet and centered within the width and length of the magnet. The magnetic field sensor further comprises a first magnetic field sensing element disposed upon the first major surface or the second major surface of the substrate and configured to generate a first magnetic field signal. The magnetic field sensor also includes a second magnetic field sensing element disposed upon the first major surface or the second major surface of the substrate and configured to generate a second magnetic field wherein a line passing through the first and second magnetic field sensing elements intersects the ferromagnetic object.

BRIEF DESCRIPTION OF THE DRAWINGS

The foregoing features of the invention, as well as the invention itself may be more fully understood from the following detailed description of the drawings, in which.

DETAILED DESCRIPTION

Figures 1, 1A:
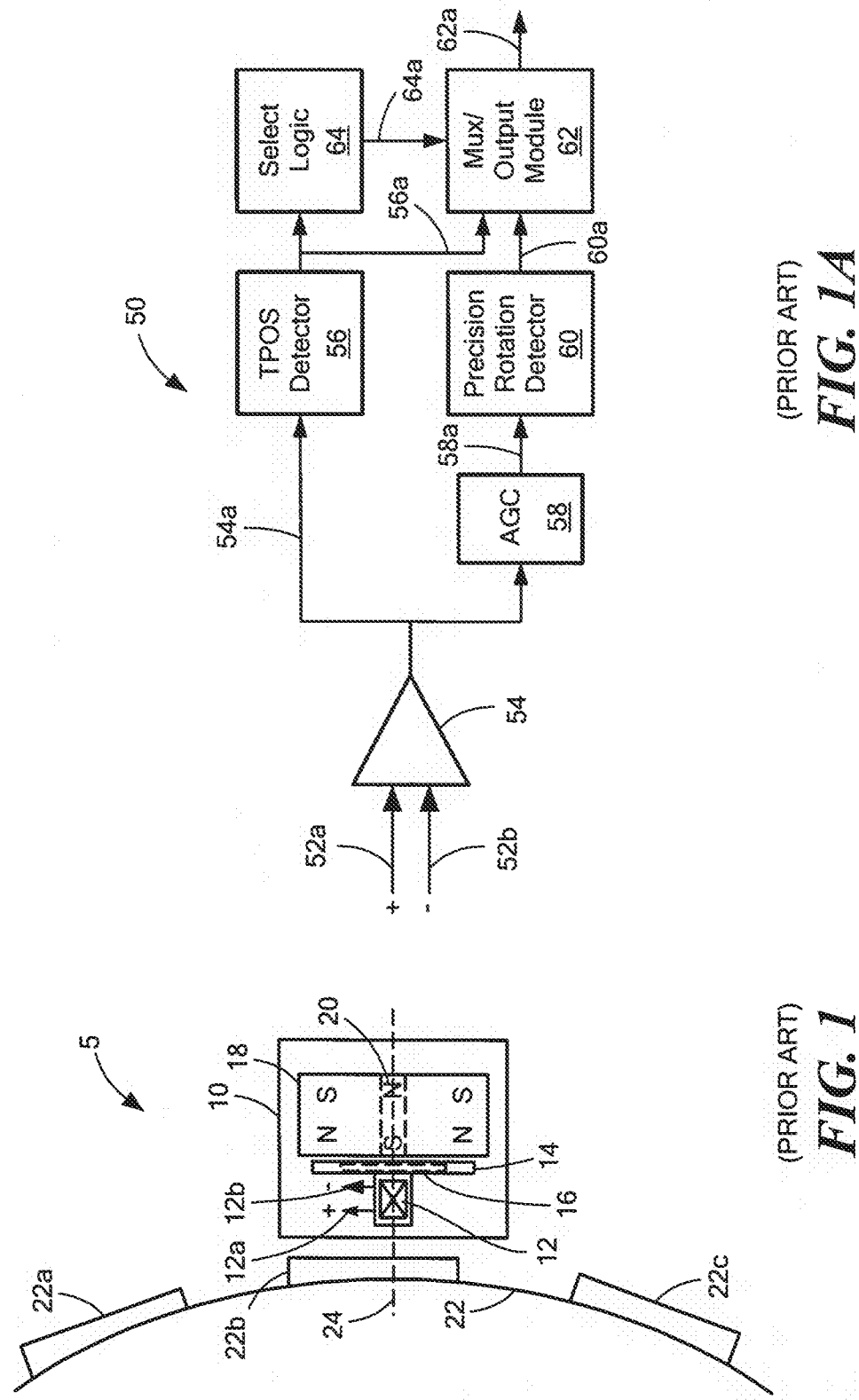
FIG. 1 is a block diagram of a conventional magnetic field sensor having a magnetic field sensing element, an electronic circuit, and a magnet.
FIG. 1A is a block diagram of an exemplary electronic circuit that can be used as the electronic circuit of FIG. 1.

Before describing the present invention, some introductory concepts and terminology are explained.

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a compound semiconductor material like Gallium-Arsenide (GaAs) or an Indium compound, e.g., Indium-Antimonide (InSb), or InGaA.

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet, and a magnetic field sensor that senses a magnetic field density of a magnetic field.

As used herein, the term "accuracy," when referring to a magnetic field sensor, is used to refer to a variety of aspects of the magnetic field sensor. These aspects include, but are not limited to, an ability of the magnetic field sensor to differentiate: a gear tooth from a gear valley (or, more generally, the presence of a ferromagnetic object from the absence of a ferromagnetic object) when the gear is not rotating and/or when the gear is rotating (or, more generally, when a ferromagnetic object is moving or not moving), an ability to differentiate an edge of a tooth of the gear from the tooth or the valley of the gear (or, more generally, the edge of a ferromagnetic object or a change in magnetization direction of a hard ferromagnetic object), and a rotational accuracy with which the edge of the gear tooth is identified (or, more generally, the positional accuracy with which an edge of a ferromagnetic object can be identified). Ultimately, accuracy refers to output signal edge placement accuracy and consistency with respect to gear tooth edges passing by the magnetic field sensor.

The terms "parallel" and "perpendicular" are used in various contexts herein. It should be understood that the terms parallel and perpendicular do not require exact perpendicularity or exact parallelism, but instead it is intended that normal manufacturing tolerances apply, which tolerances depend upon the context in which the terms are used. In some instances, the term "substantially" is used to modify the terms "parallel" or "perpendicular." In general, use of the term "substantially" reflects angles that are beyond manufacturing tolerances, for example, within +/−ten degrees.

It is desirable for magnetic field sensors to achieve a certain level or amount of accuracy even in the presence of variations in an air gap between the magnetic field sensor and the gear that may change from installation to installation or from time to time. It is also desirable for magnetic field sensors to achieve accuracy even in the presence of variations in relative positions of the magnet and the magnetic field sensing element within the magnetic field sensor. It is also desirable for magnetic field sensors to achieve accuracy even in the presence of unit-to-unit variations in the magnetic field generated by a magnet within the magnetic field sensors. It is also desirable for magnetic field sensors to achieve accuracy even in the presence of variations of an axial rotation of the magnetic field sensors relative to the gear. It is also desirable for magnetic field sensors to achieve accuracy even in the presence of temperature variations of the magnetic field sensors.

Examples below describe a particular gear as may be used upon an engine camshaft target object. However, similar circuits and techniques can be used with other cams or gears disposed upon the engine camshaft, or upon other rotating parts of an engine (e.g., crank shaft, transmission gear, anti-lock braking system (ABS)), or upon rotating parts of a device that is not an engine. Other applications may include linear translation sensors or other sensors where the target is not a rotating gear. The gear (or target) is not a part of the magnetic field sensors described below. The gear can have ferromagnetic gear teeth, which are generally soft ferromagnetic objects, but which can also be hard ferromagnetic objects, patterns, or domains which may or may not have actual physical changes in their shape.

Also, while examples are shown below of magnetic field sensors that can sense ferromagnetic gear teeth or gear teeth edges upon a gear configured to rotate, the magnetic field sensors can be used in other applications. The other applications include, but are not limited to, sensing ferromagnetic objects upon a structure configured to move linearly.

As used herein, the term "baseline" and the phrase "baseline level" are used to describe a lowest magnitude (which may be near zero or may be some other magnetic field) of a magnetic field experienced by a magnetic field sensing element within a magnetic field sensor when the magnetic field sensor is operating in a system. In some systems, this lowest magnetic field occurs when a magnetic field sensor is proximate to a gear valley as opposed to a gear tooth.

It will be understood that, in general, a difference between the baseline level and a higher level achieved, for example, when a gear tooth is proximate to a magnetic field sensor, is related to an ability of the magnetic field sensor to differentiate between a gear tooth and a valley, and thus, related to accuracy of the magnetic field sensor.

While it is described above that a baseline level is generated when a magnetic field sensor is proximate to a gear valley and a higher level is achieved when the magnetic field sensor is proximate to a gear tooth, other physical arrangements are also possible, for example, a reverse arrangement for which a baseline level is generated when a magnetic field sensor is proximate to a gear tooth and a higher level is achieved when the magnetic field sensor is proximate to a gear valley.

Referring to FIG. 1, an exemplary conventional magnetic field sensor 10 is responsive to a gear 22 having ferromagnetic gear teeth, e.g., gear teeth 22a, 22b, 22c. It should be recognized that the gear 22 is but one type of "target object" or simply "target" which the magnetic field sensor 10 can be responsive.

The magnetic field sensor 10 includes a magnetic field sensing element 12 coupled to an electronic circuit 16. The magnetic field sensing element 12 and the electronic circuit 16 can be disposed upon (i.e., integrated within or upon) a substrate 14. For clarity, here the magnetic field sensing element 12 is shown to be a Hall element with an exaggerated size, and rotated out of the plane of the substrate 14. Furthermore, for clarity, the Hall element 12 is shown to be on top of the substrate 14, but it will be appreciated that Hall elements are usually disposed upon or within a surface of a substrate of an integrated circuit.

The magnetic field sensor 10 can also include a magnet 18 (e.g. a permanent magnet or hard ferromagnetic material). The magnet 18 is configured to generate a magnetic field, which is generally directed along an axis 24 at the position of the magnetic field sensing element 12, and which is subject to direction and amplitude changes depending upon positions of the gear teeth 22a, 22b, 22c relative to the magnetic field sensor 10. However, the structure of the magnetic field at faces of the magnet 18 can be more complex due to a core 20.

The electronic circuit 16 is configured to generate an output signal (not shown). The output signal, when the gear is not moving, is indicative of whether the magnetic field sensor 10 is over a gear tooth or a gear valley. Thus, the magnetic field sensor 10 is sometimes referred to as a "tooth detector" as opposed to an "edge detector." The output signal, when the gear is rotating, has an edge rate or a frequency indicative of a speed of rotation of the gear. Edges or transitions of states of the output signal can be used to identify positions of edges of the gear teeth as they pass by the magnetic field sensor.

The magnet 18 can include the central core 20 comprised of a soft ferromagnetic material disposed within the magnet 18. An exemplary magnet with a core is described in U.S. Pat. No. 6,278,269, entitled "Magnet Structure," issued Aug. 21, 2001, which patent is assigned to the assignee of the present invention and incorporated herein by reference in its entirety. As described in U.S. Pat. No. 6,278,269, the pole configuration provided by the magnet 18 with the core 20 lowers the base field (or baseline) of a flux density of the magnetic field at some points above the surface of the core 20 (e.g., to the left of the core as shown) when a valley of the gear 22 is proximate to the magnetic field sensor 10. A predetermined baseline (e.g., within a range of about +/six hundred Gauss) at the magnetic field sensing element 12, and a resulting differential magnetic field signal 12a, 12b (i.e., an analog differential proximity signal) near zero, can be achieved with proper design.

In contrast, when a gear tooth of the gear 22 is proximate to the magnetic field sensing element 12, the magnetic field sensing element 12 experiences a higher magnetic field and generates the differential magnetic field signal 12a, 12b with a higher value. As described above, a difference between the baseline magnetic field and the higher magnetic field is related to ultimate accuracy of the magnetic field sensor 10.

The baseline magnetic field, which can occur when the magnetic field sensor 10 is proximate to a valley in the gear 22, remains relatively low, with little change, even as the air gap between the gear 22 and the magnetic field sensor 10 varies. This advantageous result of low baseline substantially independent of air gap is achieved by operation of the core 20, which results in opposite magnetic poles being presented at the face of the core 20 (i.e., left side as shown) proximate to the magnetic field sensing element 12, particularly when the magnetic field sensing element 12 is proximate to a valley in the gear 22. This effect is also described in U.S. Pat. No. 5,781,005, issued Jul. 14, 1998, entitled "Hall-Effect Ferromagnetic-Article-Proximity Sensor,"

which patent is assigned to the assignee of the present invention and incorporated herein by reference in its entirety.

The above-described low baseline, which occurs when the magnetic field sensor is proximate to a gear valley, results in an enhanced ability of the electronic circuit 16 to differentiate the presence of the gear tooth from a gear valley.

The above-described low baseline also provides an ability to more easily compensate for temperature effects, since the baseline magnetic field is relatively small, and therefore, circuit variations that occur due to temperature can have less influence when the magnetic field sensor 10 is proximate to a valley in the gear 22. Essentially, any error in the circuitry is able to be well corrected near the baseline magnetic field level or range, since any multiplication of the error (near zero) is smaller. Therefore, a magnetic field threshold used to distinguish a tooth from a valley can be made smaller while maintaining precision because there is less noise or error in the system over its operating conditions such as temperature, or humidity.

The magnetic field described above and provided by the magnet 18 with the core 20 results in an improved accuracy of the magnetic field sensor 10. For example, the low baseline allows the magnetic field sensing element 12 to be somewhat statically misaligned from a center of the magnet 18, as will occur due to unit-to-unit variations of mechanical alignments, without sacrificing accuracy of the magnetic field sensor 10. Accuracy is discussed above.

Referring now to FIG. 1A, an exemplary conventional electronic circuit 50 can be the same as or similar to electronic circuit 16 of FIG. 1. The electronic circuit 50 can include in amplifier 54 coupled to receive a differential signal 52a, 52b, which can be the same as or similar to the differential signal 12a, 12b generated by the magnetic field sensing element 12 of FIG. 1. The amplifier 54 is configured to generate an amplified signal 54a, which, in some embodiments, can split into two channels, a TPOS detector channel and a precision rotation detector channel.

In the true power on state (TPOS) channel, a TPOS detector 56 can be coupled to receive the amplified signal 54a and configured to generate a TPOS output signal 56a. In some embodiments, the TPOS detector 56 can include a comparator (not shown) configured to compare the amplified signal 54a with a fixed (and trimmed) threshold. In these embodiments, the TPOS output signal 56a can be a two-state binary signal for which a high state is indicative of a gear tooth being proximate to the magnetic field sensor 10 of FIG. 1 and a low state is indicative of a gear valley being proximate to the magnetic field sensor 10, or vice versa.

In the precision rotation detector channel, an automatic gain control (AGC) 58 can be coupled to receive the amplified signal 54a and configured to generate a gain controlled signal 58a. A precision rotation detector 60 can be coupled to receive the gain controlled signal 58a and configured to generate a precision rotation detector output signal 60a. Like the TPOS output signal 56a, the precision rotation detector output signal 60a can be a two-state binary signal for which a high state is indicative of a gear tooth being proximate to the magnetic field sensor 10 of FIG. 1 and a low state is indicative of a gear valley being proximate to the magnetic field sensor 10, or vice versa. Thus, both the TPOS detector 56 and the precision rotation detector 60 can be "tooth detectors." However, it should be understood that the precision rotation detector channel uses the AGC 58, which, when the gear 22 is not rotating, will settle to an undesirable gain, resulting, once the gear 22 starts to rotate, in a period of time during which the gain is incorrect and the precision rotation detector is not fully accurate. Even if the AGC 58 were not used, still the precision rotation detector 60 uses internal thresholds that are properly updated only when the gear 22 is rotating. However, in other embodiments, the threshold can be supplied from outside of the electronic circuit 50.

In some alternate embodiments, the precision rotation detector 60 can be an "edge detector," which is unable to identify whether the magnetic field sensor 102 is proximate to a gear tooth or a gear valley, particularly when the gear is not moving, but which is able to sense edges of gear teeth as they move past the magnetic field sensor 350.

Precision rotation detectors, e.g., the precision rotation detector 60, can have a variety of configurations. Some configurations are described in the above mentioned U.S. Pat. No. 6,525,531. However, other forms of precision rotation detectors are also known, including some that have two or more magnetic field sensing elements.

In general, from discussion above, it will be appreciated that the TPOS output signal 56a is indicative of whether the magnetic field sensing element 12 is proximate to a gear tooth or a gear valley, even when the gear, e.g., the gear 22 of FIG. 1, is stationary. However, since the TPOS detector 56 uses a fixed threshold, in some embodiments, having limited adjustment at power up, variations in the edge placement in the TPOS output signal 56a will occur due to a variety of factors, including, but not limited to, temperature variations, and variations in the air gap between the magnetic field sensing element 12 and the gear 22.

Unlike the TPOS detector 56, which uses fixed thresholds, the precision rotation detector 60 continually makes adjustments of thresholds to provide the precision rotation detector output signal 60a with better accuracy of edge placements of the precision rotation detector output signal 60a relative to physical positions of gear teeth. As described above, in part, it is these adjustments that make the precision rotation detector less accurate when it is first powered up or when the gear 22 first starts to rotate.

In some embodiments for which the TPOS detector and the precision rotation detector 60 are integrated onto a common substrate, a multiplexer/output module 62 can be coupled to receive the TPOS output signal 56a and coupled to receive the precision rotation detector output signal 60a. Select logic 64 can provide a selection signal 64a, received by the multiplexer/output module 62. Depending upon the state of the selection signal 64a, the multiplexer/output module 62 is configured to generate an output signal 62a representative of a selected one of the TPOS output signal 56a or the precision rotation detector output signal 60a. The output signal 62a can be provided in a variety of signal formats, including, but not limited to, a SENT format, an I$^2$C format, a PWM format, or a two-state format native to the TPOS output signal 56a and to the precision rotation detector output signal 60a.

In some exemplary embodiments, the select logic 64 selects the output signal 62a to be representative of the TPOS output signal 56a for a predetermined amount of time after the gear 22 starts rotating as indicated by the TPOS output signal 56a. Thereafter, the select logic 64 selects the output signal 62a to be representative of the precision rotation detector output signal 60a.

Figure 2:
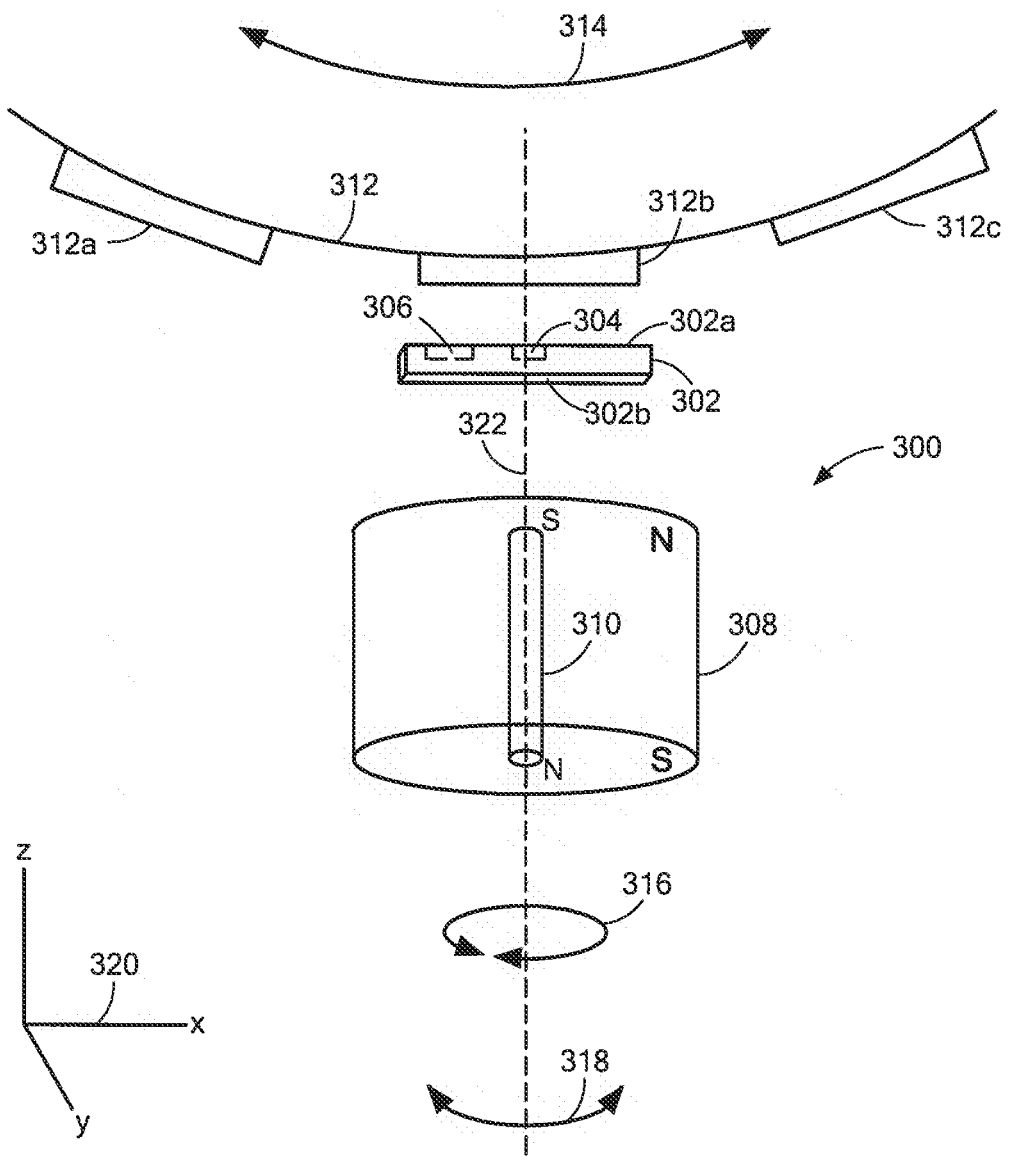
FIG. 2 is another block diagram of the magnetic field sensor of FIG. 1.

Referring now to FIG. 2, another exemplary conventional magnetic field sensor 300 is like the magnetic field sensor 10 of FIG. 1. The magnetic field sensor 300 includes a magnetic field sensing element 304 disposed on or in a substrate 302 along with an electronic circuit 306. A cylindrical magnet 308 having a core 310 is disposed proximate to and axially aligned with the magnetic field sensing element 304 along an axis 322 passing through an axis of the cylindrical magnet 308.

The substrate 302 can be the same as or similar to the substrate 14 of FIG. 1, the magnetic field sensing element 304 can be the same as or similar to the magnetic field sensing element 12 of FIG. 1, the electronic circuit 306 can be the same as or similar to the electronic circuit 16 of FIG. 1, the magnet 308 can be the same as or similar to the magnet 18 of FIG. 1, and the core 310 can be the same as or similar to the core 20 of FIG. 1. A gear 312 having gear teeth 312a, 312b, 312c can be the same as or similar to the gear 22 of FIG. 1, which has gear teeth 22a, 22b, 22c. It should be noted that the spacing or height or depth of the gear teeth may be wider or smaller than shown here and in figures described below.

The magnetic field sensing element 304 is generally aligned with the center of the core 310. The target or soft ferromagnetic teeth of the gear 312 are centered with the axis 322 of the magnet 308, and not offset other than by the manufacturing tolerances required to meet the desired performance.

It will be understood that the magnet 308 having the core 310 is expensive compared to a simple uniform magnet.

The magnetic field sensor 300 can rotate though a number of degrees, for example, through +/−one hundred eighty degrees (i.e., through three hundred sixty degrees), about the axis 322 as represented by an arrow 316 without loss of accuracy, with minimal loss or accuracy, or with a loss of accuracy acceptable for an application in which the magnetic field sensor 300 is used. The magnetic field sensor 300 can also rotate though a number of degrees, for example, through +/−twenty degrees, in a direction of an arrow 318, i.e., about a y-axis in an x-z plane of orthogonal axes 320, with a center of rotation at the magnetic field sensing element 304, with minimal performance variation.

Figure 3:
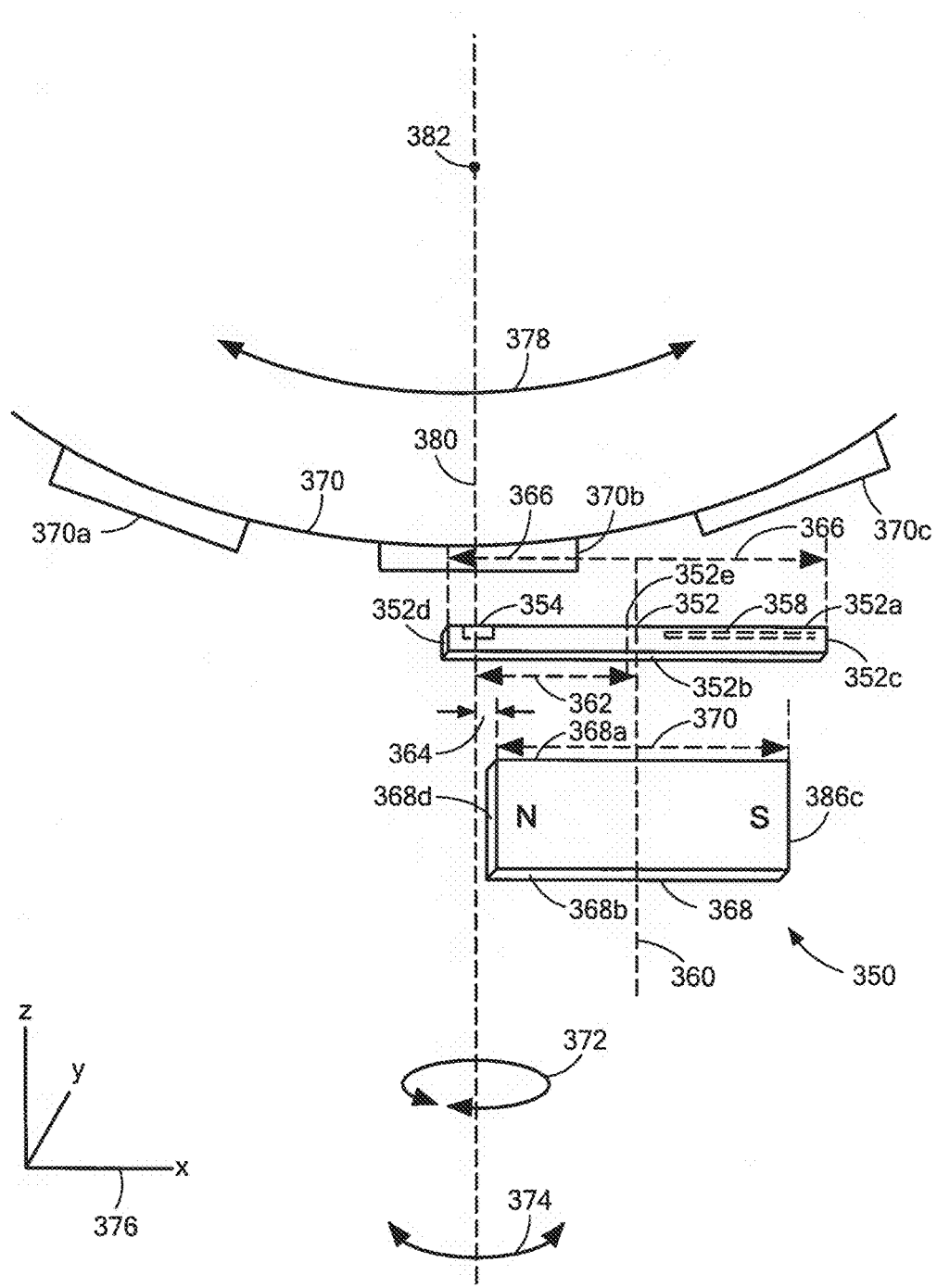
FIG. 3 is a block diagram of a magnetic field sensor having a magnetic field sensing element, an electronic circuit, and a magnet, the magnetic field sensor located proximate to a gear.

Referring now to FIG. 3, a magnetic field sensor 350 includes a substrate 352. The substrate 352 has a first major surface 352a. A first dimension 366 across the first major surface 352a of the substrate 352 defines a width of the substrate 352 and a second dimension (not shown, into the page) across the first major surface 352a of the substrate 352 perpendicular to the first dimension 366 defines a length of the substrate 352. A second major surface 352b is parallel, or parallel within manufacturing and assembly tolerances, to the first major surface 352a. The substrate has first and second substrate edges 352c, 352d, respectively, at ends of the width of the substrate 352. The substrate 352 has a center axis 352e perpendicular to the first and second major surfaces 352a, 352b, respectively, of the substrate 352 and centered within the width and length of the substrate 352.

As used herein as above in reference to the substrate 352, the word "edge' refers essentially to a relatively small surface.

While a leadframe and leads are not shown here or in figures below, in some embodiments, the substrate 352 here, and also substrates shown in figures below, are disposed upon a number of lead fingers of a leadframe in a flip-chip arrangement, in which an active surface of the substrate is disposed toward the leadframe. However, in other embodiments, the active surface of the substrate is disposed away from the leadframe which may include a base plate to support the die, while in other embodiments the die is placed across multiple die attach areas of the leadframe, and the die or substrate may be attached to the leadframe using standard packaging techniques, which include, but are not limited to, epoxy die attach (either conductive or non-conductive depending on the requirements), or die attach tape, and using wire bonding.

The magnetic field sensor 350 also includes a magnet 368, which has a first major surface 368a proximate to the substrate 352. A first dimension 370 across the first major surface 368a of the magnet 368 defines a width of the magnet and a second dimension (not shown, into the page) across the first major surface 368a of the magnet 368 perpendicular to the first dimension 370 defines a length of the magnet 368. The magnet 368 has a second major surface 368b distal from the substrate 352 and parallel to the first major surface 368a of the magnet 368. The magnet 368 has third and fourth major opposing surfaces 368c, 368d, respectively, at ends of the width of the magnet 368. The magnet 368 has a center axis 360, a geometric axis, perpendicular to the first and second major surfaces 368a, 368b of the magnet 368 and centered within the width and length of the magnet 368.

The magnet can have a north pole, N, at the fourth major surface 368d and a south pole, S, at the third major surface 368c.

The magnetic field sensor 350 also includes a magnetic field sensing element 354 disposed upon or within the first major surface 352a or the second major surface 352b of the substrate 352. The magnetic field sensing element 354 is configured to generate a so-called "magnetic field signal" (an electronic signal).

The magnetic field sensing element 354 includes a center upon the first major surface 352a or the second major surface 352b of the substrate 352 and a center axis 380 generally parallel to the center axis 360 of the magnet. The center axis 380 of the magnetic field sensing element 354 is substantially closer to the fourth major surface 368d of the magnet 368 than to the center axis 360 of the magnet 368. In other words, a dimension 364 is substantially smaller than a dimension 362.

In one particular embodiment as shown, the center axis 380 of the magnetic field sensing element 354 is at or beyond the width of the magnet 368, the width of the magnet 368 defined by the dimension line 370. In these embodiments, a distance between the center axis 360 of the magnet 368 and the center axis 380 of the magnetic field sensing element 354 is greater than or equal to a distance from the center axis 360 of the magnet 380 to one of the third or fourth surfaces 368c, 368d of the magnet 368.

However, in other embodiments, the center axis 380 of the magnetic field sensing element 354 is within the width of the magnet 368 but still such that the center axis 380 of the magnetic field sensing element 354 is substantially closer to one of the third or fourth surfaces 368c, 368d of the magnet 368 than to the center axis 360 of the magnet 368.

The magnetic field sensor 350 can include an electronic circuit 358 disposed on or in the substrate 352. While the magnetic field sensing element 354 is shown to be on the same side of the substrate 352 as the electronic circuit, in some other embodiments, the electronic circuit 358 is on the opposite side of the substrate 352 as the magnetic field sensing element 354. One way to achieve the electronic circuit 352 and the magnetic field sensing element 354 on opposite sides of the substrate 352 would be to use through silicon vias (TSVs) or other through via techniques. In other embodiments, the magnetic field sensor 350 can employ a multi-chip structure having a flip chip on die arrangement, or die on die arrangement with wire bonding for which the electronic circuit 358 can be on one substrate and the magnetic field sensing element 354 can be on another substrate. The same applies to other arrangements described in figures below.

It is shown that the center axis 352e of the substrate 352 is slightly offset from the center axis 360 of the magnet 368. This offset is shown merely for clarity, and, in some embodiments, the center axis 352e of the substrate 352 is aligned with the center axis 360 of the magnet 368. However, embodiments for which the center axes 352e, 360 do not align are also possible.

In some embodiments, as shown, the center axis 360 of the magnet 368 and the center axis 352e of the substrate 352 intersect the gear 370, but do not intersect a center of rotation 382 of the gear 370. Instead, the magnetic field sensor 350 can be offset along an x-axis of orthogonal rectangular coordinates 376 such that the center axis 380 of the magnetic field sensing element 354 intersects the center of rotation 382 of the gear 370. However, in other embodiments, the center axis 380 of the magnetic field sensing element 354 does not intersect the center of rotation 382 of the gear 370, but still the magnetic field or magnetic flux changes enough by the rotation of the target or gear 370 that gear teeth and valleys may be detected by the magnetic field sensor 350.

It will be appreciated that the magnet 368 can be comprised of a hard ferromagnetic material. Unlike the conventional magnet 308 of FIG. 2, in some embodiments, the magnet 368 can be comprised of one uniform material, and can have no central core. Lacking the central core 20 of FIG. 1, the magnet 368 can be less expensive than the magnet 18 of FIG. 1 or the magnet 308 of FIG. 2. In some embodiments, the magnet 368 is a molded part formed, for example, as a mixture of a polymer and magnetic (i.e., hard ferromagnetic) particles.

Illustrative hard ferromagnetic materials that can be used as magnetic particles within the ferromagnetic mold material include, but are not limited to, hard ferromagnetic ferrites, SmCo alloys, and NdFeB alloy materials. Also, Plastiform® materials by Arnold Magnetic Technologies Corp. or other plastic compounds with hard ferromagnetic particles, for example a thermoset polymer such as polyphenylene sulfide material (PPS) or nylon material containing SmCo, NdFeB, or hard ferromagnetic ferrite magnetic particles; or a thermoset polymer such as SUMIKON® EME of Sumitomo Bakelite Co., Ltd or similar type of thermoset mold material containing hard ferromagnetic particles can be used. In some embodiments it may be desirable to align the hard ferromagnetic particles during molding to form a more isotropic or directional permanent magnetic material by molding in the presence of a magnetic field; whereas, in other embodiments, a sufficient magnet may result without an alignment step during molding. It will be appreciated that an NdFeB or a SmCo alloy may contain other elements to improve temperature performance, magnetic coercively, or other magnetic properties useful to a magnetic design.

In some other embodiments, the magnet 368 has a core or concentrator comprised of a soft ferromagnetic material like the core 310 and the magnet 308 of FIG. 2. However, it should be apparent that the magnet without a core leads to a lower cost magnetic field sensor. In some embodiments, the magnet 368 is rectangular, and in other embodiments, the magnet 368 is cylindrical. In some other embodiments, the magnet 368 has another shape, for example, square, oral, or oblong. Other shapes not listed herein are also possible.

In some alternate embodiments, the magnet 368 (and other similar magnets described in figures below) can include a sheet of soft ferromagnetic material on one side of the magnet 368, for example, side 368c.

The magnetic field sensing element 354 is shown to be disposed within the substrate, which may be indicative of a Hall element. However, the magnetic field sensing element 354 can be any type of magnetic field sensing element. In some embodiments, the magnetic field sensing element 354 comprises a Hall element, for example, a planar Hall element or a vertical Hall element. In some embodiments, the magnetic field sensing 354 element comprises a magnetoresistance element of a type described above, or a plurality of magnetoresistance elements coupled in a bridge arrangement.

In some embodiments, a major axis of sensitivity of the magnetic field sensing element 352 is parallel to the first surface 352a of the substrate 352 and parallel to the width dimension 366 of the substrate 352. In other embodiments, the major axis of sensitivity of the magnetic field sensing element 354 is perpendicular to the first surface 352a of the substrate 352.

It will be understood that different types of magnetic field sensing elements may be used in or for different applications. The type of magnetic field sensing element can be selected based upon the magnetic field levels to be sensed or present in the operating environment, the geometry of the gear or target to be sensed, as well as the changes in magnetic field to be sensed. For example, giant magnetoresistance (GMR) elements tend to have higher sensitivities to magnetic fields than Hall elements. A higher sensitivity magnetic field sensing element, such as an AMR, GMR, or a spin-valve, may be preferred for sensing lower magnetic field levels present in geometries where air gaps, i.e., distances between the target and the magnetic field sensor are large.

In some embodiments, a combination of two or more different types of sensing elements may be used on the same magnetic field sensor at the position of element 354, or integrated circuit, for example, but not limited to, a vertical Hall element and a GMR element having different sensitivities, or two planar Hall elements with different sensitivities, integrated on the same substrate. The two different sensitivities can be used to result in a magnetic field sensor that has two different operating ranges.

It will be understood that circuits that use two magnetic field sensing elements can be similar to the electronic circuit 50 of FIG. 1, but having two different selectable input amplifiers. In another embodiment a single input amplifier may be used and a set of switches can input the signals from one of the two selected sensing elements at a time. In such an embodiment the input amplifier may have a variable gain selectable based on the state of the switches between the sensing elements and the input amplifier.

Hysteresis of some types of magnetic field sensing elements can make them less desirable for a particular application. Cost is also a consideration, since some types of magnetic field sensing elements may require specialized processing. It also may be possible to utilize a multi-chip approach.

As described above, the magnet 368 can have a north pole, N, at the fourth surface 368d and a south pole, S, at the third surface 368c, a line between which is parallel to the first major surface 352a of the substrate 352. With this particular arrangement, magnetic flux (or field) lines pass through the third and fourth surfaces 368c, 368d of the magnet 368 in a direction generally perpendicular to the surfaces 368c, 368d. When the magnetic field sensing element 354 is proximate to a valley in the gear 370, the magnetic flux lines pass through the magnetic field sensing element 354 in a direction generally perpendicular to, but, depending on the exact relative positions of the magnetic field sensing element 354, the magnet 368, and the gear 370, possibly at another angle relative to the surface 352a of the substrate 352. In operation, the angle of the magnetic field relative to the surface 352a of the substrate 352, as well as a magnitude of the magnetic field, change as gear teeth and valleys pass by the magnetic field sensor 350 as the gear 370 rotates.

For embodiments in which the major response axis of the magnetic field sensing element 354 is perpendicular to the first surface 352a of the substrate 352, e.g., for a planar Hall element, when the magnetic field sensing element 354 is proximate to a valley in the gear 370, the magnetic field passing through the magnetic field sensing element 354 is at a first angle, which is between parallel and perpendicular to the major axis of sensitivity of the magnetic field sensing element 354, the magnetic field has a first magnitude, and an output signal from the magnetic field sensing element 354 has a first amplitude. However, when the magnetic field sensing element 354 is proximate to a gear tooth, the magnetic field passing through the magnetic field sensing element 354 is redirected by the gear tooth to be at a second different angle, which is also between parallel and perpendicular to the major response axis of the magnetic field sensing element 354, and/or to have a second different magnitude, and an output signal from the magnetic field sensing element 354 has a second different amplitude.

In a first non-limiting example, when the magnetic field sensing element 354 is proximate to a valley in the gear 370, a magnetic field signal generated by the magnetic field sensing element 354 is lower than when a gear tooth of the gear 370 is near the magnetic field sensing element 354, due to a larger angle of the magnetic flux between a flux vector and the major response axis of the magnetic field sensing element 354 (planar Hall type of element in the example). Thus the magnetic field is more aligned with the major response axis when the tooth is close and this results in a larger magnetic field signal. The magnetic field sensor 350 forms a tooth detector.

It should be apparent that the relative positions of the magnetic sensing element 354, the magnet 368, and the gear 370 can change the angle of the magnetic flux (field) lines and/or the magnitude of the magnetic field passing through the magnetic field sensing element 354. Thus, in a second non-limiting example, at some relative positions, the above-described lower magnetic field signal generated by the magnetic field sensing element 354 when proximate to a valley in the gear 354 may instead be lower when the magnetic field sensing element 354 is proximate to a tooth It should be recognized that all embodiments that result in a measurable change in magnetic field strength at the magnetic field sensing element 354 for gear valleys versus gear teeth are encompassed by arrangements described herein.

For embodiments in which the major response axis of the magnetic field sensing element 354 is parallel to the first surface 352a of the substrate 352, e.g., for a GMR magnetoresistance element, signal polarity may be reversed from that described above.

It should be apparent that the selection of the type of magnetic field sensing element, e.g., direction of the axis of sensitivity, will influence the baseline level for a particular application or design.

The magnetic field sensor 350, and the simple magnet 368 having no core in particular, typically provide a higher (and therefore, less desirable) magnetic field baseline level (e.g., when the magnetic field sensor 350 is proximate to a valley (or tooth) in the gear 370) than the baseline levels described above in conjunction with FIGS. 1 and 2, for which a magnet with a core is used. However, the overall change in magnetic field direction and magnitude at the position of the magnetic field sensing element 354 is sufficient as gear teeth and valleys pass by for the magnetic field sensor 350 to determine the state of the target as a tooth or a valley. Thus, the magnetic field sensor 350 still provides a good discrimination of gear teeth from gear valleys.

The electronic circuit 358 can be the same as or similar to the electronic circuit 50 of FIG. 1A.

Particularly for gear teeth that are wide in x and y directions, the magnetic field sensor 350 can rotate though a number of degrees, for example, through +/−one hundred eighty degrees (i.e., through three hundred sixty degrees), about the center axis 380 of the magnetic field sensing element 354 as represented by an arrow 372. The rotation results in minimal performance variation. The magnetic field sensor 350 can also rotate though a number of degrees, for example, through +/−twenty degrees, in a direction of an arrow 374, i.e., about a y-axis in an x-z plane of orthogonal axes 376, with a center of rotation at the magnetic field sensing element 354, with minimal performance variation.

Figure 3A:
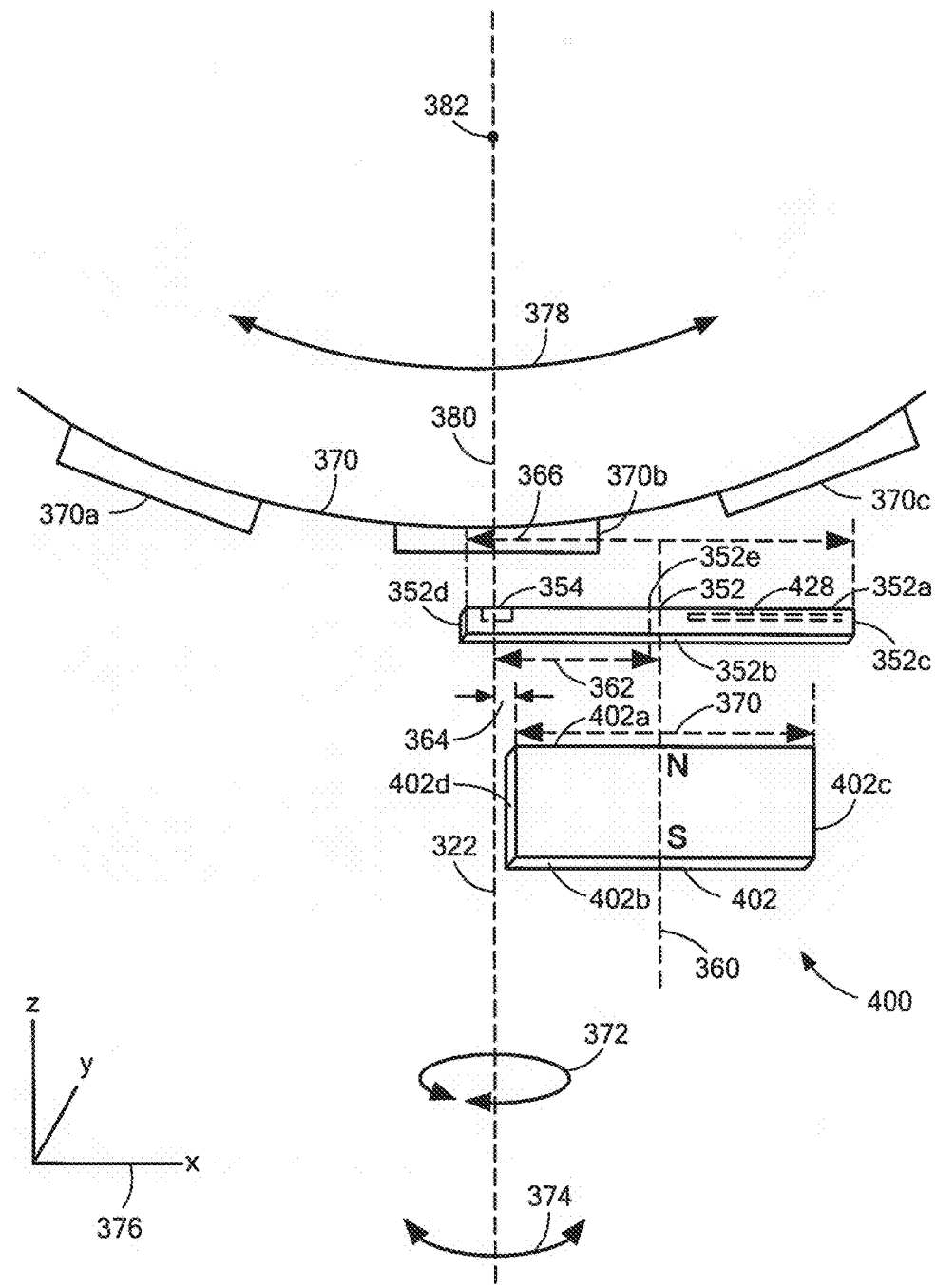
FIG. 3A is a block diagram of another magnetic field sensor having a magnetic field sensing element, an electronic circuit, and a magnet, the magnetic field sensor located proximate to a gear.

Referring now to FIG. 3A, in which like elements of FIG. 3 are shown having like reference designations, a magnetic field sensor 400 is like the magnetic field sensor 350 of FIG. 3, except that a magnet 402 replaces the magnet 368 of FIG. 3. The magnet 402 has a first major surface 402a proximate to the substrate 352. The first dimension 370 across the first major surface 402a of the magnet 402 defines a width of the magnet 402 and the second dimension (not shown, into the page) across the first major surface 402a of the magnet 402 perpendicular to the first dimension defines a length of the magnet 402. The magnet 402 also has a second major surface 402b distal from the substrate 352 and substantially parallel to the first major surface 402a of the magnet 402. The magnet 402 has third and fourth major surfaces 402c, 402d, respectively, at ends of the width of the magnet 402. The magnet 402 has the center axis 360, a geometric axis, perpendicular to the first and second major surfaces 402a, 402b of the magnet 402 and centered within the width and length of the magnet 402.

Unlike the magnet 368 of FIG. 3, the magnet 402 has a north pole, N, at the first surface 402a, and a south pole, S, at the second surface 402b, a line between which is perpendicular to the first major surface 352a of the substrate 352. With this particular arrangement, magnetic flux lines pass through the first and second surfaces 402a, 402b of the magnet 402 in a direction generally perpendicular to the surfaces 402a, 402b. Like the magnetic field sensor 350 of FIG. 3, when the magnetic field sensing element 354 is proximate to a gear valley, the magnetic flux lines pass through the magnetic field sensing element 354 in a direction generally perpendicular to, but, possibly at another angle relative to, the surface 352a of the substrate 352. In operation, the angle of the magnetic field, as well as a magnitude of the magnetic field, change as gear teeth and valleys pass by the magnetic field sensor 400 as the gear 370 rotates.

As described above in conjunction with FIG. 3, relative positions of the magnetic field sensing element 354, the magnet 402, and the gear 370 can influence the angle of the magnetic flux lines passing through the magnetic field sensing element 354 and/or the magnitude of the magnetic field passing through the magnetic field sensing element 354. Thus, as described above in first and second non-limiting examples described in conjunction with FIG. 3, depending upon relative positions, a valley in the gear 370 being proximate to the magnetic field sensing element 354 can result in a smaller magnetic field signal generated by the magnetic field sensing element 354, or a tooth of the gear 370 being proximate to the magnetic field sensing element 354 can result in a smaller magnetic field signal being generated by the magnetic field sensing elements 354. The magnetic field sensor 400 forms a tooth detector.

As described above in conjunction with FIG. 3, the magnetic field sensing element 354 includes the center upon the first major surface 352a or the second major surface 352b of the substrate 352 and the center axis 380 generally parallel to the center axis 360 of the magnet 402 The center axis 380 of the magnetic field sensing element 354 is substantially closer to the fourth major surface 402d of the magnet 402 than to the center axis 360 of the magnet 402. In other words, a dimension 364 is substantially smaller than a dimension 362.

Various arrangements of magnetic field sensors are shown below in conjunction with FIGS. 3B and 3C. In each of these various arrangements, a magnet is shown having the orientation of that shown in conjunction with FIG. 3. It should be appreciated that, in alternate embodiments (not shown), embodiments like those shown below in FIGS. 3B and 3C can instead have a magnet with an orientation of poles such as the magnet 402 shown in conjunction with FIG. 3A.

Figure 3B:
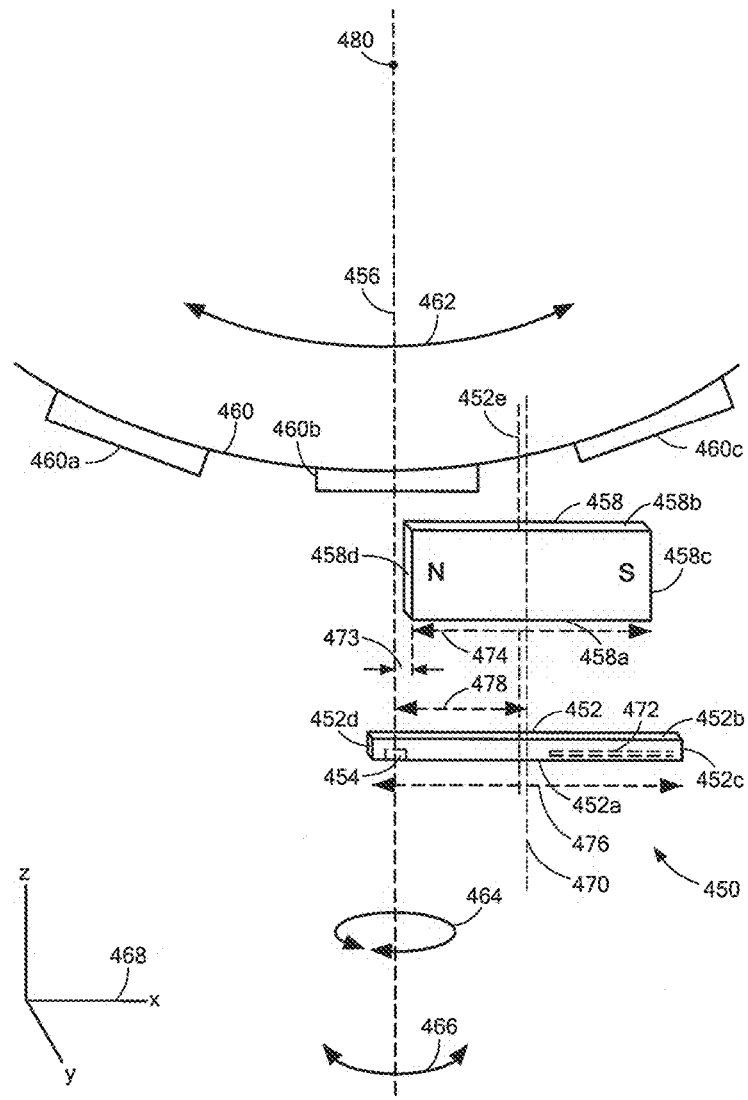
FIG. 3B is a block diagram of another magnetic field sensor having a magnetic field sensing element, an electronic circuit, and a magnet, the magnetic field sensor located proximate to a gear.

Referring now to FIG. 3B, a magnetic field sensor 450 includes a substrate 452. The substrate 452 has a first major surface 452a. A first dimension 476 across the first major surface 452a of the substrate 452 defines a width of the substrate 452 and a second dimension (not shown, into the page) across the first major surface 452a of the substrate 452 perpendicular to the first dimension 476 defines a length of the substrate 452. The substrate has first and second substrate edges 452c, 452d, respectively, at ends of the width of the substrate 452. A second major surface 452b of the substrate 452 is parallel to the first major surface 452a. The substrate 452 has a center axis 452e, a geometric axis, perpendicular to the first and second major surfaces 452a, 452b, respectively, of the substrate 452 and centered within the width and length of the substrate 452.

The magnetic field sensor 450 also includes a magnet 458, which has a first major surface 458a proximate to the substrate 452. A first dimension 474 across the first major surface 458a of the magnet 458 defines a width of the magnet and a second dimension (not shown, into the page) across the first major surface 458a of the magnet 458 perpendicular to the first dimension defines a length of the magnet 458. The magnet 458 has a second major surface 458b distal from the substrate 452 and substantially parallel to the first major surface 458a of the magnet 458. The magnet 458 has third and fourth major opposing surface 458c, 458d, respectively, at ends of the width of the magnet 458. The magnet 458 has a center axis 470, a geometric axis, perpendicular to the first and second major surfaces 458a, 458b of the magnet 458 and centered within the width and length of the magnet 458.

The magnetic field sensor 450 also includes a magnetic field sensing element 454 disposed upon or within the first major surface 452a or the second major surface 452b of the substrate 452. The magnetic field sensing element 454 is configured to generate a magnetic field signal (an electronic signal).

The magnetic field sensing element 454 includes a center upon the first major surface 452a or the second major surface 452b of the substrate 452 and a center axis 456 generally parallel to the center axis 470 of the magnet 458. The center axis 456 of the magnetic field sensing element 454 is substantially closer to the fourth surface 458d of the magnet 458 than to the center axis 470 of the magnet 458. In other words, a dimension 473 is substantially smaller than a dimension 478.

In one particular embodiment as shown, the center axis 456 of the magnetic field sensing element 454 is at or beyond the width of the magnet 458, the width of the magnet 458 defined by the dimension line 474. In these embodiments, a distance between the center axis 470 of the magnet 458 and the center axis 456 of the magnetic field sensing element 454 is greater than or equal to a distance from the center axis 470 of the magnet 458 to one of the third or fourth surface 458c, 458d of the magnet 458.

However, in other embodiments, the magnetic field sensing element 454 is within the width 470 of the magnet 458 but still such that the center axis 456 of the magnetic field sensing element 454 is substantially closer to one of the third or fourth surfaces 458c, 458d of the magnet 458 than to the center axis 470 of the magnet 458.

The magnetic field sensor 450 can include an electronic circuit 472 disposed on the substrate 452. The electronic circuit 472 can be the same as or similar to the electronic circuit 50 of FIG. 1A It is shown that the center axis 452e of the substrate 452 is slightly offset from the center axis 470 of the magnet 458. This offset is shown merely for clarity, and, in some embodiments, the center axis 452e of the substrate 452 is aligned with the center axis 470 of the magnet 458. However, embodiments for which the center axes 452e, 470 do not align are also possible.

In some embodiments, as shown, the center axis 470 of the magnet 458 and the center axis 452e of the substrate 452 intersect a gear 460, but do not intersect a center of rotation 480 of the gear 460. Instead, the magnetic field sensor 450 can be offset along an x-axis of orthogonal rectangular coordinates 468 such that the center axis 456 of the magnetic field sensing element 454 intersects the center of rotation 480 of the gear 460. In other embodiments, the center axis 456 of the magnetic field sensing element 454 does not intersect the center of rotation 480 of the gear 460.

It will be appreciated that the magnet 458 can be comprised of a hard ferromagnetic material. Unlike the conventional magnet 308 of FIG. 2, in some embodiments, the magnet 458 can be comprised of a single uniform material and can have no central core. Lacking the central core 20 of FIG. 1, the magnet 458 can be less expensive than the magnet 18 of FIG. 1 or the magnet 308 of FIG. 2. In some embodiments, the magnet 458 is a molded part formed, for example, as a mixture of a polymer and magnetic (i.e., hard ferromagnetic) particles. Molded magnets having magnetic particles are described above in conjunction with FIG. 3.

In some other embodiments, the magnet 458 has a core comprised of a different material like the magnet 308 of FIG. 2.

In some embodiments, the magnetic field sensing element 454 comprises a Hall element, for example, a planar Hall element or a vertical Hall element. In some embodiments, the magnetic field sensing element 454 comprises a magnetoresistance element of a type described above, or a plurality of magnetoresistance elements coupled in a bridge arrangement In some embodiments, a major axis of sensitivity of the magnetic field sensing element 454 is parallel to the first surface 452a of the substrate 454 and parallel to the width dimension 476 of the substrate 452. In other embodiments, the major axis of sensitivity of the magnetic field sensing element 454 is perpendicular to the first surface 452*a* of the substrate 452.

As described above, the magnet 458 can have a north pole, N, at the fourth surface 458*d*, and a south pole, S, at the third surface 458*c*, a line between which is parallel to the first major surface 452*a* of the substrate 452. With this particular arrangement, magnetic field lines pass through the third and fourth surfaces 458*c*, 458*d* of the magnet 458 in a direction generally perpendicular to the surfaces 458*c*, 458*d*. When the magnetic field sensing element 454 is proximate to a gear valley, the magnetic flux lines pass through the magnetic field sensing element 454 in a direction generally perpendicular to, but, depending upon the exact relative positions of the magnetic field sensing element 454, the magnet 458, and the gear 460, possibly at another angle relative to the surface 452*a* of the substrate 452. In operation, the angle of the magnetic field, and/or a magnitude of the magnetic field, can change as gear teeth and valleys pass by the magnetic field sensor 450 as the gear 460 rotates.

As described above in conjunction with FIG. 3, relative positions of the magnetic field sensing element 454, the magnet 452, and the gear 460 can influence the angle of the magnetic flux lines passing through the magnetic field sensing element 454 and/or the magnitude of the magnetic field passing through the magnetic field sensing element 454. Thus, as described above in first and second non-limiting examples described in conjunction with FIG. 3, depending upon relative positions, a valley in the gear 460 being proximate to the magnetic field sensing element 454 can result in a smaller magnetic field signal generated by the magnetic field sensing element 454, or a tooth of the gear 460 being proximate to the magnetic field sensing element 454 can result in a smaller magnetic field signal being generated by the magnetic field sensing elements 454. The magnetic field sensor 450 forms a tooth detector.

First and second non-limiting examples described above in conjunction with FIG. 3 also apply to the magnetic field sensor 450. The magnetic field sensor 450 forms a tooth detector.

For embodiments in which the major response axis of the magnetic field sensing element 454 is parallel to the first surface 452*a* of the substrate 452, e.g., a GMR magnetoresistance element, signal polarity may be reversed.

It should be apparent that the selection of the type of magnetic field sensing element, e.g., direction of axis of sensitivity, will influence the baseline level for a particular application or design.

The magnetic field sensor 450, and the simple magnet 458 having no core in particular, typically provides a higher (and less desirable) magnetic field baseline level (e.g., when the magnetic field sensor 450 is proximate to a valley (or tooth) in the gear 460) than the baseline levels described above in conjunction with FIGS. 1 and 2, for which a magnet with a core is used. However, the overall change in magnetic field direction and magnitude at the position of the magnetic field sensing element 454 is sufficient as gear teeth and valleys pass by the magnetic field sensor 450 to determine the state of the target as tooth or valley. Thus, the magnetic field sensor 450 still provides a good discrimination of gear teeth from gear valleys.

The electronic circuit 472 can be the same as or similar to the electronic circuit 50 of FIG. 1A.

Particularly for gear teeth that are wide in x and y directions, the magnetic field sensor 450 can rotate though a number of degrees, for example, through +/−one hundred eighty degrees (i.e., though three hundred sixty degrees), about the center axis 456 of the magnetic field sensing element 454 as represented by an arrow 464. The rotation results in minimal performance variation. The magnetic field sensor 450 can also rotate though a number of degrees, for example, through +/−twenty degrees, in a direction of an arrow 466, i.e., about a y-axis in an x-z plane of orthogonal axes 468, with a center of rotation at the magnetic field sensing element 454 with minimal performance variation.

Figure 3C:
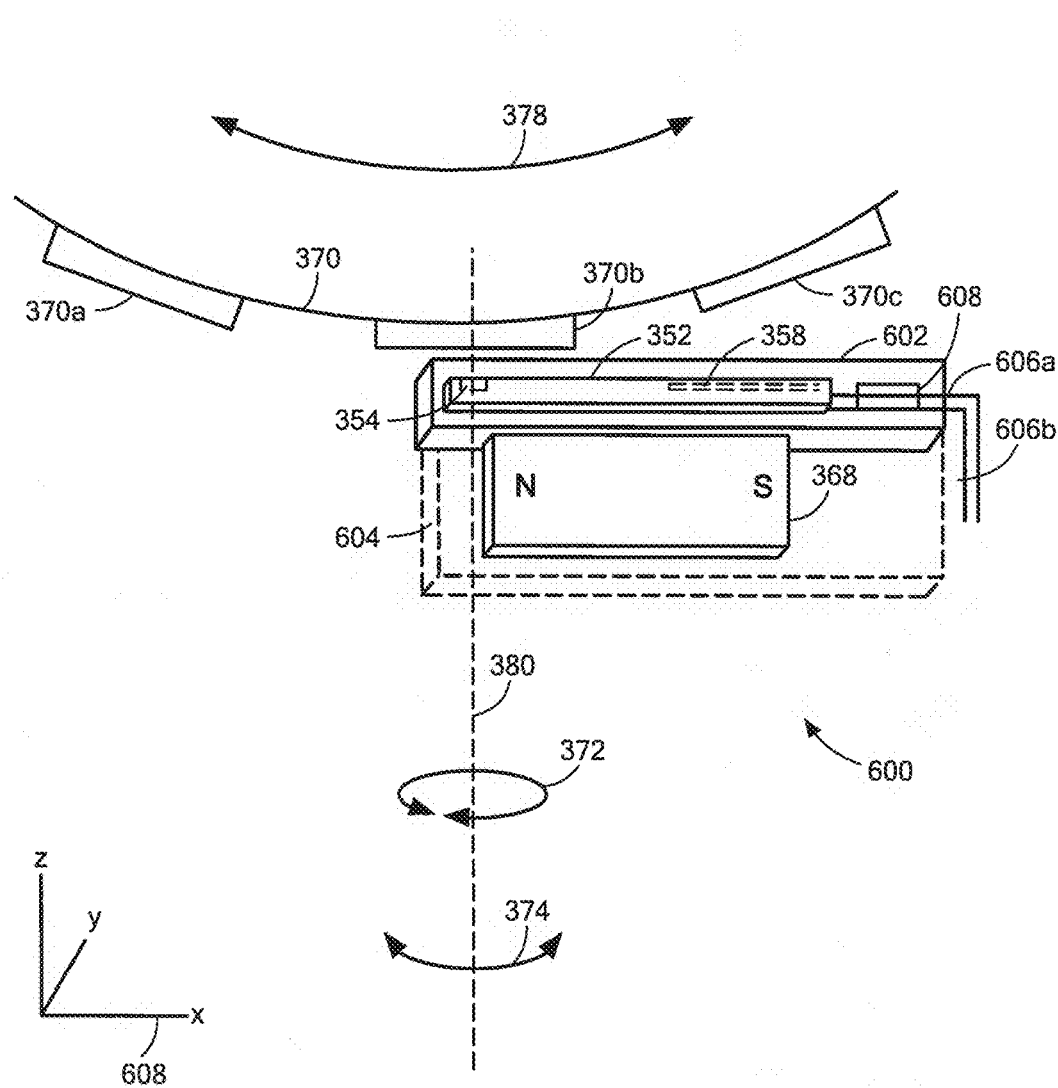
FIG. 3C is a block diagram of the magnetic field sensor of FIG. 3 having a magnetic field sensing element, an electronic circuit, and a magnet, all within an encapsulation, the magnetic field sensor located proximate to a gear.

Referring now to FIG. 3C, in which like elements of FIG. 3 are shown having like reference designations, a magnetic field sensor 600 can include the substrate 352 having the magnetic field sensing element 354 and the electronic circuit 358 disposed thereon. The substrate 352 can be coupled to a leadframe, here shown for clarity having only two leads 606*a*, 606*b*, and not showing a base plate under the substrate 352. It will be understood that the leadframe has other parts, for example, a base plate (not shown) or die attach areas (not shown) that would be used in a case where the substrate 352 spans multiple leads, each of which that may be positioned under the substrate 352. For a flip chip device, the die attach area may be comprised of lead fingers to connect the substrate 352 to the leadframe with solder bumps, for example.

The magnetic field sensor 600 can also include the magnet 368. In some embodiments the magnetic field sensor 600 includes an encapsulation 602 that surrounds the substrate 352 and part of the leadframe 606*a*, 606*b*. In these embodiments the magnet 368 can be coupled to or affixed to the encapsulation 602 is shown, with adhesive, epoxy, glue, tape, or the like.

In other embodiment the magnet 368 is attached to the leadframe with adhesive, tape, glue, or another method, prior to overmolding and is encapsulated with mold compound, mold material, potting compound, or other encapsulant at the same time as the substrate 352.

In other embodiments, in addition to or in place of the encapsulation 602, the magnetic field sensor 600 can include a second encapsulation 604 that surrounds at least the magnet 368. In some embodiments, the encapsulation 604 surrounds the magnet 368, the substrate 352, and also part of the leadframe 606*a*, 606*b*, for example, in a single molding step. In another embodiment the magnet 368 itself is molded with a hard ferromagnetic molding material (described above) and may be dimensioned to be inside of the first encapsulation 602 or outside the 602 boundary.

In some embodiments, one or more passive components 608 may also be placed in the encapsulation 602, in the encapsulation 604 that extends down the leads (e.g., 606*a*, 606*b*), or in a combination of the encapsulations 602, 604. Some such arrangements are described in U.S. patent application Ser. No. 13/748,999, filed Jan. 24, 2013, entitled "Magnetic Field Sensor Integrated Circuit With Integral Ferromagnetic Material," and in U.S. patent application Ser. No. 13/871,131, filed Apr. 26, 2012, and entitled "Integrated Circuit Package Having A Split Lead Frame And A Magnet," which are both assigned to the assignee of the present invention, and which are both incorporated by reference herein their entireties.

In some embodiments, an RC filter 608 can be coupled to the leads (e.g., 606*a*, 606*b*) and can be disposed within the encapsulation 602 with the substrate 352, or within the encapsulation 604. In another embodiments a capacitor couples at least two of the leads (e.g., 606*a*, 606*b*) and another at least one package lead is split (e.g., 606*a*) the split coupled with a resistor, wherein the resistor and capacitor are molded with in the first encapsulation 602 containing the substrate 352, or within the second encapsulation 604 at some point on the leads (e.g., 606*a*, 606*b*) away from the molded body 602 containing the substrate 352.

Passive components, such as the passive electrical components 608, can be used within any of the embodiments described herein.

Other types of magnets, included molded magnets, are described above in conjunction with FIG. 3. In some cases, the magnet 368 itself may be coated to improve reliability. In one particular example, the magnet 368 is comprised of a NdFeB type of magnet coated with a thin layer of Nickel to prevent or reduce corrosion.

The encapsulations 602, 604 can be provided from a variety of materials, including, but not limited to, plastic, or mold compound material.

While the leads 606*a*, 606*b* are shown to leave the substrate 352 in a particular direction, in other embodiments, the lead 606*a*, 606*b* can leave the substrate 352 in another direction.

The magnetic field sensors shown above in FIGS. 3A, and 3B can also have leadframes and encapsulations the same as or similar to the encapsulations 602, 604.

Figure 3D:
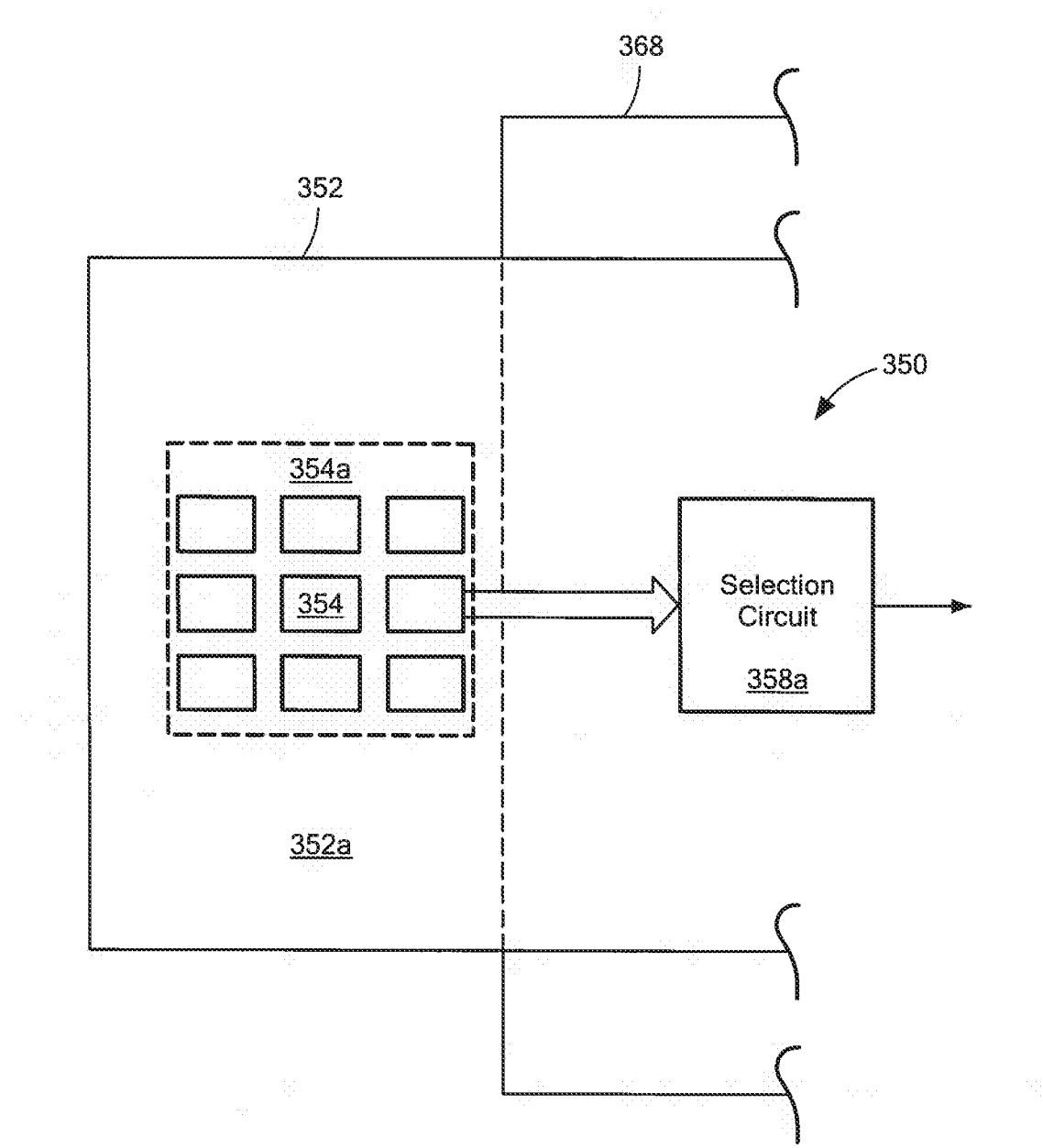
FIG. 3D is a block diagram showing a plurality of magnetic field sensing elements disposed upon a substrate, a selected one of which can be used in any of the magnetic field sensors herein.

Referring now to FIG. 3D, in which like elements of FIG. 3 are shown having like reference designations; a plurality of magnetic field sensing element 354*a*, and as shown nine magnetic field sensing elements, although other numbers are also possible, are disposed over or in the first surface 352*a* of the substrate 352 in the magnetic field sensor 350. The magnet 368 is disposed under the substrate 352.

As shown, the magnetic field sensing element 354 can be but one of the plurality of magnetic field sensing elements 354*a*, each of which is disposed over or in the surface 352*a* proximate to each other.

In some embodiments, each one of the plurality of magnetic field sensing elements 354*a* can have the same structure as the magnetic field sensing element 354. In other embodiments, the structure can be different.

While a center one of the plurality magnetic field sensing elements 354*a* is shown to represent the magnetic field sensing element 354 of FIG. 3, any one of the plurality of magnetic field sensing elements 354*a* can be selected to be the magnetic field sensing element 354. In some embodiments, after the selection is made, the remaining magnetic field sensing elements can thereafter be deactivated.

A selection circuit 358*a*, which can be a part of the electronic circuit 358 of FIG. 3, can be configured to receive signals from the plurality of magnetic field sensing elements 354*a* and to select one of the signals as an output signal used by other portions of the electronic circuit 358, therefore selecting one of the plurality of magnetic field sensing elements 354*a* to be the magnetic field sensing element 354. The selection circuit 358*a* can include switches or the like (not shown) to make the selection of the magnetic field sensing element 354 used by the magnetic field sensor 350. In some embodiments, the selection circuit 368*a* itself does not receive the signals from the plurality of magnetic field sensing elements 354*a*, but instead causes a selected output signal or selected set of output signals to be connected to sensing circuitry.

As described above, relative positions of the magnetic field sensing element 354, the magnet 358, and the gear 370 (FIG. 3) influence accuracy (and potentially output signal sign) of the magnetic field sensor 350. Accordingly, a signal experienced by the selected magnetic field sensing element 354 as the gear 370 rotates will be influenced by selection from among the plurality of magnetic field sensing elements 354*a*.

During manufacture of the magnetic field sensing sensor 350, there are certain manufacturing tolerances in the position of the substrate 352 relative to the magnet 368. These tolerances can lead to a less accurate magnetic field sensor 350 due to the increased error or expected range of signals from the magnetic field sensing elements. Selecting a magnetic field sensing element from the plurality of magnetic fields sensing elements 354*a* tends to improve the overall accuracy of the magnetic field sensor 350. In general, lower manufacturing tolerance results in a slower rate of manufacture of magnetic field sensors. It may be advantageous to manufacture magnetic field sensors rapidly, resulting in relatively large manufacturing tolerances. Thus, it may be advantageous (even regardless of manufacturing rate) to select which one of the plurality of magnetic field sensing elements 354*a* to use as the magnetic field sensing element 354 by which one provides best accuracy of the magnetic field sensor 350 during manufacture of the magnetic field sensor 350.

Furthermore, during installation of the magnetic field sensor 350 proximate to the gear 370 (or a target), there is installation position tolerance of the magnetic field sensor 350 relative to the gear 370. Thus, it may be advantageous to select which one of the plurality of magnetic field sensing elements 354*a* to use as the magnetic field sensing element 354 by which one provides best accuracy of the magnetic field sensor 350 during installation or after the installation of the magnetic field sensor 350.

Some techniques that use a plurality of magnetic field sensing elements are described in U.S. patent application Ser. No. 13/439,094, filed Apr. 4, 2012, and entitled "High Accuracy Differential Current Sensor For Applications Like Ground Fault Interrupters," which is assigned to the assignee of the present invention, and which is incorporated herein in its entirety.

While the plurality of magnetic field sensing elements 354*a* is shown in a rectangular grid arrangement, other arrangements are possible, for example, circular or near circular arrangements, irregularly spaced arrangements, or line arrangements having any number of magnetic field sensing elements, and including line arrangements that are not horizontal or vertical on the page as shown.

In a non-limiting example, a plurality of magnetic field sensing elements is arranged as a line arrangement on a diagonal (relative to the page) where positions of the individual magnetic field sensing elements overlap in one direction, but do not overlap in a second direction orthogonal to the first direction (thus, they do not touch each other). Such an embodiment allows the plurality of magnetic field sensing elements to be spaced closer in the one direction than the size of an individual magnetic field sensing element to allow for smaller spacing tolerances to be realized. A plurality or such diagonal arrangements may also be used.

The above plurality of magnetic field sensing elements and selection therefrom can be used in any of the embodiments described herein, and for any of the magnetic field sensing elements shown or described herein, including embodiments that use more than one active magnetic field sensing element.

Now turning to arrangements that functionally use more than one active magnetic field sensing element, conventional magnetic field sensors that use two magnetic field sensing elements are not described explicitly herein. However, it will be appreciated that conventional arrangements that use two magnetic field sensing elements position the magnetic field sensing elements across a gear. In other words, for conventional arrangements that use two magnetic field sensing elements, a line passing through the two magnetic field sensing elements does not intersect a gear or other target object that is being sensed. The conventional magnetic field sensors that use two (or more) magnetic field sensing elements are coupled in and operate in a differential arrangement. The subtraction of the two signals results in operation around a zero level and reduces the effects of changes in the baseline due to temperature, humidity, and other package stresses, for example. Advantages of differential arrangements will be understood. It will be appreciated that the conventional differential arrangements can operate only as edge detectors and not as tooth detectors.

In contrast, magnetic field sensors described below in conjunction with FIGS. 4-4DF position two magnetic field sensing elements such that a line passing through the two magnetic field sensing elements intersects s a gear or other target object. The magnetic field sensors described below can operate as tooth detectors, while maintaining the positive advantages like those of a differential arrangement, including, but not limited to, reduced variation over temperature, humidity, and package stress.

Figure 4:
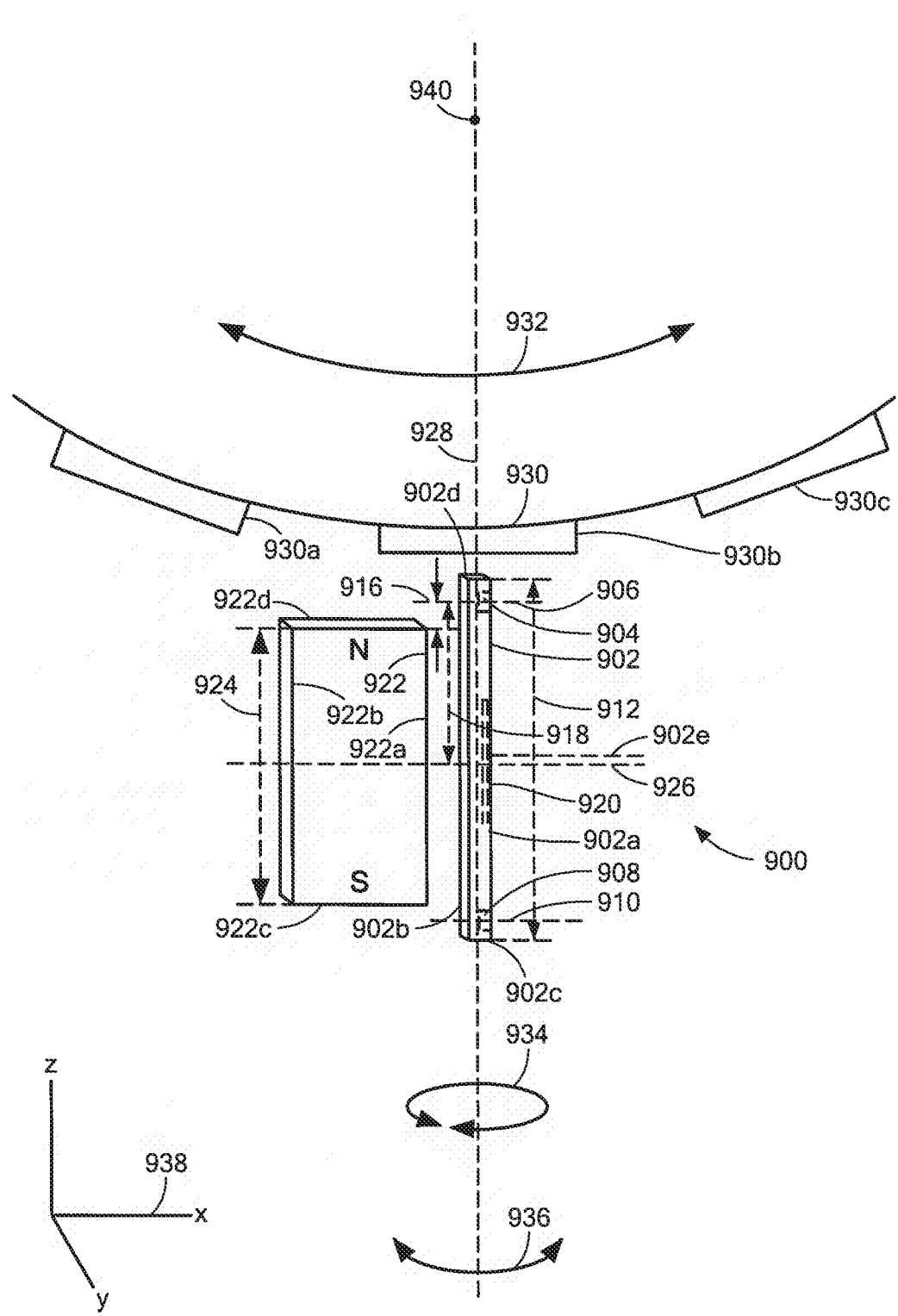
FIG. 4 is a block diagram of another magnetic field sensor having two magnetic field sensors, an electronic circuit, and a magnet, the magnetic field sensor located proximate to a gear.

Referring now to FIG. 4 a magnetic field sensor 900 includes a substrate 902. The substrate 902 has a first major surface 902a. A first dimension 912 across the first major surface 902a of the substrate 902 defines a width of the substrate 902 and a second dimension (not shown, into the page) across the first major surface 902a of the substrate 902 perpendicular to the first dimension 912 defines a length of the substrate 902. A second major surface 902b of the substrate 902 is parallel to the first major surface 902a. The substrate has first and second substrate edges 902c, 902d, respectively, at ends of the width of the substrate 902. The substrate 902 has a center axis 902e perpendicular to the first and second major surfaces 902a, 902b, respectively, of the substrate 902 and centered within the width and length of the substrate 902.

The magnetic field sensor 900 also includes a magnet 922, which has a first major surface 922a proximate to the substrate 902. A first dimension 924 across the first major surface 922a of the magnet 922 defines a width of the magnet and a second dimension (not shown, into the page) across the first major surface 922a of the magnet 922 perpendicular to the first dimension 924 defines a length of the magnet 922. The magnet 922 has a second major surface 922b distal from the substrate 902 and substantially parallel to the first major surface 922a of the magnet 922. The magnet 922 also has third and fourth opposing surfaces 922c, 922d, respectively, at ends of the width of the magnet 922. The magnet 922 has a center axis 926, a geometric axis, perpendicular to the first and second major surfaces 922a, 922b of the magnet 922 and centered within the width and length of the magnet 922.

The magnet 922 can have a north pole, N, at the fourth major surface 922d and a south pole, S, at the third major surface 922c. A line between the north pole and the south pole can intersect a gear 930.

The magnetic field sensor 900 also includes a first magnetic field sensing element 904 disposed upon or within the first major surface 902a or the second major surface 902b of the substrate 902. The first magnetic field sensing element 904 is configured to generate a first magnetic field signal (an electronic signal).

The first magnetic field sensing element 904 includes center upon the first major surface 902a or the second major surface 902b of the substrate 902, and a center axis 906, a geometric axis, generally parallel to the center axis 926 of the magnet. The center axis 906 of the first magnetic field sensing element 904 is substantially closer to the fourth major surface 922d of the magnet 922 than to the center axis 926 of the magnet 922. In other words, a dimension 916 is substantially smaller than a dimension 918.

The magnetic field sensor 900 can also include a second magnetic field sensing element 908 disposed upon or within the first major surface 902a or the second major surface 902b of the substrate 902. The second magnetic field sensing element 908 is configured to generate a second magnetic field signal (an electronic signal).

The second magnetic field sensing element 908 includes a center upon the first major surface 902a or the second major surface 902b of the substrate 902, and a center axis 910, a geometric axis, generally parallel to the center axis 926 of the magnet. The center axis 910 of the second magnetic field sensing element 908 is substantially closer to the third major surface 922c of the magnet 922 than to the center axis 926 of the magnet 922.

In one particular embodiment as shown, the center axes 904, 910 of the first and second magnetic field sensing elements 904, 908 are at or beyond the width of the magnet 922, the width of the magnet 922 defined by the dimension line 924. In these embodiments, distances between the center axis 926 of the magnet 922 and the center axes 904, 910 of the first and second magnetic field sensing elements 904, 908 are greater than or equal to a distance from the center axis 926 of the magnet 922 to respective ones of the third or fourth surfaces 922c, 922d of the magnet 922.

However, in other embodiments, the center axes 904, 910 of the first and second magnetic field sensing elements 904, 908 are within the width of the magnet 922 but still such that the center axes 904, 910 of the first and second magnetic field sensing elements 904, 908 are substantially closer to respective surfaces 922c, 922d of the magnet 922 than to the center axis 926 of the magnet 922.

The magnetic field sensing elements 904, 908 are shown to be disposed within the substrate 920, which may be indicative of a Hall element. However, the magnetic field sensing elements 904, 908 can be any types of magnetic field sensing element. The selection of a type of magnetic field sensing element is the same as that described above in conjunction with FIG. 3.

The magnetic field sensor 900 can include an electronic circuit 920 disposed on or within the substrate 902. The electronic circuit 920 can be of a type described below in conjunction with FIG. 5 and can provide a summation of signals generated by the two magnetic field sensing elements 904, 908.

It is shown that the center axis 902e of the substrate 902 is slightly offset from the center axis 926 of the magnet 922. This offset is shown merely for clarity, and, in some embodiments, the center axis 902e of the substrate 902 is aligned with the center axis 926 of the magnet 922. However, embodiments for which the center axes 902e, 926 do not align are also possible.

In some embodiments, as shown, the center axis 926 of the magnet 922 and the center axis 902e of the substrate 902 do not intersect a gear 930. Also as shown, the axis 928 intersects the gear 930 and a center of rotation 940. However, in other embodiments, the axis 928 can intersect the gear 930 but does not intersect the axis of rotation 940.

It will be appreciated that the magnet 922, unlike the conventional magnet 308 of FIG. 2, in some embodiments, can be comprised of a hard ferromagnetic material. In some embodiments, the magnet 922 is rectangular, and in other embodiments, the magnet 922 is cylindrical. The magnet 922 can be the same as or similar to the magnet 368 described above in conjunction with FIG. 3.

In some embodiments, major axes of sensitivity of the first and second magnetic field sensing elements 904, 908 are parallel to the first surface 902a of the substrate 902 and parallel to the width dimension 912 of the substrate 902. In other embodiments, the major axes of sensitivity of the first and second magnetic field sensing elements 904, 908 are perpendicular to the first surface 902a of the substrate 902.

Types of magnetic field sensing elements are described above in conjunction with FIG. 3.

As described above, the magnet 922 has a north pole, N, at the fourth surface 922d and a south pole, S, at the third surface 922c, a line between which is parallel to the first major surface 902a of the substrate 902. With this particular arrangement, magnetic field (or flux) lines pass through the surfaces 922c, 922d of the magnet 922 in a direction generally perpendicular to the surfaces 922c, 922d. When the first magnetic field sensing element 904 is proximate to a valley in the gear 930, the magnetic flux lines pas through the magnetic field sensing elements 904, 908 in directions generally perpendicular to, but, depending on the exact relative positions of the first and second magnetic field sensing elements 904, 908, the magnet 922, and the gear 930, possibly at another angle relative to the surface 902a of the substrate 902. In operation, the angle of the magnetic field relative to the surface 902a of the substrate 902, as well as a magnitude of the magnetic field, change at the location of the first magnetic field sensing element 904 as gear teeth and valleys pass by the magnetic field sensor 900 as the gear 930 rotates. However, as the gear 930 rotates, the angle and magnitude of the magnetic field at the location of the second magnetic field sensing element 908 changes less, and may be relatively invariant in some cases, since the second magnetic field sensing element 908 is relatively far from the gear 930 and is therefore less influenced when compared to the first magnetic field sensing element 904.

For embodiments in which the major response axes of the magnetic field sensing elements 904, 908 are perpendicular to the first surface 902a of the substrate 902, e.g., for planar Hall elements, when the first magnetic field sensing element 904 is proximate to a valley in the gear 930, the magnetic field passing through the first and second magnetic field sensing elements 904, 908 is at a first angle, which is between parallel and perpendicular to the major axes of sensitivity of the first and second magnetic field sensing elements 904, 908, the magnetic field has first magnitudes, and an output signal from the first magnetic field sensing element 904 has a first amplitude (as described above, the output signal from the second magnetic field sensing element 908 is relatively invariant). However, when the first magnetic field sensing element 904 is proximate to a gear tooth, the magnetic field passing through the first magnetic field sensing element 904 is redirected by the gear tooth to be at a second different angle, which is also between parallel and perpendicular to the major response axes of the first and second magnetic field sensing elements 904, 908, and/or to have second different magnitudes, and an output signal from the first magnetic field sensing element 904 has a second different amplitude.

First and second non-limiting examples described above in conjunction with FIG. 3 also apply to the magnetic field sensor 900. The magnetic field sensor 900 forms a tooth detector.

For embodiments in which the major response axes of the magnetic field sensing elements 904, 908 are parallel to the first surface 902a of the substrate 902, e.g., for GMR magnetoresistance elements, signal polarities may be reversed from those described above.

It will be appreciated that, the direction of the magnetic field passing through the first magnetic field sensing element 904 is opposite from the direction of the magnetic field passing through the second magnetic field sensing element 908. Thus, magnetic field signals generated by the first and second magnetic field sensing elements 904, 908 can be added or summed to achieve a more stable and compensated (i.e., differential-like) arrangement by way of the an electronic circuit described below in conjunction with FIG. 5.

As described above, the second magnetic field signal generated by the second magnetic field sensing element 908 remains relatively unchanged in magnitude and phase as the gear 930 rotates. Thus, it will be appreciated that, with the differential arrangement provided by summing of the signals generated by the first and second magnetic field sensing elements 904, 908, the second magnetic field signal generated by the second magnetic field sensing element 908 operate as a reference signal. For example, as temperature changes, if both of the magnetic fields signals generated by the first and magnetic field sensing elements 904, 908 move upward or downward by the same amount due to temperature, a summation signal generated by summing the first and second magnetic field signals will be substantially unchanged.

Essentially, the second magnetic field sensing element 908 provides an automatic compensation (i.e., reduction) of a variety of undesirable effects, for example, changes due to temperature, common mode noise, and common mode pickup of other magnetic fields generated by other magnetic objects in proximity to the magnetic field sensor 900.

Particularly for gear teeth that are wide in the x and y directions 938, the magnetic field sensor 900 can rotate though a number of degrees, for example, through +/−one hundred eighty degrees (i.e., though three hundred sixty degrees), about an axis 928 as represented by an arrow 934. The rotation results in some performance variation, but within acceptable limits. The magnetic field sensor 900 can also rotate though a number of degrees, for example, through +/−twenty degrees, in a direction of an arrow 936, i.e., about a y-axis in an x-z plane of orthogonal axes 938 with minimal performance variation.

Figure 4A:
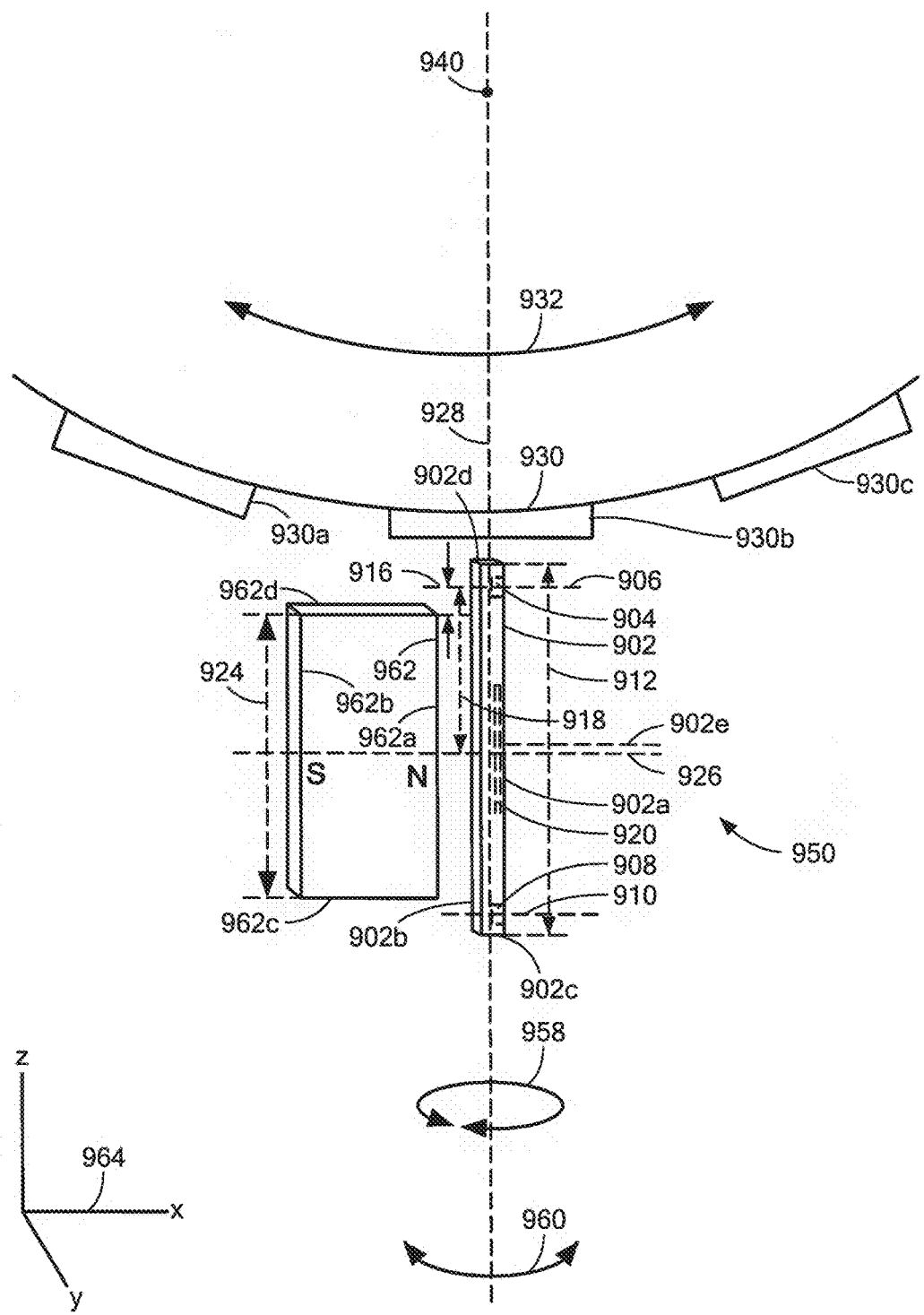
FIG. 4A is a block diagram of another magnetic field sensor having two magnetic field sensing elements, an electronic circuit, and a magnet, the magnetic field sensor located proximate to a gear.

Referring now to FIG. 4A, in which like elements of FIG. 4 are shown having like reference designations, a magnetic field sensor 950 is like the magnetic field sensor 900 of FIG. 4, except that a magnet 962 replaces the magnet 922 of FIG. 4.

The magnet 962 has a first major surface 962a proximate to the substrate 902. The first dimension 924 across the first major surface 962a of the magnet 962 defines a width of the magnet 962 and a second dimension across the first major surface 962a of the magnet 962 perpendicular to the first dimension defines a length of the magnet 962. The magnet 962 has a second major surface 962b distal from the substrate 902 and substantially parallel to the first major surface 962a of the magnet 962. The magnet 962 has third and fourth opposing surfaces 962d, 962c, respectively, at ends of the width 924 of the magnet 962. The magnet 962 has the center axis 926 perpendicular to the first and second major surfaces 962a, 962b of the magnet 962 and centered within the width and length of the magnet 962.

Unlike the magnet 922 of FIG. 4, the magnet 962 has a north pole, N, and a south pole, S, a line between which is perpendicular to a first major surface 952a of the substrate 952. Magnetic field lines and operation of the magnetic field sensor will be understood from the description above in conjunction with FIG. 4.

Figure 4B:
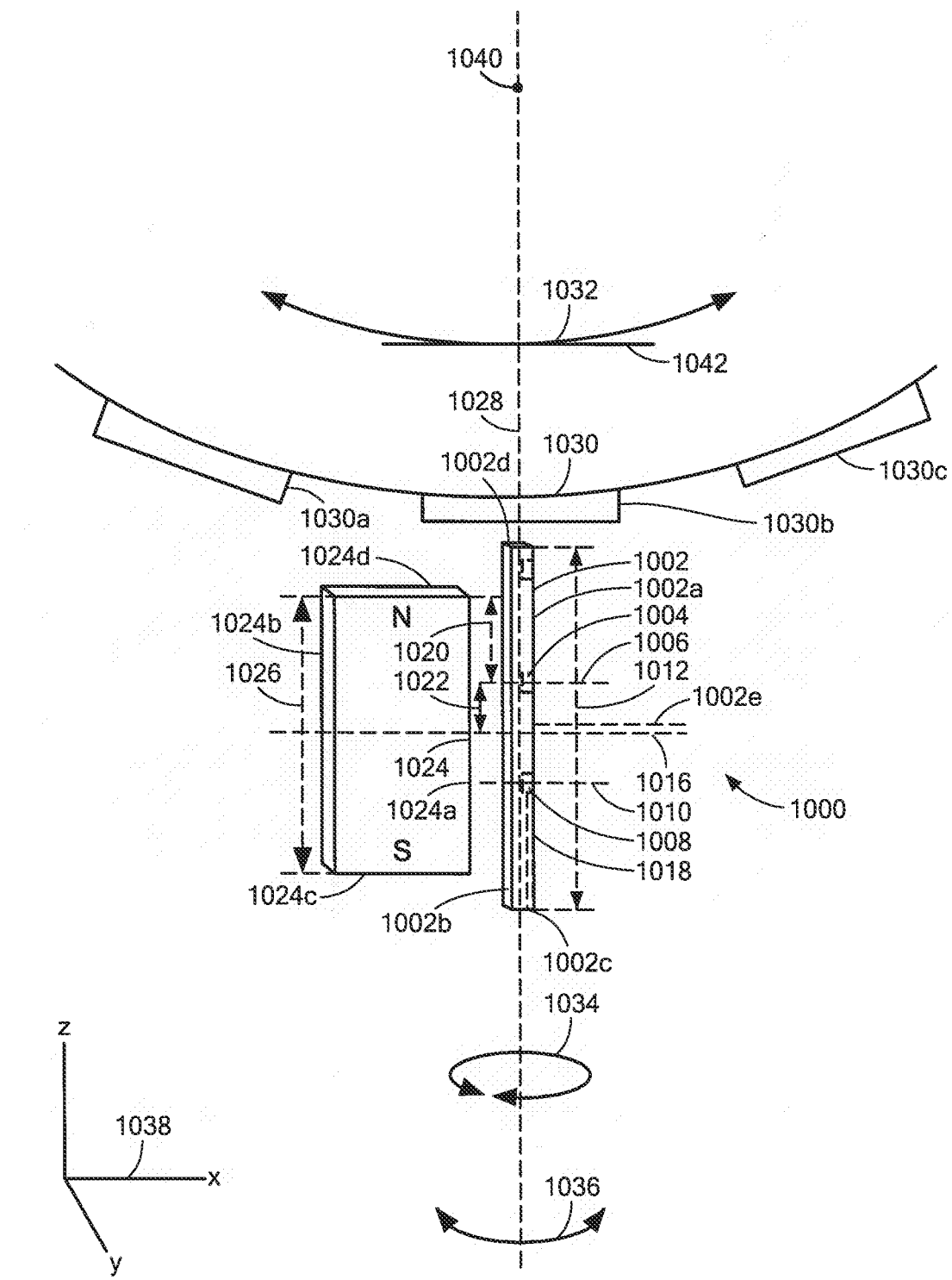
FIG. 4B is a block diagram of another magnetic field sensor having two magnetic field sensing elements, an electronic circuit, and a magnet, the magnetic field sensor located proximate to a gear.

Referring now to FIG. 4B, in which like elements of FIGS. 4 and 4A are shown having like reference designations, a magnetic field sensor 1000 includes a substrate 1002. The substrate 1002 has a major planar surface 1002a or 1002b. The magnetic field sensor 1000 also includes a magnet 1024 the same as or similar to the magnet 922 of FIG. 4.

The magnetic field sensor 100 can include a magnet 1024, which can be the same as or similar to the magnet 922 of FIG. 4. However, in other embodiments, the magnetic field sensor 1000 can include a magnet the same as or similar to the magnet 962 of FIG. 4A.

First and second magnetic field sensing elements 1004, 1008 can be disposed upon or within the first or second surfaces 1002a, 1002b, respectively, of the substrate 1002. The magnetic field sensing elements 1004, 1008 are like the magnetic field sensing elements 904, 908 of FIG. 4, but are disposed such that center axes 1006, 1010 of the magnetic field sensing element 1004, 1008 are closer to a center axis 1002e of the magnet 1024 than to the third or fourth surfaces 1024d, 1024c of the magnet 1024. In other words, a dimension 1022 is the same as or smaller than a dimension 1020.

The magnetic field sensor 1000 can include an electronic circuit 1018 disposed on the substrate 1002, which can be like the electronic circuit described below in conjunction with FIG. 5. The magnetic field sensor 1000 can provide a tooth detector.

It is shown that a center axis 1002e of the substrate 1002 is slightly offset from a center axis 1016 of the magnet 1024. This offset is shown merely for clarity, and, in some embodiments, the center axis 1002e of the substrate 1002 is aligned with the center axis 1016 of the magnet 1024. However, embodiments for which the center axes 1002e, 1016 do not align are also possible.

In some embodiments, as shown, neither the center axis 1016 of the magnet 1024 nor the center axis 1002e of the substrate 1002 intersect the ferromagnetic object, i.e., a gear 1030. However, a line passing through the first and second magnetic field sensing elements 1004, 1008 can intersect the gear 1024 and, in some embodiments, can intersect a center of rotation 1040 of the gear 1024. However, in other embodiments the line between the first and second magnetic field sensing element 1004 and 1008 intersects the gear 1030 but not the center of rotation 1040.

Operation of the magnetic field sensor 1000 will be understood from discussion above in conjunction with FIG. 4. The magnetic field sensor 1000 provides similar characteristics and advantages as the magnetic field sensor 900 of FIG. 4.

Figure 4C:
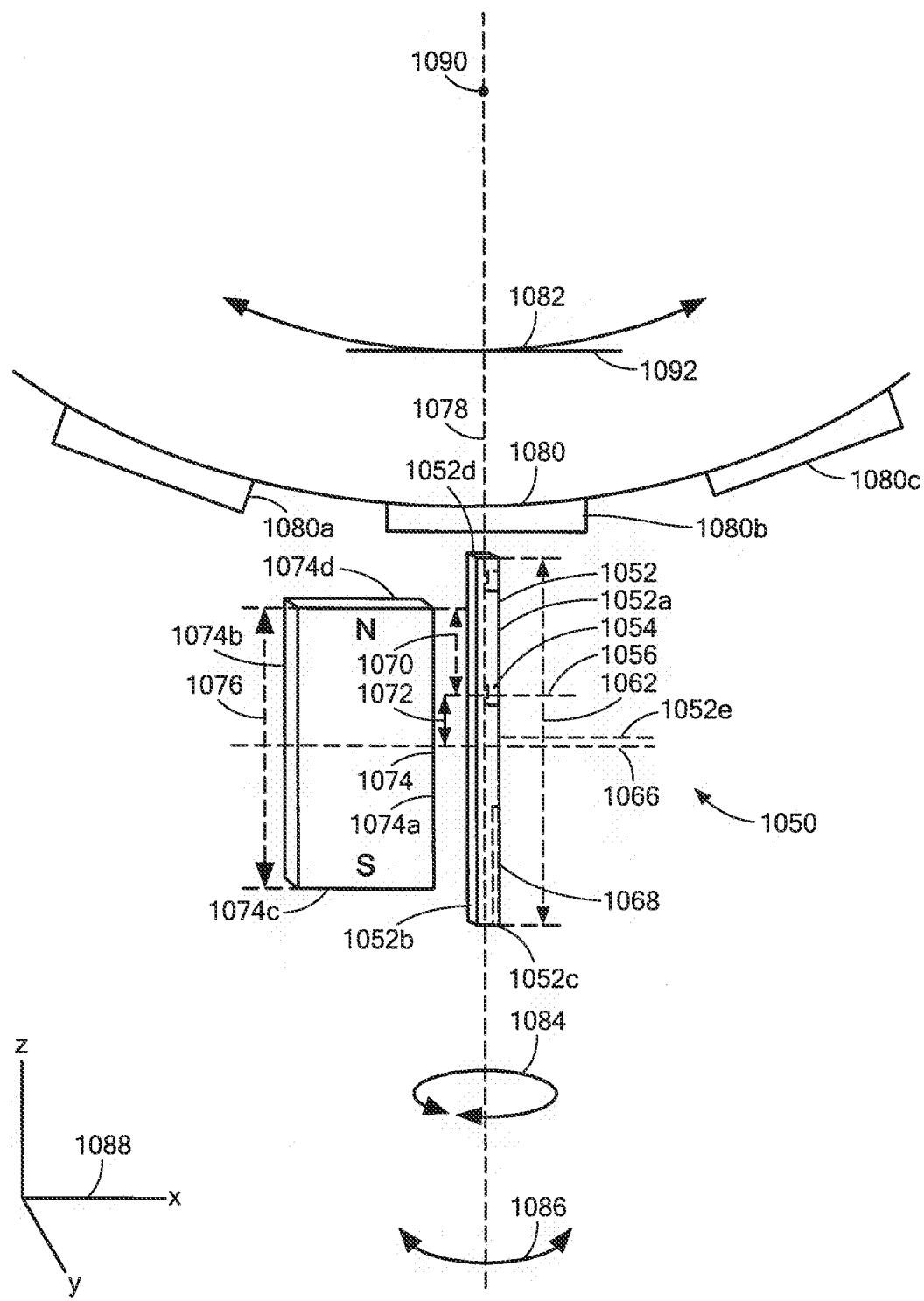
FIG. 4C is a block diagram of another magnetic field sensor having a magnetic field sensing element, an electronic circuit, and a magnet, the magnetic field sensor located proximate to a gear.

Referring now to FIG. 4C, a magnetic field sensor 1050 includes a substrate 1052. The substrate 1052 has a major planar surface 1052a or 1052b. The magnetic field sensor 1050 also includes a magnet 1074 disposed proximate to the substrate 1052. The magnetic field sensor 1050 also includes a magnetic field sensing element 1054 disposed upon or within the major planar surface 1052a or 1052b of the substrate 1052. The magnetic field sensing elements 1054 is configured to generate a magnetic field signal.

The magnetic field sensor 1050 can include a magnet 1074 the same as or similar to the magnet 922 of FIG. 4, and having a center axis 1066. However, in other embodiments, the magnetic field sensor 1050 can include a magnet the same as or similar to the magnet 962 of FIG. 4A.

The magnetic field sensor 1050 can include an electronic circuit 1068 disposed on the substrate 1052. The electronic circuit can be the same as or similar to the electronic circuit 50 of FIG. 1A. The magnetic field sensor 1050 can provide a tooth detector.

It is shown that a center axis 1052e of the substrate 1052 is slightly offset from a center axis 1066 of the magnet 1074. This offset is shown merely for clarity, and, in some embodiments, the center axis 1052e of the substrate 1052 is aligned with the center axis 1066 of the magnet 1074. However, embodiments for which the center axes 1052e, 1064 do not align are also possible.

In some embodiments, as shown, neither the center axis 1066 of the magnet 1074 nor the center axis 1052e of the substrate 1052 intersect the ferromagnetic object, i.e., a gear 1080. However, a line passing through the magnetic field sensing element 1054 and parallel to the first surface 1052a of the substrate 1052 can intersect the gear 1080 and, in some embodiments, can intersect a center of rotation 1090 of the gear 1080.

Operation of the magnetic field sensor 1050 will be understood from discussion above.

Figure 4D:
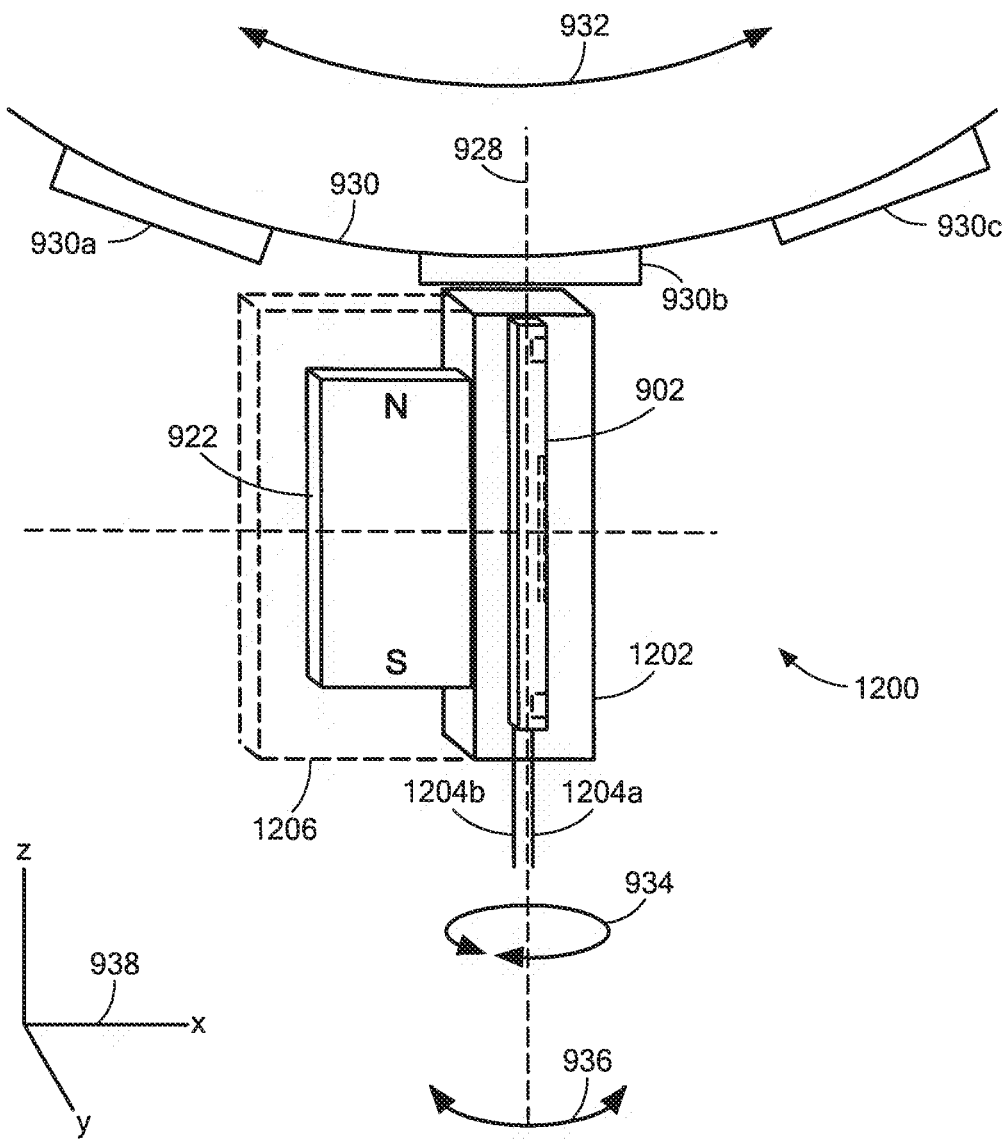
FIG. 4D is a block diagram of the magnetic field sensor of FIG. 4 having two magnetic field sensing elements, an electronic circuit, and a magnet, all within an encapsulation, the magnetic field sensor located proximate to a gear.

Referring now to FIG. 4D, in which like elements of FIG. 4 are shown having like reference designations, a magnetic field sensor 1200 can include the substrate 902 having the magnetic field sensing element 904 and the electronic circuit 920 disposed thereon. The substrate 902 can be coupled to a leadframe, here shown for clarity having only two leads 1204a, 1204b. It will be understood that the leadframe has other parts, for example, a base plate (not shown) or die attach areas (not shown), which would be used in a case where the die spans multiple lead. The base plate of the die attach areas may be positioned under the substrate 1202. For a flip chip device, the die attach areas may be lead fingers to connect the die to the leadframe with solder bumps, for example.

The magnetic field sensor 1200 also includes the magnet 922. In some embodiments, the magnetic field sensor 1200 includes an encapsulation 1202 that surrounds the substrate 902 and part of the leadframe 1204a, 1204b. In these embodiments the magnet 922 can be coupled to or affixed to the encapsulation 1202 as shown with glue, tape, or the like.

In other embodiments, in addition to or in place of the encapsulation 1202, the magnetic field sensor 1200 can include an encapsulation 1206 that surrounds at least the magnet 922. In some embodiments, the encapsulation 1206 surrounds the magnet 922, the substrate 902, and also part of the leadframe 1204a, 1204b, for example, in a single molding step. In another embodiment, the magnet 922 itself is molded with a hard ferromagnetic molding material (described above) and may be dimensioned to be inside of the first encapsulation 1202 or outside the 1202 boundary.

The encapsulations 1202, 1206 can be provided from a variety of materials, including, but not limited to, plastic or mold compound material.

While the leads 1204a, 1204b are shown to leave the substrate 902 in a particular direction, in other embodiments, the lead 1204a, 1204b can leave the substrate 902 in another direction.

Other characteristics of the packaged magnetic field sensor 1200 can be the same as or similar to characteristics to described above in conjunction with FIG. 3C.

Figure 5:
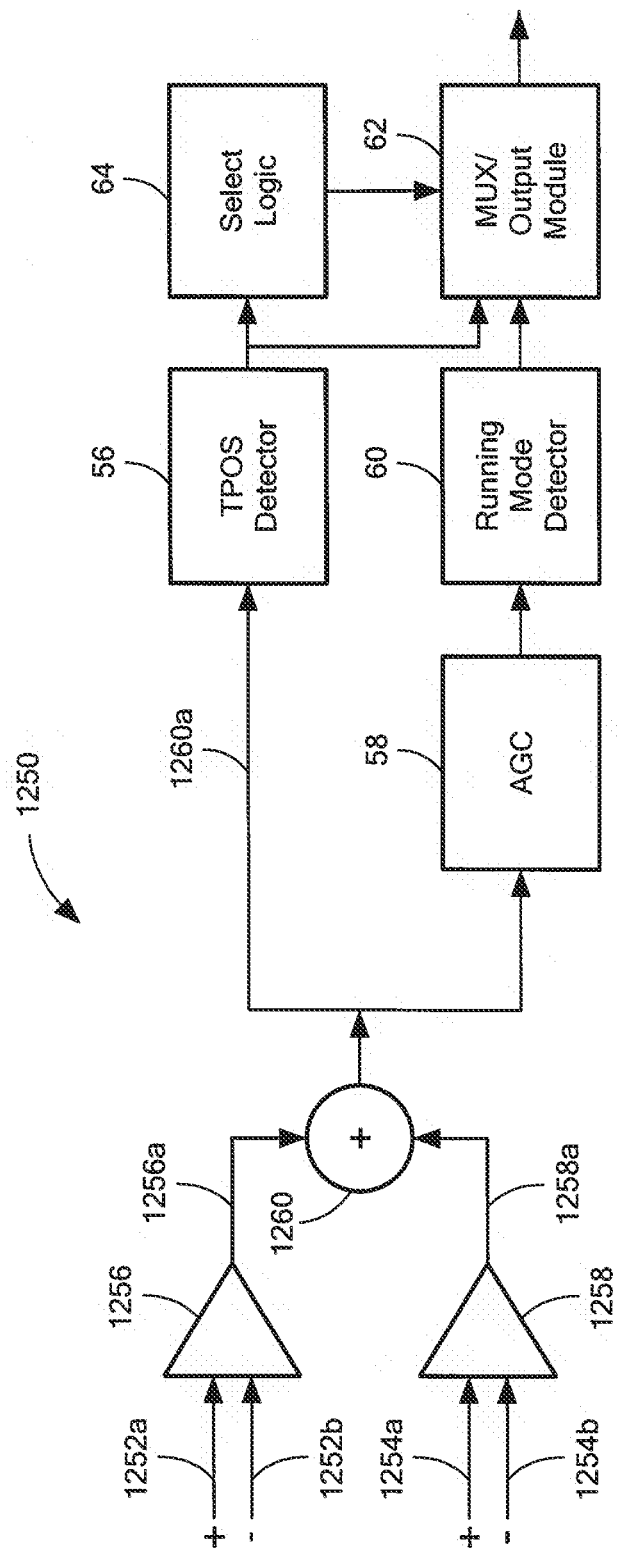
FIG. 5 is a block diagram of an exemplary electronic circuit that can be used as the electronic circuit in the magnetic field sensors of FIGS. 4, 4A, 4B, and 4D.

Referring now to FIG. 5, in which like elements of FIG. 1A are shown having like reference designations, an electronic circuit 1250, unlike the electronic circuit 50 of FIG. 1A, includes two input amplifiers 1256, 1258 coupled to receive two differential input signals 1252a, 1252b and 1254a, 1254b from two magnetic field sensing elements, for example, from the two magnetic field sensing elements 904, 908 of FIGS. 4 and 4A.

The electronic circuit 1250 includes a summing node 1260 coupled to receive output signals 1256a 1258a from the amplifiers 1256, 1258. For reasons described above in conjunction with FIG. 4, an output signal 1260a essentially provides a difference signal even though it is derived from a summation. As described above in conjunction with FIG. 4, the difference signal results because the magnetic field generated by the magnet 922 of FIG. 4 passes through the two magnetic field sensing elements 904, 908 in opposite directions, resulting in signals with opposite polarities.

Figure 6:
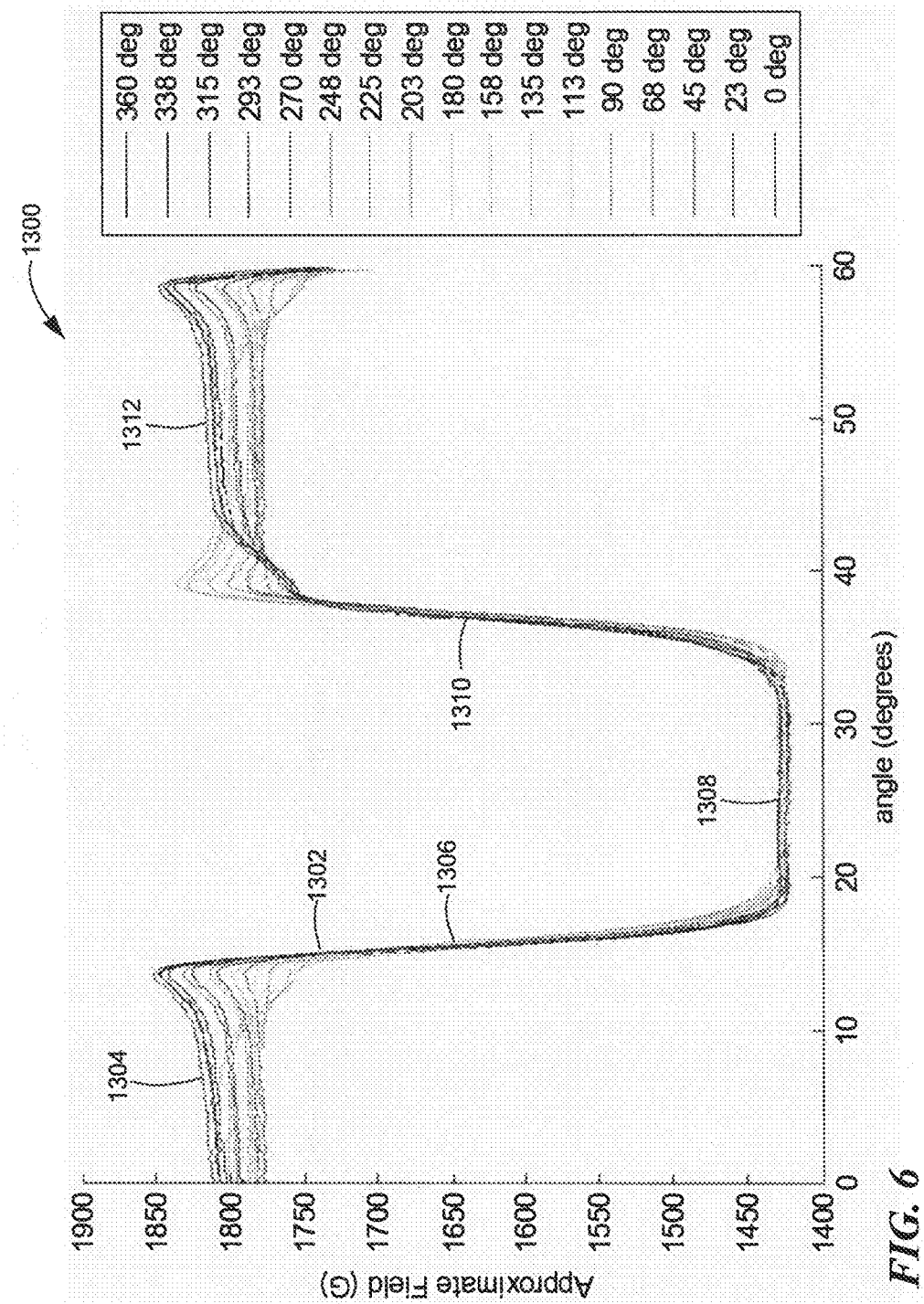
FIG. 6 is a graph showing exemplary magnetic fields proximate to a magnetic field sensing element.

Referring now to FIG. 6, a graph 1300 has a vertical axis with a scale in units of magnetic field or magnetic flux density in Gauss and horizontal axis with a scale in units of degrees of angular rotation of the gear or target, for example, the gear 370 of FIG. 3. A set of curves 1302 is representative of a magnetic field experienced by a magnetic field sensing element, for example, the magnetic field sensing element 354 of FIG. 3, as the gear 370 rotates. Thus, the magnetic field is lower in a region 1308 when the magnetic field sensor 354, which can be when the magnetic field sensing element 354 is proximate to a gear valley, and higher in regions 1304, 1312, which can be when the magnetic field sensing element 354 is proximate to gear teeth. The opposite can also be true depending upon the type of magnetic field sensing element used.

The set of curves 1302 are taken for the case where the magnetic field sensing element 354 is a planar Hall element having an axis of sensitivity perpendicular to the surfaces 352a, 352b of the substrate 352 and for an air gap between the magnetic field sensor 350 and the gear 312 of one millimeter.

The set of curves 1302 is representative of a set of rotation angles of the magnetic field sensor 350 of FIG. 3 about the axis 380 as represented by the arrow 372, i.e., as the magnetic field sensor 350 is twisted about the axis 380. Recall that the magnetic field sensor 350 can use a simple magnet 368 that does not have a core shown in conjunction with the magnet 308 of FIG. 2.

Various ones of the set of curves 1302 are not individually identified. However, taken together, the set of curves 1302 is representative of a rotation of the magnetic field sensor 350 about the axis 380 through three hundred sixty degrees. Thus, it will be appreciated that an output signal generated by the magnetic field sensor 350 is not affected very much by the rotation angle of the magnetic field sensor 350 about the axis 380. This behavior is advantageous because, in some applications of the magnetic field sensor 350 (and magnetic field sensors of FIGS. 3A-3C), the magnetic field sensor 350 is part of an assembly that screws into a hole with an axis aligned with the axis 380. Thus, it is desirable that the rotation angle of the magnetic field sensor 350 about the axis 380 does not need to be carefully controlled for all sensor applications.

In the region 1308 it can be seen that the baseline level is about 1425 Gauss, which is higher than the baseline level (about +/−six hundred Gauss) described above in conjunction with FIG. 2, for which a magnetic field sensor 300 has the magnet 308 with the core 310. As described above, the core 310 results in a particularly low baseline level for a given geometry and magnetic field sensing element placement. However, for the case of the simple magnet 368 of FIG. 3, the change in the level between the regions 1304, 1312 and 1308 are large enough for many applications. Thus, the magnetic field sensor 350 of FIG. 3, to which the set of curves 1302 applies, can still provide good differentiation between a tooth and a valley of the gear 370, and therefore, can provide an accurate output signal, but without using a high cost magnet with a core, and without having the low baseline level achieved by the more expensive magnet.

It can be shown that the good differentiation of the magnetic field sensor 350 is also provided over a range of air gaps between the magnetic field sensor 350 and the gear.

While the graph 1300 is described above in conjunction with the magnetic field sensor 350 of FIG. 3, similar graphs can be generated for other magnetic field sensors described above As described above in conjunction with FIGS. 1 and 2, some prior art arrangements use a complex and costly magnet having a core material in order to achieve a low baseline level.

All embodiments of magnetic field sensors described above can use a simple, lower-cost, magnet without a core. The low cost magnet can take a variety of forms described above in conjunction with FIG. 3, including magnets made of a uniform solid material, and magnets made of impregnated molded materials. However, it should also be appreciated that, in other embodiments, the magnetic field sensors described above could use a magnetic with a core.

All references cited herein are hereby incorporated herein by reference in their entirety.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims.

What is claimed is:

1. A magnetic field sensor for sensing motion of a ferromagnetic object, comprising:
  a substrate, comprising:
    a first major surface, wherein a first dimension across the first major surface of the substrate defines a width dimension of the substrate and a second dimension across the first major surface of the substrate perpendicular to the width dimension defines a length dimension of the substrate;
    first and second substrate edges at ends of the width dimension of the substrate; and
    a second major surface parallel to the first major surface, wherein the magnetic field sensor further comprises:
  a magnet, comprising:
    a first major surface proximate to the substrate and substantially parallel to the first major surface of the substrate, wherein a first dimension across the first major surface of the magnet defines a width dimension of the magnet and a second dimension across the first major surface of the magnet perpendicular to the width dimension defines a length dimension of the magnet;
    a second major surface distal from the substrate and parallel to the first major surface of the magnet; and
    a magnet axis perpendicular to the first and second major surfaces of the magnet and centered within the width dimension and length dimension of the magnet, wherein the magnetic field sensor further comprises:

a first magnetic field sensing element disposed upon the first major surface or the second major surface of the substrate and configured to generate a first magnetic field signal, wherein the first magnetic field sensing element comprises a center; and a second magnetic field sensing element disposed upon the first major surface or the second major surface of the substrate and configured to generate a second magnetic field signal, wherein the second magnetic field sensing element comprises a center, wherein the center of the first magnetic field sensing element and the center of the second magnetic field sensing element are the same distance from the first major surface of the magnet, wherein the first and second magnetic field sensing elements are disposed on opposite sides of the magnet axis, wherein the first magnetic field sensing element is disposed proximate to the ferromagnetic object and beyond the magnet such that a first line perpendicular to the substrate and intersecting the center of the first magnetic field sensing element does not intersect the magnet, wherein a line passing through the first and second magnetic field sensing elements intersects the ferromagnetic object, wherein the line passing through the first and second magnetic field sensing elements is parallel to the width dimension of the substrate and parallel to the width dimension of the magnet, wherein the second magnetic field sensing element is substantially farther from the ferromagnetic object than the first magnetic field sensing element, resulting in the first magnetic field sensing element being substantially more responsive to the motion of the ferromagnetic object than the second magnetic field sensing element, wherein the magnet is offset from the line passing through the first and second magnetic field sensing elements in a direction perpendicular to the line passing through the first and second magnetic field sensing elements, and wherein the line passing through the first and second magnetic field sensing elements is perpendicular to the magnet axis.

2. The magnetic field sensor of claim 1, wherein the magnet comprises magnetic particles molded within a mold compound.

3. The magnetic field sensor of claim 1, further comprising an electronic circuit disposed upon the substrate, coupled to receive the first and second magnetic field signals, and configured to sum the first and second magnetic field signals.

4. The magnetic field sensor of claim 1, further comprising:
a leadframe over which the substrate is disposed, the leadframe comprising a plurality of leads;
a molded body encapsulating the substrate and selected parts of the leadframe; and
one or more passive electronic components disposed within the molded body apart from the substrate and electrically coupled to at least two of the plurality of leads.

5. The magnetic field sensor of claim 1, wherein the substrate further comprises a substrate center axis perpendicular to the first and second major surface of the substrate and centered within the width dimension and length dimension of the substrate; wherein the magnet axis is substantially parallel to and proximate to the substrate center axis.

6. The magnetic field sensor of claim 1, wherein the first magnetic field sensing element is responsive to movement of the ferromagnetic object, and wherein the second magnetic field sensing element is substantially unresponsive to the movement of the ferromagnetic object.

7. The magnetic field sensor of claim 1, wherein a first distance between the center of the first magnetic field sensing element and a first end of the width dimension of the magnet is substantially smaller than a second distance between the first end of the width dimension of the magnet and the magnet axis.

8. The magnetic field sensor of claim 7, wherein a third distance between the center of the second magnetic field sensing element and a second end of the width dimension of the magnet is substantially smaller than a fourth distance between the second end of the width dimension of the magnet and the magnet axis.

9. The magnetic field sensor of claim 7, wherein a third distance between the center of the second magnetic field sensing element and a second end of the width dimension of the magnet is substantially larger than a fourth distance between the center of the second magnetic field sensing element and the magnet axis.

10. The magnetic field sensor of claim 1, further comprising at least one amplifier disposed upon the substrate electrically coupled to the first and second magnetic field sensing elements.

11. The magnetic field sensor of claim 1, wherein the second magnetic field sensing element is disposed distal from the ferromagnetic object and beyond the magnet such that a second line perpendicular to the substrate and intersecting the center of the second magnetic field sensing element does not intersect the magnet.

12. The magnetic field sensor of claim 1, wherein the second magnetic field sensing element is disposed distal from the ferromagnetic object and at a position such that a second line perpendicular to the substrate and intersecting the center of the second magnetic field sensing element intersects the magnet.

13. The magnetic field sensor of claim 1, wherein the magnetic field sensor further comprises: an electronic circuit disposed on or within the substrate and electrically coupled to the first and second magnetic field sensing elements.

14. The magnetic field sensor of claim 1, wherein the first magnetic field sensing element is selected from among a respective plurality of magnetic field sensing elements disposed upon the first major surface or the second major surface of the substrate, the selection of the first magnetic field sensing element based upon a desired accuracy characteristic of the magnetic field sensor, and other ones of the plurality of magnetic field sensing elements are inactive, and wherein the second magnetic field sensing element is not selected from any group of magnetic field sensing elements, wherein the first magnetic field sensing element and the second magnetic field sensing element are not coupled together in a bridge arrangement.

15. The magnetic field sensor of claim 1, wherein the first magnetic field sensing element is selected from among a respective plurality of magnetic field sensing elements disposed upon the first major surface or the second major surface of the substrate, the selection of the first magnetic field sensing element based upon a desired accuracy characteristic of the magnetic field sensor, and other ones of the plurality of magnetic field sensing elements are inactive, and wherein the second magnetic field sensing element is not selected from any group of magnetic field sensing elements.

16. The magnetic field sensor of claim 1, wherein the first magnetic field sensing element and the second magnetic field sensing element are not coupled together in a bridge arrangement.

17. The magnetic field sensor of claim 1, wherein the first and second magnetic field sensing elements are planar Hall effect elements.

18. A magnetic field sensor for sensing motion of a ferromagnetic object, comprising:
- a substrate, comprising:
  - a first major surface, wherein a first dimension across the first major surface of the substrate defines a width dimension of the substrate and a second dimension across the first major surface of the substrate perpendicular to the width dimension defines a length dimension of the substrate;
  - first and second substrate edges at ends of the width dimension of the substrate; and
  - a second major surface parallel to the first major surface, wherein the magnetic field sensor further comprises:
- a magnet, comprising:
  - a first major surface proximate to the substrate and substantially parallel to the first major surface of the substrate, wherein a first dimension across the first major surface of the magnet defines a width dimension of the magnet and a second dimension across the first major surface of the magnet perpendicular to the width dimension defines a length dimension of the magnet;
  - a second major surface distal from the substrate and parallel to the first major surface of the magnet; and
  - a magnet axis perpendicular to the first and second major surfaces of the magnet and centered within the width dimension and length dimension of the magnet, wherein the magnetic field sensor further comprises:
- a first magnetic field sensing element disposed upon the first major surface or the second major surface of the substrate and configured to generate a first magnetic field signal, wherein the first magnetic field sensing element comprises a center; and
- a second magnetic field sensing element disposed upon the first major surface or the second major surface of the substrate and configured to generate a second magnetic field signal, wherein the second magnetic field sensing element comprises a center, wherein the center of the first magnetic field sensing element and the center of the second magnetic field sensing element are the same distance from the first major surface of the magnet, wherein the first and second magnetic field sensing elements are disposed on opposite sides of the magnet axis, wherein the first magnetic field sensing element is disposed proximate to the ferromagnetic object and beyond the magnet such that a first line perpendicular to the substrate and intersecting the center of the first magnetic field sensing element does not intersect the magnet, wherein a line passing through the first and second magnetic field sensing elements intersects the ferromagnetic object, wherein the line passing through the first and second magnetic field sensing elements is parallel to the width dimension of the substrate and parallel to the width dimension of the magnet, wherein the second magnetic field sensing element is substantially farther from the ferromagnetic object than the first magnetic field sensing element, resulting in the first magnetic field sensing element being substantially more responsive to the motion of the ferromagnetic object than the second magnetic field sensing element, wherein the magnet is offset from the line passing through the first and second magnetic field sensing elements in a direction perpendicular to the line passing through the first and second magnetic field sensing elements, wherein the line passing through the first and second magnetic field sensing elements is perpendicular to the magnet axis, and wherein the magnetic field sensor is operable to generate an output signal having a value that can distinguish between a tooth and a valley of the ferromagnetic object when the ferromagnetic object is moving and when the ferromagnetic object is not moving.

19. The magnetic field sensor of claim 18, wherein the magnet comprises magnetic particles molded within a mold compound.

20. The magnetic field sensor of claim 18, further comprising an electronic circuit disposed upon the substrate, coupled to receive the first and second magnetic field signals, and configured to sum the first and second magnetic field signals.

21. The magnetic field sensor of claim 18, further comprising:
- a leadframe over which the substrate is disposed, the leadframe comprising a plurality of leads;
- a molded body encapsulating the substrate and selected parts of the leadframe; and
- one or more passive electronic components disposed within the molded body apart from the substrate and electrically coupled to at least two of the plurality of leads.

22. The magnetic field sensor of claim 18, wherein the first magnetic field sensing element is selected from among a first plurality of magnetic field sensing elements disposed upon the first surface of the substrate, the selection of the first magnetic field sensing element based upon a desired behavior of the magnetic field sensor and other ones of the first plurality of magnetic field sensing elements are inactive, and the second magnetic field sensing element is selected from among a second plurality of magnetic field sensing elements disposed upon the first major surface or the second major surface of the substrate, the selection of the second magnetic field sensing element based upon the desired behavior of the magnetic field sensor and other ones of the second plurality of magnetic field sensing elements are inactive.

23. The magnetic field sensor of claim 18, wherein the substrate further comprises a substrate center axis perpendicular to the first and second major surface of the substrate and centered within the width dimension and length dimension of the substrate; wherein the magnet axis is substantially parallel to and proximate to the substrate center axis.

24. The magnetic field sensor of claim 18, wherein the first magnetic field sensing element is responsive to movement of the ferromagnetic object, and wherein the second magnetic field sensing element is substantially unresponsive to the movement of the ferromagnetic object.

25. The magnetic field sensor of claim 18, wherein a first distance between the center of the first magnetic field sensing element and a first end of the width dimension of the magnet is substantially smaller than a second distance between the first end of the width dimension of the magnet and the magnet axis.

26. The magnetic field sensor of claim 25, wherein a third distance between the center of the second magnetic field sensing element and a second end of the width dimension of the magnet is substantially smaller than a fourth distance between the second end of the width dimension of the magnet and the magnet axis.

27. The magnetic field sensor of claim 8, wherein a third distance between the center of the second magnetic field sensing element and a second end of the width dimension of the magnet is substantially larger than a fourth distance between the center of the second magnetic field sensing element and the magnet axis.

28. The magnetic field sensor of claim 18, wherein the first magnetic field sensing element is selected from among a plurality of magnetic field sensing elements disposed upon the first major surface or the second major surface of the substrate, the selection of the first magnetic field sensing element based upon a desired accuracy characteristic of the magnetic field sensor, and other ones of the plurality of magnetic field sensing elements are inactive.

29. The magnetic field sensor of claim 18, further comprising at least one amplifier disposed upon the substrate between and electrically coupled to the first and second magnetic field sensing elements.

30. The magnetic field sensor of claim 18, wherein the second magnetic field sensing element is disposed distal from the ferromagnetic object and beyond the magnet such that a second line perpendicular to the substrate and intersecting the center of the second magnetic field sensing element does not intersect the magnet.

31. The magnetic field sensor of claim 18, wherein the second magnetic field sensing element is disposed distal from the ferromagnetic object and at a position such that a second line perpendicular to the substrate and intersecting the center of the second magnetic field sensing element intersects the magnet.

32. The magnetic field sensor of claim 18, wherein the magnetic field sensor further comprises: an electronic circuit disposed on or within the substrate and electrically coupled to the first and second magnetic field sensing elements.

33. The magnetic field sensor of claim 18, wherein the first magnetic field sensing element and the second magnetic field sensing element are not coupled together in a bridge arrangement.

34. The magnetic field sensor of claim 18, wherein the first and second magnetic field sensing elements are planar Hall effect elements.

* * * * *

UNITED STATES PATENT AND TRADEMARK OFFICE
CERTIFICATE OF CORRECTION

PATENT NO. : 10,254,103 B2
APPLICATION NO. : 15/655135
DATED : April 9, 2019
INVENTOR(S) : William P. Taylor et al.

It is certified that error appears in the above-identified patent and that said Letters Patent is hereby corrected as shown below:

In the Specification

Column 3, Line 46, delete "effects result it" and replace with --effects result in--.

Column 5, Line 26, delete "two magnetic field sensor" and replace with --two magnetic field sensors--.

Column 10, Line 9, delete "field sensor 102" and replace with --field sensor 10--.

Column 10, Line 12, delete "field sensor 350" and replace with --field sensor 10--.

Column 11, Line 26, delete "rotate though" and replace with --rotate through--.

Column 11, Line 30, delete "loss or accuracy" and replace with --loss of accuracy--.

Column 11, Line 33, delete "rotate though" and replace with --rotate through--.

Column 11, Line 54, delete ""edge"" and replace with --"edge"--.

Column 12, Line 46, delete "magnet 380" and replace with --magnet 308--.

Column 13, Line 64, delete "oral" and replace with --oval--.

Column 14, Line 10, delete "sensing 354 element" and replace with --sensing element 354--.

Column 15, Line 43, delete "magnetic sensing" and replace with --magnetic field sensing--.

Column 16, Line 15, delete "rotate though" and replace with --rotate through--.

Column 16, Line 21, delete "rotate though" and replace with --rotate through--.

Signed and Sealed this
Eighteenth Day of February, 2020

Andrei Iancu
*Director of the United States Patent and Trademark Office*

CERTIFICATE OF CORRECTION (continued)
U.S. Pat. No. 10,254,103 B2

Column 17, Line 9, delete "sensing elements 354" and replace with --sensing element 354--.

Column 19, Line 35, delete "sensing elements 454" and replace with --sensing element 454--.

Column 19, Line 65, delete "though" and replace with --through--.

Column 19, Line 67, delete "though" and replace with --through--.

Column 20, Line 4, delete "though" and replace with --through--.

Column 20, Line 29, delete "602 is shown" and replace with --602 as shown--.

Column 21, Line 6, delete "included molded" and replace with --including molded--.

Column 21, Line 55, delete "368$a$" and replace with --358$a$--.

Column 21, Line 61, delete "358" and replace with --368--.

Column 22, Line 8, delete "fields" and replace with --field--.

Column 23, Line 16, delete "s a gear" and replace with --a gear--.

Column 23, Lines 63-64, delete "includes center" and replace with --includes a center--.

Column 24, Line 38, delete "substrate 920," and replace with --substrate 902,--.

Column 25, Line 20, delete "pas through" and replace with --pass through--.

Column 26, Line 10, delete "of the an" and replace with --of the--.

Column 26, Line 21, delete "operate" and replace with --operates--.

Column 26, Line 23, delete "first and magnetic" and replace with --first and second magnetic--.

Column 26, Line 37, delete "though" and replace with --through--.

Column 26, Line 38, delete "though" and replace with --through--.

Column 26, Line 42, delete "though" and replace with --through--.

Column 26, Line 67, delete "952$a$" and replace with --902$a$--.

Column 27, Line 1, delete "952" and replace with --902--.

Column 27, Line 11, delete "100" and replace with --1000--.

CERTIFICATE OF CORRECTION (continued)
U.S. Pat. No. 10,254,103 B2

Column 27, Line 44, delete "1024" and replace with --1030--.

Column 27, Line 45, delete "1024" and replace with --1030--.

Column 27, Line 61, delete "elements" and replace with --element--.

Column 28, Line 32, delete "lead" and replace with --leads--.

Column 28, Lines 61-62, delete "characteristics to described" and replace with --characteristics described--.

Column 30, Line 12, delete "above" and replace with --above.--.